United States Patent
Yamazaki et al.

(10) Patent No.: US 8,581,260 B2
(45) Date of Patent: Nov. 12, 2013

(54) SEMICONDUCTOR DEVICE INCLUDING A MEMORY

(75) Inventors: Shunpei Yamazaki, Tokyo (JP); Ikuko Kawamata, Kanagawa (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1292 days.

(21) Appl. No.: 12/027,815

(22) Filed: Feb. 7, 2008

(65) Prior Publication Data

US 2008/0203477 A1 Aug. 28, 2008

(30) Foreign Application Priority Data

Feb. 22, 2007 (JP) ................................. 2007-041685

(51) Int. Cl.
*H01L 29/04* (2006.01)
(52) U.S. Cl.
USPC .......... 257/72; 257/59; 257/E29.191; 438/149
(58) Field of Classification Search
USPC .................. 257/59, 66, 72, E27.11, E29.151, 257/E29.024; 438/149, 153
See application file for complete search history.

(56) References Cited

U.S. PATENT DOCUMENTS

| | | | |
|---|---|---|---|
| 5,521,546 A * | 5/1996 | Kim ............................... | 327/536 |
| 5,650,339 A | 7/1997 | Saito et al. | |
| 5,652,453 A | 7/1997 | Iwamatsu et al. | |
| 5,773,330 A | 6/1998 | Park | |
| 5,953,246 A * | 9/1999 | Takashima et al. ........... | 365/149 |
| 6,030,873 A | 2/2000 | Iwamatsu et al. | |
| 6,087,698 A | 7/2000 | Saito et al. | |
| 6,104,065 A | 8/2000 | Park | |
| 6,222,234 B1 * | 4/2001 | Imai ............................... | 257/347 |
| 6,242,777 B1 * | 6/2001 | Mano et al. ................... | 257/347 |
| 6,251,733 B1 * | 6/2001 | Yamazaki ..................... | 438/289 |
| 6,278,131 B1 | 8/2001 | Yamazaki et al. | |
| 6,278,316 B1 * | 8/2001 | Tanzawa et al. .............. | 327/536 |
| 6,314,021 B1 | 11/2001 | Maeda et al. | |
| 6,316,787 B1 | 11/2001 | Ohtani | |
| 6,356,499 B1 * | 3/2002 | Banba et al. .................. | 365/226 |
| 6,388,291 B1 | 5/2002 | Zhang et al. | |

(Continued)

FOREIGN PATENT DOCUMENTS

| | | |
|---|---|---|
| CN | 1450631 | 10/2003 |
| EP | 0 532 314 | 3/1993 |

(Continued)

OTHER PUBLICATIONS

Chinese Office Action (Application No. 200810080855.4; CN10382) Dated Aug. 4, 2010.

*Primary Examiner* — Robert Huber
(74) *Attorney, Agent, or Firm* — Nixon Peabody LLP; Jeffrey L. Costellia

(57) ABSTRACT

Plural kinds of thin film transistors having different film thicknesses of semiconductor layers are provided over a substrate having an insulating surface. A channel formation region of semiconductor layer in a thin film transistor for which high speed operation is required is made thinner than a channel formation region of a semiconductor layer of a thin film transistor for which high withstand voltage is required. A gate insulating layer of the thin film transistor for which high speed operation is required may be thinner than a gate insulating layer of the thin film transistor for which high withstand voltage is required.

10 Claims, 27 Drawing Sheets

(56) References Cited

U.S. PATENT DOCUMENTS

| | | |
|---|---|---|
| 6,433,361 B1 | 8/2002 | Zhang et al. |
| 6,472,684 B1 | 10/2002 | Yamazaki et al. |
| 6,541,795 B2 * | 4/2003 | Kusumoto et al. ............... 257/66 |
| 6,555,843 B1 | 4/2003 | Yamazaki et al. |
| 6,576,924 B1 | 6/2003 | Yamazaki et al. |
| 6,583,471 B1 * | 6/2003 | Yamazaki et al. ............. 257/350 |
| 6,593,592 B1 | 7/2003 | Yamazaki et al. |
| 6,608,345 B2 | 8/2003 | Kunikiyo et al. |
| 6,709,901 B1 | 3/2004 | Yamazaki et al. |
| 6,876,039 B2 | 4/2005 | Okihara |
| 6,927,418 B2 * | 8/2005 | Hotta ............................... 257/57 |
| 6,975,018 B2 | 12/2005 | Ohmi et al. |
| 7,045,398 B2 * | 5/2006 | Yasukawa ..................... 438/149 |
| 7,368,338 B2 * | 5/2008 | Yamazaki et al. ............. 438/157 |
| 7,385,223 B2 * | 6/2008 | Koo et al. ........................ 257/72 |
| 7,439,121 B2 | 10/2008 | Ohmi et al. |
| 7,652,321 B2 | 1/2010 | Yamaguchi et al. |
| 7,700,495 B2 * | 4/2010 | Doi et al. ....................... 438/733 |
| 7,718,484 B2 | 5/2010 | Ohmi et al. |
| 7,750,345 B2 * | 7/2010 | Tanada ........................... 438/149 |
| 2002/0113268 A1 | 8/2002 | Koyama et al. |
| 2003/0183877 A1 * | 10/2003 | Yagishita et al. .............. 257/347 |
| 2005/0082617 A1 * | 4/2005 | Yoshida ......................... 257/351 |
| 2005/0116305 A1 | 6/2005 | Hwang et al. |
| 2005/0179039 A1 * | 8/2005 | Nonaka ........................... 257/72 |
| 2005/0194645 A1 | 9/2005 | Yamaguchi et al. |
| 2005/0206441 A1 * | 9/2005 | Kimura ........................... 327/536 |
| 2005/0224796 A1 * | 10/2005 | Zhang et al. ..................... 257/59 |
| 2005/0272266 A1 | 12/2005 | Ohmi et al. |
| 2006/0086982 A1 * | 4/2006 | Yamazaki et al. ............. 257/350 |
| 2006/0246632 A1 * | 11/2006 | Okumura ....................... 438/149 |
| 2007/0058427 A1 * | 3/2007 | Okhonin et al. ............... 365/177 |
| 2008/0144349 A1 | 6/2008 | Kato et al. |

FOREIGN PATENT DOCUMENTS

| | | |
|---|---|---|
| EP | 1 347 506 A1 | 9/2003 |
| EP | 1 347 507 A1 | 9/2003 |
| EP | 1 349 216 A2 | 10/2003 |
| EP | 1 536 482 | 6/2005 |
| JP | 59-150469 | 8/1984 |
| JP | 61-048975 | 3/1986 |
| JP | 05-075114 | 3/1993 |
| JP | 07-176753 | 7/1995 |
| JP | 09-027624 | 1/1997 |
| JP | 11-258636 | 9/1999 |
| JP | 11-261037 | 9/1999 |
| JP | 2000-332245 | 11/2000 |
| JP | 2001-267576 | 9/2001 |
| JP | 2001-351995 | 12/2001 |
| JP | 2002-261097 | 9/2002 |
| JP | 2003-289079 | 10/2003 |
| JP | 2005-167068 | 6/2005 |
| JP | 2005-294814 | 10/2005 |
| JP | 2006-236556 | 9/2006 |
| WO | WO-2006/080478 A1 | 8/2006 |

\* cited by examiner

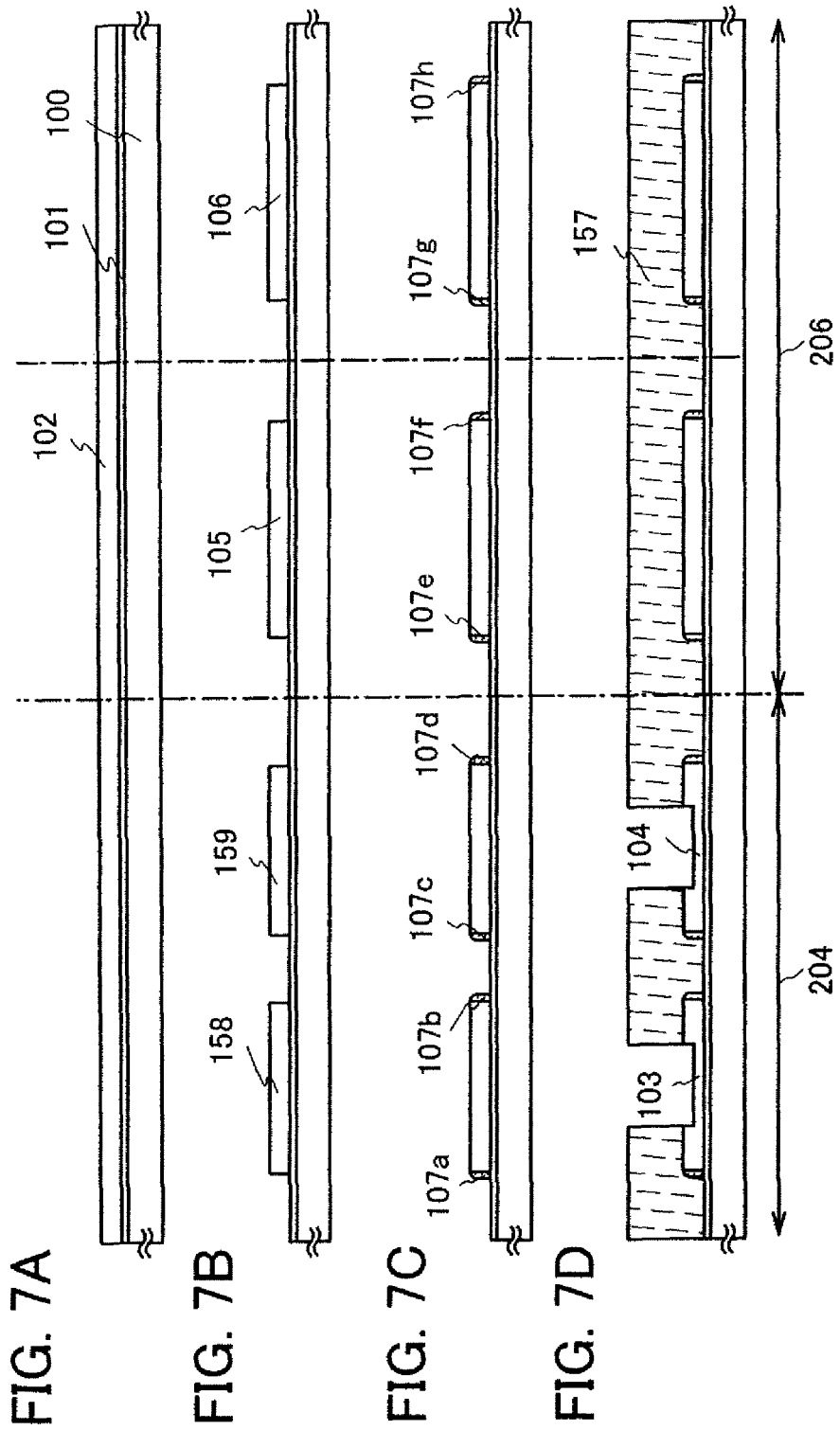

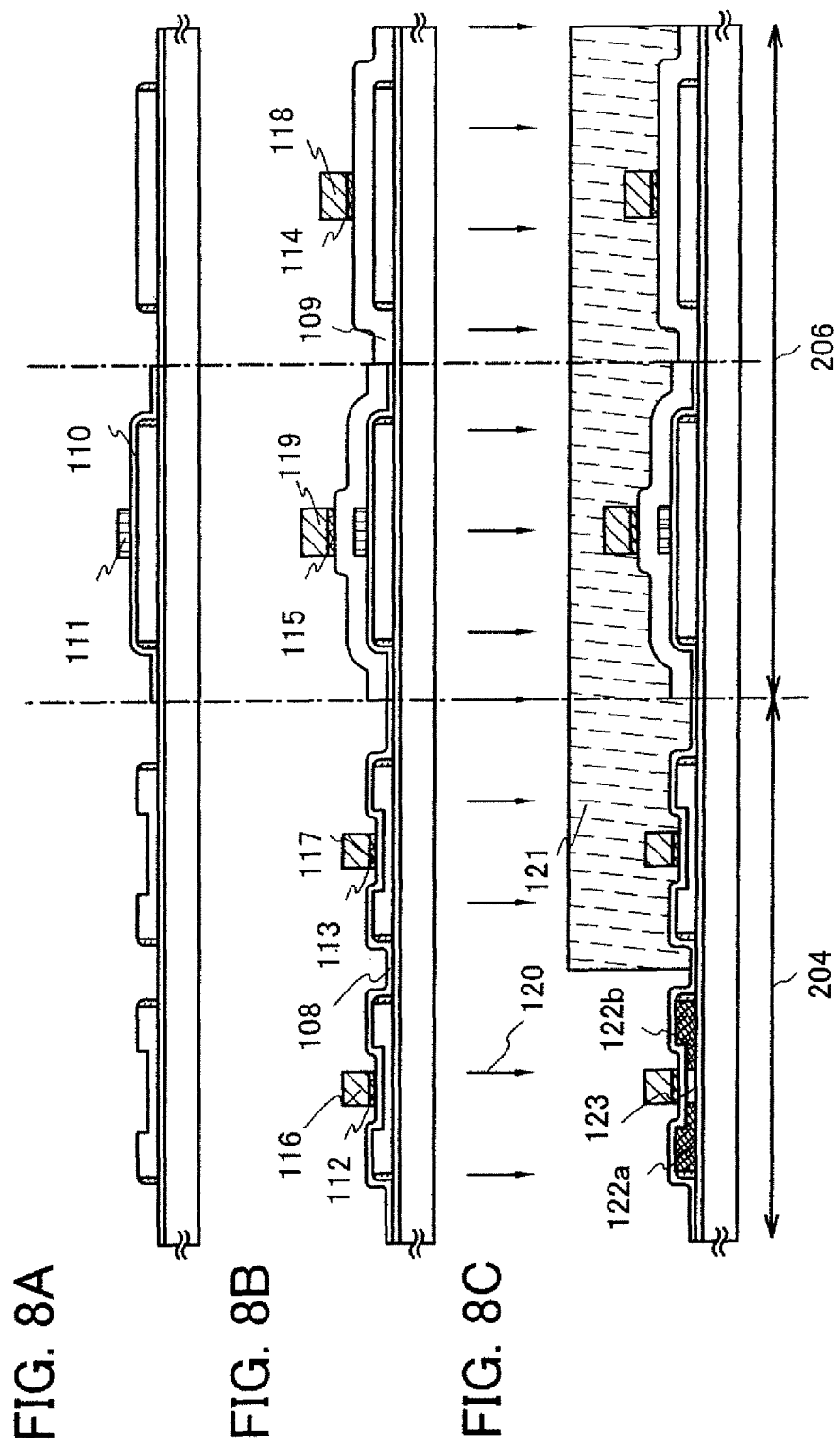

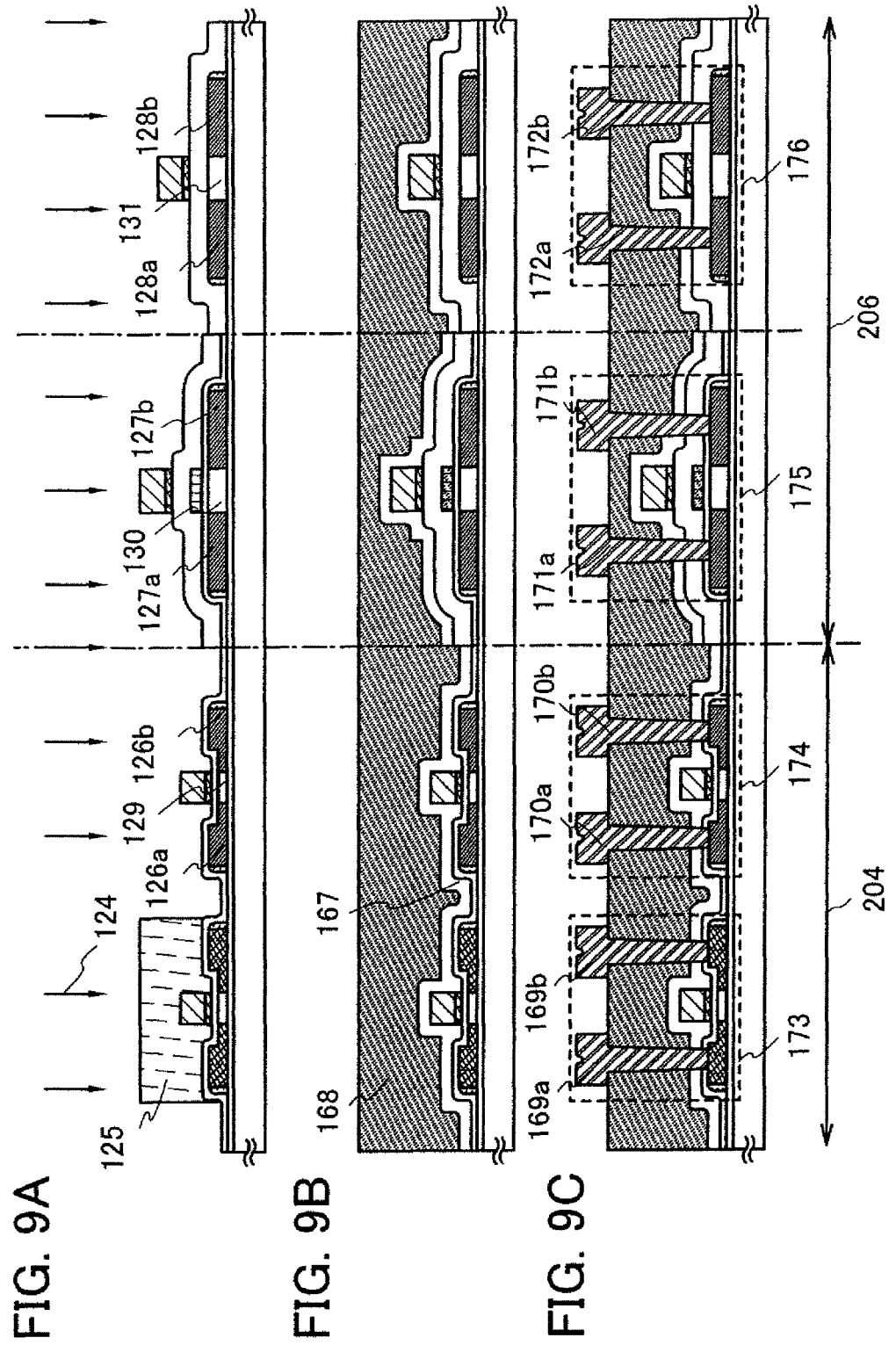

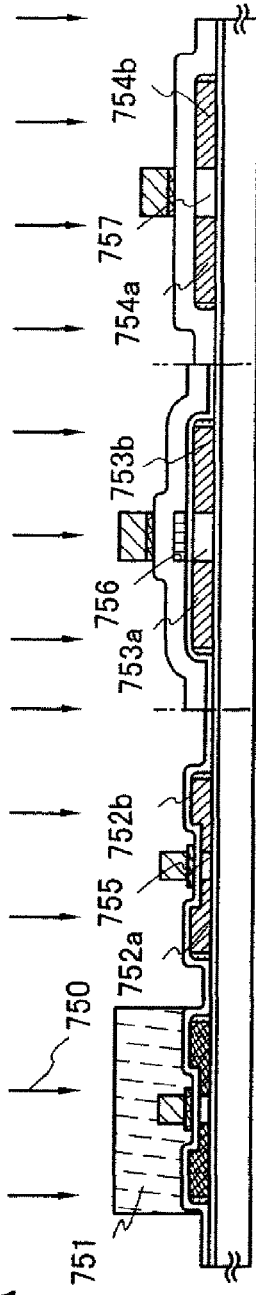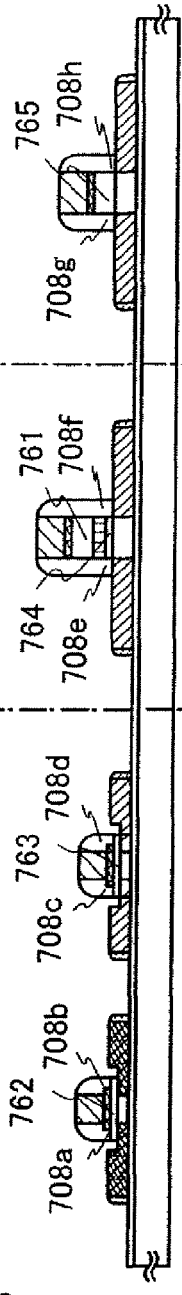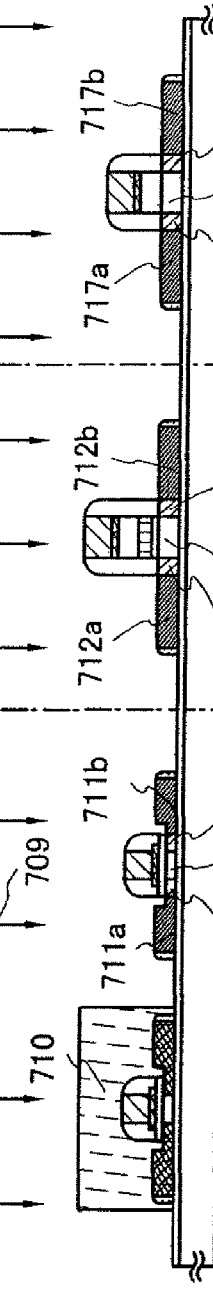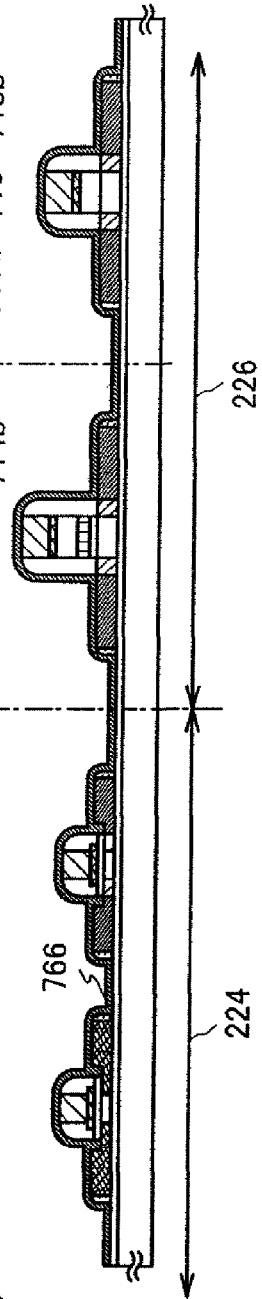

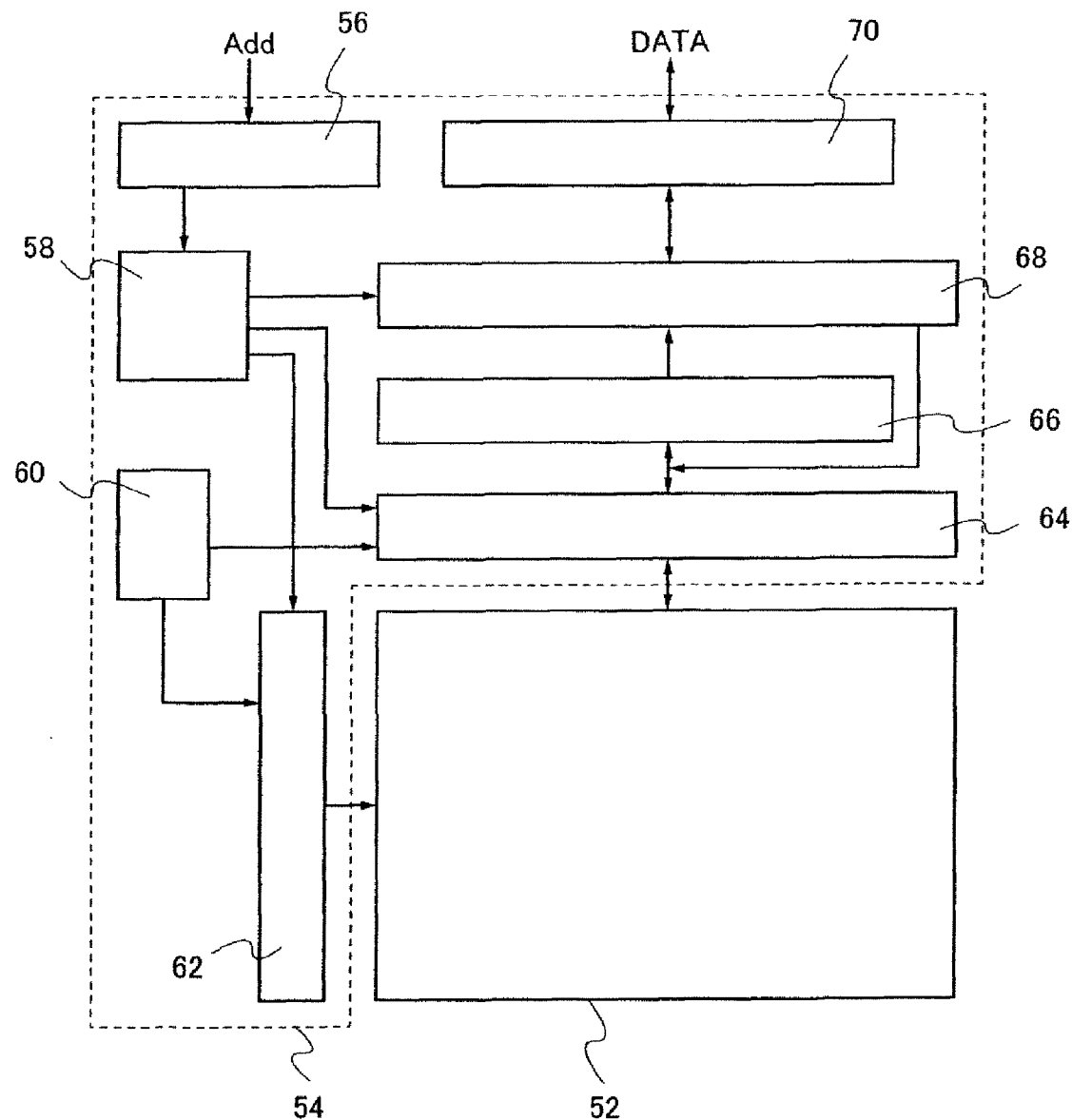

FIG. 23A
FIG. 23B
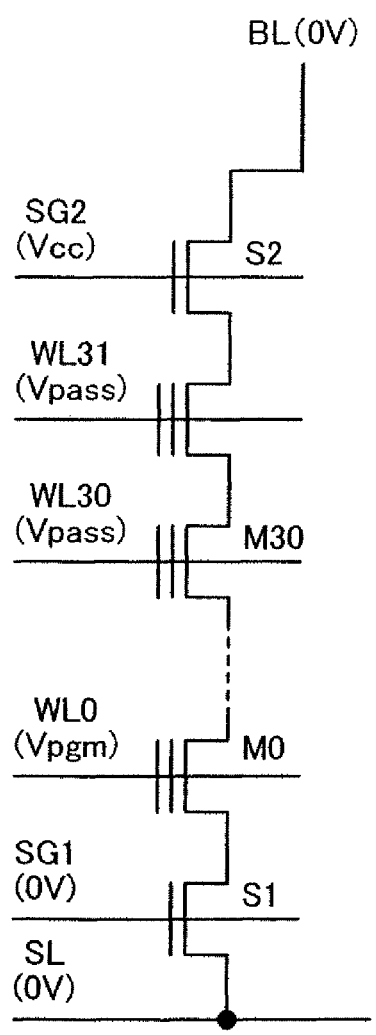
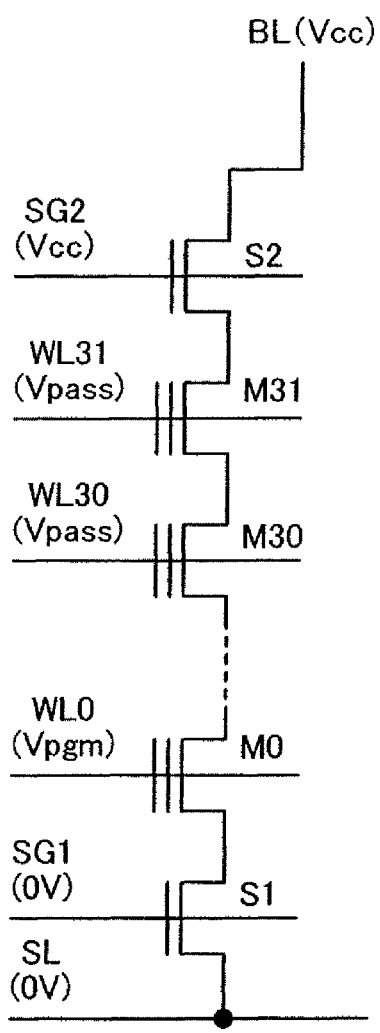

SEMICONDUCTOR DEVICE INCLUDING A MEMORY

BACKGROUND OF THE INVENTION

1. Field of the Invention

The present invention relates to a semiconductor device including thin film transistors.

2. Description of the Related Art

Different characteristics are required for thin film transistors that are used in semiconductor devices, depending on the purpose and function of the semiconductor devices. In order to satisfy the requirements, it is important to control characteristics of thin film transistors, and a technique of manufacturing thin film transistors having characteristics suited for their purposes has been researched (for example, Reference 1: Japanese Published Patent Application No. 19-27624).

In Reference 1, a thin film transistor including an impurity region with an LDD (lightly doped drain) structure is formed using a sidewall, and leak current when the thin film transistor is in an OFF state is reduced.

SUMMARY OF THE INVENTION

Particularly in a semiconductor device in which a plurality of circuits with different functions are provided over the same substrate, various different electric characteristics and functions are required for a plurality of thin film transistors in accordance with the intended uses. Therefore, thin film transistors each having a necessary function or electric characteristics need to be manufactured.

It is an object of the present invention to provide a semiconductor device including both a thin film transistor capable of high speed operation and having low driving voltage and a thin film transistor having high withstand voltage and high reliability. Accordingly, it is an object of the present invention to provide a semiconductor device with low power consumption and high reliability.

One feature of the semiconductor device of the present invention is to include plural kinds of thin film transistors with different thicknesses of channel formation regions of semiconductor layers, over the same substrate. The channel formation region of the semiconductor layer included in a thin film transistor for which high speed operation is required is thinned locally and made thinner than the channel formation region of the semiconductor layer included in a thin film transistor for which high withstand voltage is required. Since only the channel formation region is locally thinned in the thin film transistor for which high speed operation is required, regions of the source region and the drain region, which are in contact with the source electrode layer and the drain electrode layer respectively, are not thinned and thicker than the channel formation region. Further, a gate insulating layer of the thin film transistor for which high speed operation is required is also preferably thinner than a gate insulating layer of the thin film transistor for which high withstand voltage is required.

For example, in the case of a semiconductor device having a circuit such as a memory, a channel formation region of a semiconductor layer included in a specific thin film transistor in the memory may be selectively and locally thinned. In the case where a memory cell array including memory elements, a booster circuit portion, a driver circuit portion, a control circuit portion, and the like are provided in the memory, thin film transistors with different thicknesses of channel formation regions of semiconductor layers may be provided in accordance with the function required for the circuits. In the memory, the channel formation regions of the semiconductor layers included in the thin film transistors provided in the driver circuit portion, the control circuit portion, and the like, for which high speed operation is required, are selectively and locally thinned, whereas the semiconductor layers included in the memory elements of the memory cell array and the thin film transistors, for which high withstand voltage is required, are not thinned and preferably thicker than the channel formation regions of the semiconductor layers included in the thin film transistors provided in the driver circuit portion, the control circuit portion, and the like.

In the semiconductor device of the present invention, a channel formation region of a semiconductor layer included in a thin film transistor provided in a driver circuit portion, a control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, a source region and a drain region of the semiconductor layer included in the thin film transistor provided in the driver circuit portion, the control circuit portion, or the like, for which high speed operation is required, and a semiconductor layer (a source region, a drain region, and a channel formation region) included in a thin film transistor provided in a memory cell array or a power supply circuit, for which high withstand voltage is required, each preferably have a thickness equal to or greater than 25 nm and equal to or less than 100 nm, and more preferably equal to or greater than 50 nm and equal to or less than 60 nm.

In the present invention, the channel formation region of the semiconductor layer included in the thin film transistor which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with a source electrode layer and a drain electrode layer respectively, are not thinned (the thickness is preferably equal to or greater than 25 nm and equal to or less than 100 nm n, and more preferably equal to or greater than 50 nm and equal to or less than 60 nm). Therefore, part of the source region and the drain region, low-concentration impurity regions that can be provided between the channel formation region and the source and drain regions, and the like in the semiconductor layer, other than the channel formation region, may also be thinned.

In the semiconductor device of the present invention, a gate insulating layer included in the thin film transistor that is provided in the driver circuit portion, the control circuit portion, or the like, for which high speed operation is required, preferably has a thickness equal to or greater than 1 nm and equal to or less than 10 nm, and more preferably about 5 nm. On the other hand, a gate insulating layer included in the thin film transistor that is provided in the memory cell array, the power supply circuit, or the like, for which high withstand voltage is required, preferably has a thickness equal to or greater than 50 nm and equal to or less than 150 nm, and more preferably equal to or greater than 60 nm and equal to or less than 80 nm.

As the semiconductor layer, a crystalline semiconductor layer may be used, and a crystalline semiconductor layer which is formed by crystallizing an amorphous semiconductor layer with heat or light, or a single-crystalline semiconductor layer may be used. Further, silicon can be used for the semiconductor layer.

In a thin film transistor provided in a driver circuit portion, a control circuit portion, or the like, for which high speed operation is required, a channel formation region of a semiconductor layer (or, a gate insulating layer as well) is locally thinned. Since miniaturization can be realized in this way, reduction in area of the driver circuit portion, the control circuit portion, or the like, for which high speed operation is required, is possible, and a narrow frame, high speed operation, and low driving voltage can be achieved. Accordingly, a semiconductor device can have low power consumption.

In the thin film transistor for which high speed operation is required, only the channel formation region is locally thinned; accordingly, regions of a source region and a drain region, which are in contact with a source electrode layer and a drain electrode layer respectively, are not thinned and thicker than the channel formation region. Therefore, when openings (contact holes) which expose the source region and the drain region are formed, the semiconductor layer near the openings can be prevented from being removed entirely, and increase in contact resistance (between the semiconductor layer and the electrode layers) can be prevented. Accordingly, reduction in yield in a manufacturing process can be prevented and high performance of the completed semiconductor device can be realized.

On the other hand, by making the semiconductor layer (or, the gate insulating layer as well) of the thin film transistor provided in the memory cell array, the power supply circuit, or the like, for which high withstand voltage is required, thicker than those of the driver circuit portion, the control circuit portion, and the like, high withstand voltage and high reliability can be realized.

Accordingly, the semiconductor device of the present invention can have low power consumption and high reliability.

In the present invention, a semiconductor device refers to a device which can function by utilizing the semiconductor characteristics. By using the present invention, a device having a circuit including semiconductor elements (e.g., transistors, memory elements, and/or diodes) or a semiconductor device such as a chip including a processor circuit can be manufactured.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, and in which the driver circuit portion includes a second thin film transistor which includes a second gate electrode layer; a second semiconductor layer including a second source region, a second drain region, and a second channel formation region that is thinner than the first channel formation region; and a second gate insulating layer.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, and in which the driver circuit portion includes a second thin film transistor which includes a second gate electrode layer; a second semiconductor layer including a second source region, a second drain region, and a second channel formation region that is thinner than the first channel formation region; and a second gate insulating layer, and in which the second channel formation region is a region which is locally thinned in the second semiconductor layer.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, and in which the driver circuit portion includes a second thin film transistor which includes a second gate electrode layer; a second semiconductor layer including a second source region, a second drain region, and a second channel formation region that is thinner than the first channel formation region; and a second gate insulating layer that is thinner than the first gate insulating layer.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, in which the driver circuit portion includes a second thin film transistor which includes a second gate electrode layer; a second semiconductor layer including a second source region, a second drain region, and a second channel formation region that is thinner than the first channel formation region; and a second gate insulating layer that is thinner than the first gate insulating layer, and in which the second channel formation region is a region which is locally thinned in the second semiconductor layer.

In the above-described structures, insulating layers having a sidewall structure may be provided on side surfaces of the first gate electrode layer and the second gate electrode layer. For example, one aspect of the semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, in which the driver circuit portion includes a second thin film transistor which includes a second gate electrode layer; a second semiconductor layer including a second source region, a second drain region, and a second channel formation region that is thinner than the first channel formation region; and a second gate insulating layer, in which the second channel formation region is a region which is locally thinned in the second semiconductor layer, and in which insulating layers having a sidewall structure are provided on side surfaces of the first gate electrode layer and the second gate electrode layer.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, in which the driver circuit portion includes a second thin film transistor which includes a second gate electrode layer; a second semiconductor layer including a second source region, a second drain region, and a second channel formation region that is thinner than the first channel formation region; and a second gate insulating layer that is thinner than the first gate insulating layer, in which the second channel formation region is a region which is locally thinned in the second semiconductor layer, and in which insulating layers having a sidewall structure are provided on side surfaces of the first gate electrode layer and the second gate electrode layer.

In the above-described structures, silicides may be provided in surface portions of the first source region, the first drain region, the second source region, and the second drain region. For example, one aspect of the semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, in which the driver circuit portion includes a second thin film transistor which includes a second gate electrode layer; a second semiconductor layer including a second source region, a second drain region, and a second channel formation region that is thinner than the first channel formation region; and a second gate insulating layer, in which the second channel formation region is a region which is locally thinned in the second semiconductor layer, in which insulating layers having a sidewall structure are provided on side surfaces of the first gate electrode layer and the second gate electrode layer, and in which silicides are provided in surface portions of the first source region, the first drain region, the second source region, and the second drain region.

One aspect of a semiconductor device of the present invention is to include a memory including a memory cell array and a driver circuit portion which are provided over a substrate having an insulating surface, in which the memory cell array includes a first thin film transistor which includes a first gate electrode layer; a first semiconductor layer including a first source region, a first drain region, and a first channel formation region; and a first gate insulating layer, in which the driver circuit portion includes a second thin film transistor which includes a second gate electrode layer; a second semiconductor layer including a second source region, a second drain region, and a second channel formation region that is thinner than the first channel formation region; and a second gate insulating layer that is thinner than the first gate insulating layer, in which the second channel formation region is a region which is locally thinned in the second semiconductor layer, in which insulating layers having a sidewall structure are provided on side surfaces of the first gate electrode layer and the second gate electrode layer, and in which silicides are provided in surface portions of the first source region, the first drain region, the second source region, and the second drain region.

In the above-described structures, insulating layers having a sidewall structure may be provided on side surfaces of the first semiconductor layer and the second semiconductor layer. Further, one or both of the first semiconductor layer and the second semiconductor layer may include an impurity region having one conductivity type at a concentration lower than those in the first source region, the first drain region, the second source region, or the second drain region.

One feature of a semiconductor device of the present invention is to include plural kinds of thin film transistors with different thicknesses of semiconductor layers, over the same substrate. A semiconductor layer of a thin film transistor for which high speed operation is required is thinned and made thinner than a semiconductor layer of a thin film transistor for which high withstand voltage is required.

In a thin film transistor in a driver circuit portion or the like for which high speed operation is required, a semiconductor layer (or, a gate insulating layer as well) is thinned. Since miniaturization can be realized in this way, reduction in area of the driver circuit portion is possible, and a narrow frame, high speed operation, and low driving voltage can be achieved. Reduction in thickness of a channel formation region of the semiconductor layer acts on an entire region of the channel formation region to be depleted. Accordingly, a semiconductor device can have low power consumption.

On the other hand, by making the semiconductor layer (of, the gate insulating layer as well) of the thin film transistor provided in the memory cell array or the like, for which high withstand voltage is required, thicker than those of the driver circuit portion and the like, high withstand voltage and high reliability can be realized.

Therefore, the semiconductor device of the present invention can have low power consumption and high reliability.

BRIEF DESCRIPTION OF THE DRAWINGS

In the accompanying drawings:

FIGS. 7A to 7D show a manufacturing method of a semiconductor device according to the present invention;

FIGS. 8A to 8C show a manufacturing method of a semiconductor device according to the present invention;

FIGS. 9A to 9C show a manufacturing method of a semiconductor device according to the present invention;

FIGS. 10A to 10D show a manufacturing method of a semiconductor device according to the present invention;

FIG. 17 is a block diagram showing a main structure of a semiconductor device according to the present invention;

FIGS. 23A and 23B show writing operation of a semiconductor device according to the present invention;

DETAILED DESCRIPTION OF THE INVENTION

Figure 1:
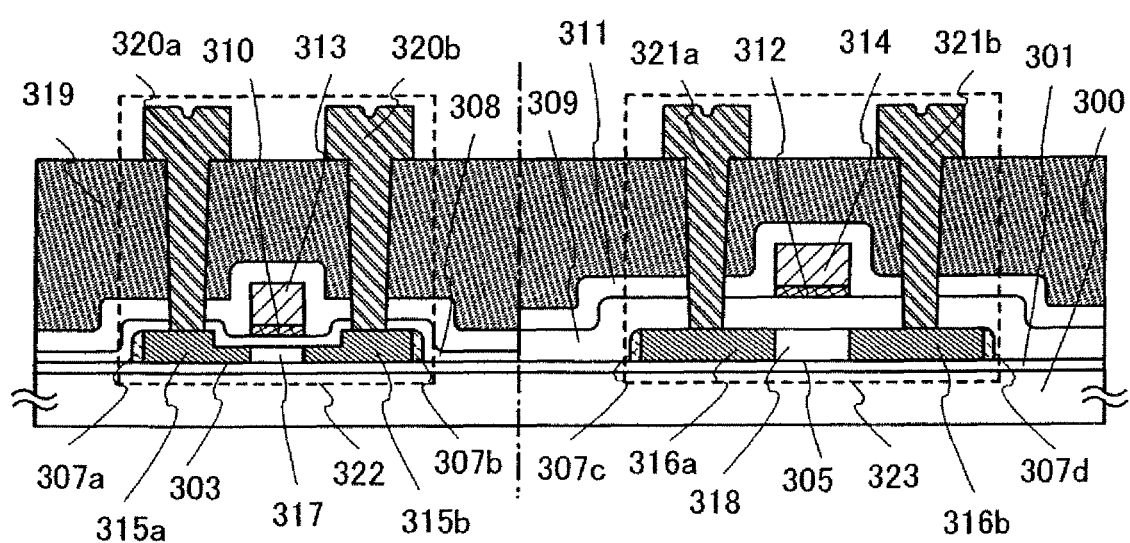
FIG. 1 shows a semiconductor device according to the present invention.

Embodiment modes of the present invention will be described with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having similar functions throughout the drawings, and repeated description thereof is omitted.

EMBODIMENT MODE 1

Embodiment Mode 1 will describe a semiconductor device with low power consumption and high reliability and a manufacturing method of the semiconductor device, in detail with reference to FIGS. 1 to 3D and FIGS. 15A to 15D.

FIG. 1 shows one mode of a semiconductor device that uses the present invention. FIG. 1 is a cross-sectional view of a semiconductor device of this embodiment mode.

Thin film transistors 322 and 323, an insulating film 311, and an insulating layer 319 are formed over a substrate 300 over which an insulating layer 301 serving as a base film of a semiconductor layer is formed. The thin film transistor 322 includes a semiconductor layer 303 including impurity regions 315*a* and 315*b* which have one conductivity type and are a source region and a drain region, and a channel formation region 317; a gate insulating layer 308; and a gate electrode layer (a first gate electrode layer 310 and a second gate electrode layer 313). In addition, wiring layers 320*a* and 320*b* that are a source electrode layer and a drain electrode layer and connected to the impurity regions 315*a* and 315*b* which have one conductivity type and are a source region and a drain region, are provided. The thin film transistor 322 can be electrically connected to another semiconductor element or the like by the wiring layers 320*a* and 320*b*.

On the other hand, the thin film transistor 323 includes a semiconductor layer 305 including impurity regions 316*a* and 316*b* which have one conductivity type and are a source region and a drain region, and a channel formation region 318; a gate insulating layer 309; and a gate electrode layer (a first gate electrode layer 312 and a second gate electrode layer 314). In addition, wiring layers 321*a* and 321*b* that are a source electrode layer and a drain electrode layer and connected to the impurity regions 316*a* and 316*b* which have one conductivity type and are a source region and a drain region, are provided. The thin film transistor 323 can be electrically connected to another semiconductor element or the like by the wiring layers 321*a* and 321*b* (FIG. 1).

The semiconductor device of this embodiment mode that uses the present invention includes the plural kinds of thin film transistors 322 and 323 with different thicknesses of the channel formation regions of the semiconductor layers, over the same substrate 300. The channel formation region 317 of the semiconductor layer 303 included in the thin film transistor 322, for which high speed operation is required, is thinned locally, so that the channel formation region 317 of the semiconductor layer 303 is made thinner than the channel formation region 318 of the semiconductor layer 305 included in the thin film transistor 323, for which high withstand voltage is required. Since only the channel formation region is locally thinned in the thin film transistor 322 for which high speed operation is required, regions of the source region and the drain region, which are in contact with the source electrode layer and the drain electrode layer respectively, are not thinned and thicker than the channel formation region. Further, the gate insulating layer of the thin film transistor 322, for which high speed operation is required, is also preferably thinner than the gate insulating layer of the thin film transistor 323, for which high withstand voltage is required.

In order that the thin film transistors 322 and 323 with different thicknesses of the channel formation regions of the semiconductor layers each fulfill a necessary function in the same circuit, the thin film transistor 322 can be provided in a region where high speed operation is required, and the thin film transistor 323 can be provided in a region where high withstand voltage is required. For example, in the case of a semiconductor device including a circuit of a memory or the like, a channel formation region of a semiconductor layer included in a specific thin film transistor in the memory may be selectively and locally thinned, whereas a semiconductor layer included in a specific thin film transistor to which high current and high voltage are applied may be left thick.

In the case where a plurality of circuits are provided in a semiconductor device, a thin film transistor with a different thickness of a channel formation region of a semiconductor layer may be provided in each of the circuits in accordance with the function required for the circuits. The thin film transistor 322 may be selectively provided in a circuit for which high speed operation is required and the thin film transistor 323 may be selectively provided in a circuit for which high withstand voltage is required. For example, in the case where a memory cell array including memory elements, a booster circuit portion, a driver circuit portion, a control circuit portion, and the like are provided in a memory, channel formation regions of semiconductor layers included in thin film transistors provided in the driver circuit portion, the control circuit portion, and the like, for which high speed operation is required, are selectively and locally thinned, whereas semiconductor layers included in the memory elements of the memory cell array and thin film transistors, for which high withstand voltage is required, are not thinned and preferably thicker than the semiconductor layers included in the thin film transistors provided in the driver circuit portion, the control circuit portion, and the like.

In addition to the memory, in the case where a plurality of circuits are provided in the semiconductor device, a thin film transistor in which a semiconductor layer is locally thinned may be provided in a circuit that serves as a logic circuit and is required to operate at high speed. A thin film transistor having a semiconductor layer that is not thinned and has a thickness to withstand high voltage may be provided in a circuit such as a power supply circuit, to which high voltage is applied.

In the semiconductor device of the present invention, the channel formation region of the semiconductor layer included in the thin film transistor provided in the driver circuit portion, the control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, the source region and the drain region of the semiconductor layer included in the thin film transistor 322 provided in the driver circuit portion, the control circuit portion, or the like, for which high speed operation is required, and the semiconductor layer (the source region, the drain region, and the channel formation region) included in the thin film transistor 323 provided in the memory cell array or the power supply circuit, for which high withstand voltage is required, each preferably have a thickness equal to or greater than 25 nm and equal to or less than 100 nm, and more preferably equal to or greater than 50 nm and equal to or less than 60 nm.

In the semiconductor device of the present invention, the channel formation region 317 of the semiconductor layer included in the thin film transistor 322, which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with the source electrode layer and the drain electrode layer respectively, are not thinned (the thickness is preferably equal to or greater than 25 nm and equal to or less than 100 nm, and more preferably equal to or greater than 50 nm and equal to or less than 60 nm). Therefore, part of the source region and the drain region, other than the channel formation region, in the semiconductor layer 303 may also be thinned.

In the semiconductor device of the present invention, the gate insulating layer 308 included in the thin film transistor 322 that is provided in the driver circuit portion, the control circuit portion, or the like, for which high speed operation is required, preferably has a thickness equal to or greater than 1 nm and equal to or less than 10 nm, and more preferably about 5 nm. On the other hand, the gate insulating layer 309 included in the thin film transistor 323 that is provided in the memory cell array, the power supply circuit, or the like, for which high withstand voltage is required, preferably has a thickness equal to or greater than 50 nm and equal to or less than 150 nm, and more preferably equal to or greater than 60 nm and equal to or less than 80 nm.

In this embodiment mode, the thin film transistor 322, for which high speed operation is required, preferably has a channel length shorter than the thin film transistor 323, for which high withstand voltage is required. The channel length of the thin film transistor 322, for which high speed operation is required, of this embodiment mode is preferably 0.1 µm to 1 µm. In addition, the channel length of the thin film transistor 323 that is provided in the memory cell array or the power supply circuit, for which high withstand voltage is required, is preferably 1 µm to 5 µm (more preferably, 1 µm to 3 µm).

In the thin film transistor, by shortening the channel length that is represented as a length of the gate electrode between a source and a drain, a traveling distance of carriers flowing through a channel of the transistor is shortened, so that high speed operation can be performed.

However, when the channel length is shortened for high performance of the thin film transistor, a phenomenon in which threshold voltage is changed or leak current is increased between the source and the drain in a weak inversion state, which is a so-called short-channel effect becomes prominent.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation region of the semiconductor layer included in the thin film transistor that is provided in the driver circuit portion, the control circuit portion, or the like, for which high speed operation is required, acts on an entire region of the channel formation region to be depleted, thereby suppressing the short-channel effect. In addition, the threshold voltage of the thin film transistor can be reduced. Accordingly, miniaturization and high performance of the thin film transistor that is provided in the driver circuit portion, the control circuit portion, or the like can be realized. Therefore, low voltage driving of the semiconductor device can be performed, and low power consumption can be realized. Since miniaturization of the thin film transistor can be realized by thinning the semiconductor layer (or, the gate insulating layer as well), reduction in area of the driver circuit portion or the control circuit portion can be achieved, and miniaturization of the semiconductor device can be realized.

In the thin film transistor for which high speed operation is required, only the channel formation region is locally thinned; accordingly, regions of the source region and the drain region, which are in contact with the source electrode layer and the drain electrode layer respectively, are not thinned and thicker than the channel formation region. Therefore, when openings (contact holes) which expose the source region and the drain region are formed, the semiconductor layer near the openings can be prevented from being removed entirely, and increase in contact resistance (between the semiconductor layer and the electrode layers) can be prevented. Accordingly, reduction in yield in a manufacturing process can be prevented and high performance of the completed semiconductor device can be realized.

On the other hand, by making the semiconductor layer (or, the gate insulating layer as well) of the thin film transistor 323 provided in the memory cell array, the power supply circuit, or the like, for which high withstand voltage is required, thicker than those of the driver circuit portion, the control circuit portion, and the like, withstand voltage can be high, and the semiconductor device with high reliability can be realized.

Side surfaces of the semiconductor layers 303 and 305 are covered with insulating layers 307a, 307b, 307c, and 307d as sidewall insulating layers. By providing the insulating layers 307a, 307b, 307c, and 307d which are in contact with the side surfaces of the semiconductor layers 303 and 305, coverage with the gate insulating layers 308 and 309 at end portions of the semiconductor layers 303 and 305 can be improved.

Therefore, defects caused by insufficient coverage with the gate insulating layers 308 and 309 at the end portions of the semiconductor layers 303 and 305 such as short circuit between the semiconductor layer and the gate electrode layer, generation of leak current, and electrostatic breakdown, can be prevented.

After formation of the semiconductor layers 303 and 305, the insulating layers 307a, 307b, 307c, and 307d can be formed in a self-aligning manner by stacking a silicon oxide film or a silicon nitride film and conducting anisotropic etching. Alternatively, the insulating layers 307a, 307b, 307c, and 307d can be formed by subjecting the end portions of the semiconductor layers 303 and 305 to oxidation treatment so as to be insulated selectively. The oxidation treatment can be performed by plasma treatment in an atmosphere containing oxygen. Alternatively, surfaces may be subjected to oxidation treatment using an aqueous solution (also referred to as wet oxidation). Halogen such as fluorine or chlorine may be introduced into the end portions of the semiconductor layers before plasma treatment, and then plasma treatment may be performed. When halogen is introduced, oxidation speed is high; therefore, oxidation proceeds preferentially. Accordingly, thick insulating layers can be formed in the end portions of the semiconductor layers.

In the case where a region except for the end portions of the semiconductor layers is covered using a mask and wet oxidation is selectively conducted to the end portions of the semiconductor layers, wet oxidation is, for example, conducted in such a manner that surfaces of the end portions of the semiconductor layers are treated using an aqueous solution (representatively, ozone water) containing ozone ($O_3$) of 5 ppm or more, preferably, 20 ppm or more, more preferably, 100 ppm or more, thereby forming sidewall insulating layers that are each formed of an oxide film at an exposed portion of the semiconductor layers. Note that an aqueous solution containing hydrogen peroxide ($H_2O_2$), sulfuric acid ($H_2SO_4$), iodic acid ($HNO_3$), nitric acid ($HNO_3$), or the like can be used instead of the aqueous solution containing ozone. Further, the aqueous solutions may contain an organic acid, such as acetic acid or oxalic acid.

Since oxidation can proceed from the exposed portions of the end portions of the semiconductor layers, oxide films can be formed selectively and thickly at the end portions of the semiconductor layers. Therefore, electric field concentration in the vicinity of the end portions of the semiconductor layers can be reduced, gate leakage defects can be reduced, and withstand voltage of the gate electrode can be improved.

In the case where the sidewall insulating layers are formed at the end portions of the semiconductor layers using plasma treatment, only the end portions of the semiconductor layers may be exposed similarly to the case of the above-described wet oxidation, and then plasma treatment may be performed to the end portions of the semiconductor layers in an atmosphere containing oxygen, so that the sidewall insulating layers may be formed. Alternatively, entire surfaces of the island-shaped semiconductor layers may be subjected to plasma treatment, so that insulating layers may be formed to cover the surfaces of the semiconductor layers.

By covering the end portions of the semiconductor layers 303 and 305 with the gate insulating layers 308 and 309 enough, and preferably, by increasing the thickness of the insulating layers 307a, 307b, 307c, and 307d in the regions which are in contact with the side surfaces of the semiconductor layers 303 and 305, an electric field applied to the end portions of the semiconductor layers 303 and 305 can be relaxed, and generation of leak current, or the like can be prevented.

Further, the insulating layers 307a, 307b, 307c, and 307d each preferably have a lower dielectric constant than the gate insulating layers 308 and 309. By making the dielectric constant of the insulating layers 307a, 307b, 307c, and 307d lower than those of the gate insulating layers 308 and 309, electric field concentration in the end portions of the semiconductor layers, especially at corner portions (corners), can be reduced. For example, the insulating layers 307a, 307b, 307c, and 307d may be formed using a low dielectric constant material having a dielectric constant of 2.5 or lower. As the low dielectric constant material, porous silicon oxide manufactured by a CVD method, silicon oxide containing carbon or fluorine, or the like can be used. By forming the insulating layers 307a, 307b, 307c, and 307d using a low dielectric constant material, effect similar to the case where the insulating layers are formed thickly can be obtained. Accordingly, local application of excessive electric field to the gate insulating layers 308 and 309 can be prevented, and insufficient insulation of the gate insulating layers 308 and 309 can be prevented. Thus, high-yield manufacturing of thin film transistors can be realized, and reliability of a semiconductor device can be improved.

The semiconductor device of this embodiment mode can be a highly-reliable semiconductor device, in which defects such as short circuit between a gate electrode and a semiconductor layer and leak current, which would be caused due to insufficient coverage with a gate insulating layer, are prevented.

In FIG. 1, although the impurity regions are illustrated by hatching on a white background, this does not mean that the white background portion is not doped with an impurity element, but is shown so that it will be intuitively understood that the concentration distribution of the impurity element in the region reflects a mask or doping conditions. Note that the same can be said for the other drawings in this specification.

For the substrate 300 having an insulating surface, a glass substrate, a quartz substrate, a sapphire substrate, a ceramic substrate, a metal substrate having an insulating layer formed on its surface, or the like can be used. Alternatively, a plastic substrate which can withstand the processing temperature in this embodiment mode, or a flexible substrate such as a film can also be used. As a plastic substrate, a substrate made of PET (polyethylene terephthalate), PEN (polyethylene naphthalate), or PES (polyethersulfone) can be used. For a flexible substrate, a synthetic resin such as acrylic can be used.

For the insulating layer 301, the gate insulating layers 308 and 309, the insulating film 311, and the insulating layer 319, silicon oxide, silicon nitride, silicon oxynitride, silicon nitride oxide, or the like can be used, and either a single-layer structure or a stacked structure of two or three layers can be employed. Note that in this specification, silicon oxynitride means a substance containing more oxygen than nitrogen. Therefore, it can also be called silicon oxide containing nitrogen. Similarly, silicon nitride oxide means a substance containing more nitrogen than oxygen. Therefore, it can also be called silicon nitride containing oxygen.

Alternatively, the insulating layer 301, the gate insulating layers 308 and 309, the insulating film 311, and the insulating layer 319 can be formed using materials selected from among aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, or other substances containing inorganic insulating materials. It is also possible to use a material containing siloxane. Note that siloxane corresponds to a material having a Si—O—Si bond. Siloxane has a skeletal structure including the bond of silicon (Si) and oxygen (O). As a substituent of siloxane, an organic group containing at least hydrogen (e.g., an alkyl group or an aryl group) may be given. Alternatively, a fluoro group may be given as the substituent. As a further alternative, both an organic group containing at least hydrogen and a fluoro group may be given as the substituent. Further, an oxazole resin such as photo-curing polybenzoxazole, for example, can also be given.

The insulating layer 301, the gate insulating layers 308 and 309, the insulating film 311, and the insulating layer 319 can be formed by a sputtering method, a PVD (physical vapor deposition) method, a CVD (chemical vapor deposition) method such as low-pressure CVD (LPCVD) or plasma CVD, a droplet discharge method by which patterns can be formed selectively, a printing method by which patterns can be transferred or drawn (a method by which patterns are formed such as screen printing or offset printing), a coating method such as spin coating, a dipping method, a dispensing method, or the like.

An etching process for processing a film into a desired shape may be conducted by using either plasma etching (dry etching) or wet etching. Plasma etching is suitable for processing a large-area substrate. As an etching gas, a fluorine-based gas such as $CF_4$ or $NF_3$ or a chlorine-based gas such as $Cl_2$ or $BCl_3$ may be used, and an inert gas such as He or Ar may also be mixed into the etching gas as appropriate. Further, when an etching process by atmospheric pressure discharge is conducted, local discharge processing becomes possible; therefore, there is no need to form a mask layer over the entire surface of the substrate.

Further, the gate insulating layers 308 and 309 may be formed by conducting plasma treatment to the semiconductor layers.

By oxidizing the surface of a silicon layer by plasma treatment as a typical example of the semiconductor layer, a dense oxide layer without a distorted interface can be formed. Further, by forming a nitride layer by nitriding the oxide layer by plasma treatment so as to substitute nitrogen for oxygen of the outermost surface, an even denser film can be obtained. Accordingly, an insulating layer with high withstand voltage can be formed.

Note that the plasma treatment in the present invention is conducted in the conditions that the electrical characteristics of transistors are not adversely affected.

Further, even after forming the substrate, the insulating layer, the interlayer insulating layer, or other insulating layers, conductive layers, and the like which constitute the semiconductor device, plasma oxidation treatment or plasma nitridation treatment may be conducted on the surface of the substrate, the insulating layer, or the interlayer insulating layer. By oxidizing or nitriding the semiconductor layer or the insulating layer by plasma treatment, the surface of the insulating layer can be modified, so that an insulating layer which is denser than an insulating layer formed by a CVD method or a sputtering method can be formed. Therefore, defects such as pin holes can be suppressed, and characteristics and the like of the semiconductor device can be improved. The above-described plasma treatment can also be conducted for a conductive layer or the like such as a gate electrode layer, a source wiring layer, or a drain wiring layer. In that case, the surface of the layer or the vicinity of the surface can be nitrided or oxidized.

The semiconductor layers 303 and 305 are preferably formed using a crystalline semiconductor. For example, the semiconductor layers 303 and 305 can be obtained by crystallizing a semiconductor layer which is formed over the entire surface of the substrate by a sputtering method, a plasma CVD method, or a low-pressure CVD method. The semiconductor material is preferably silicon, and a silicon germanium semiconductor can also be used. Crystallization of the semiconductor layers can be conducted by a laser crystallization method, a thermal crystallization method using rapid thermal annealing (RTA) or an annealing furnace, a crystallization method using a metal element which promotes the crystallization, or a method combining them.

The semiconductor layers 303 and 305 may be doped with an impurity element imparting p-type conductivity. As the impurity element imparting p-type conductivity, boron is used for example, and it may be added at a concentration of about $5\times10^{15}$ to $1\times10^{16}$ atoms/cm$^3$. This is in order to control the threshold voltage of the transistors, and the impurity element can effectively act by being added into the channel formation regions 317 and 318.

Note that the wiring layers 320a, 320b, 321a, and 321b, which are electrically connected to the thin film transistors 322 and 323, and gate electrode layers (the first gate electrode layers 310 and 312 and the second gate electrode layers 313 and 314) can be formed using a conductive material such as indium tin oxide (ITO), IZO (indium zinc oxide) which is obtained by mixing indium oxide with zinc oxide (ZnO), or a mixture of indium oxide and silicon oxide ($SiO_2$); organic indium; organotin; indium oxide containing tungsten oxide; indium zinc oxide containing tungsten oxide; indium oxide containing titanium oxide; indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of the metal; or nitride of the metal.

The invention is not limited to this embodiment mode, and a thin film transistor may have any of a single-gate structure in which one channel formation region is formed in one thin film transistor, a double-gate structure in which two channel formation regions are formed, and a triple-gate structure in which three channel formation regions are formed.

A manufacturing method of the semiconductor device of this embodiment mode shown in FIG. 1 will be described with reference to FIGS. 2A to 3D and FIGS. 15A to 15D.

The insulating layer 301, which is a base film, is formed as a base film, over the substrate 300 having an insulating surface. The base film may have a single-layer structure or a stacked structure of two or three layers.

The base film may be formed using a material of an inorganic material such as silicon oxide, silicon nitride, silicon oxynitride, or silicon nitride oxide; an acrylic acid, a methacrylic acid, or derivatives thereof; a heat-resistant high-molecular compound such as polyimide, aromatic polyamide, or polybenzimidazole; or a siloxane resin. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, a photo-curing polybenzoxazole or the like can be used.

The base films can be formed by a sputtering method, a PVD physical vapor deposition) method, a CVD (chemical vapor deposition) method such as a low-pressure CVD (LPCVD) method or a plasma CVD method, or the like. Further, a droplet discharge method, a printing method (a method for forming a pattern such as screen printing or offset printing), a coating method such as a spin coating method, a dipping method, a dispenser method, or the like can also be used.

For example, the insulating layer 301 may be formed by stacking a silicon nitride oxide film with a thickness of 10 to 200 nm (preferably, 50 to 150 nm) and a silicon oxide nitride film with a thickness of 50 to 200 nm (preferably, 100 to 150 nm) by a plasma CVD method.

Next, a semiconductor film is formed over the base film. In the present invention, it is preferable to use a crystalline semiconductor film that is obtained by crystallizing an amorphous semiconductor film with a laser beam.

The semiconductor film may be formed to a thickness of 25 to 200 nm preferably, 50 to 60 nm) by a method such as a sputtering method, an LPCVD method, or a plasma CVD method. In this embodiment mode, after formation of the semiconductor film, the semiconductor film is selectively thinned to a desired thickness.

As a material for forming the semiconductor film, a polycrystalline semiconductor formed by crystallizing an amorphous semiconductor (hereinafter also referred to as an "AS") by utilizing light energy or thermal energy, a single crystalline semiconductor, or the like can be used. The amorphous semiconductor can be manufactured by a vapor phase growth method that uses a semiconductor material gas typified by silane or germane or a sputtering method.

Typical examples of an amorphous semiconductor include hydrogenated amorphous silicon, and typical examples of a crystalline semiconductor include polysilicon and the like. Examples of polysilicon (polycrystalline silicon) include so-called high-temperature polysilicon that contains polysilicon as a main component and is formed at a process temperature greater than or equal to 800° C., so-called low-temperature polysilicon that contains polysilicon as a main component and is formed at a process temperature less than or equal to 600° C., polysilicon obtained by crystallizing amorphous silicon by using an element that promotes crystallization or the like, and the like. Instead of such a thin film process, an SOI substrate formed by providing a single crystalline semiconductor layer on an insulating surface may be used. The SOI substrate can be formed by an SIMOX (separation by implanted oxygen) method or a Smart-Cut method. In the SIMOX method, oxygen ions are implanted into a single crystalline silicon substrate to form an oxygen-containing layer at a predetermined depth, and then heat treatment is conducted to form an embedded insulating layer at the predetermined depth from the surface, thereby forming a single crystalline layer on the embedded insulating layer. In the Smart-Cut method, hydrogen ions are implanted into an oxided single crystalline silicon substrate to form a hydrogen-containing layer in a portion corresponding to a desired depth, the oxided single crystalline silicon substrate is attached to a supporting substrate (such as a single crystalline silicon substrate having a silicon oxide film for attachment on its surface), and heat treatment is conducted. Accordingly, the single crystalline silicon substrate is separated at the hydrogen-containing layer, and stack layers of the silicon oxide film and the single crystalline silicon layer is formed on the supporting substrate.

The crystalline semiconductor layer may be formed by various methods such as a laser crystallization method, a thermal crystallization method, a thermal crystallization method using an element that promotes crystallization such as nickel, or the like. A microcrystalline semiconductor can be crystallized by laser irradiation, whereby crystallinity thereof can be enhanced. When the element that promotes crystallization is not added, before an amorphous semiconductor layer is irradiated with a laser beam, hydrogen contained in the amorphous semiconductor layer is discharged until the concentration of hydrogen becomes $1 \times 10^{20}$ atoms/cm$^3$ or less by heating the amorphous semiconductor layer at a temperature of 500° C. for one hour in a nitrogen atmosphere. This is because the amorphous semiconductor layer containing much hydrogen is damaged when irradiated with a laser beam. The thermal treatment for crystallization can be performed using a heating furnace, laser irradiation, irradiation with light emitted from a lamp (also referred to as lamp annealing), or the like. Examples of a heating method include an RTA method such as a GRTA (gas rapid thermal annealing) method or an LRTA (lamp rapid thermal annealing) method. GRTA is a method of thermal treatment using a high-temperature gas, and LRTA is a method of thermal treatment using light from a lamp.

The crystallization may be performed by adding an element that promotes crystallization (also referred to as a catalyst element or a metal element) to an amorphous semiconductor layer and applying thermal treatment (at 550 to 750° C. for 3 minutes to 24 hours) thereto in a crystallization step in which an amorphous semiconductor layer is crystallized to form a crystalline semiconductor layer Examples of the element that promotes crystallization include one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

Any method can be used to add a metal element into the amorphous semiconductor layer as long as the method is capable of making the metal element exist on the surface or at the inside of the amorphous semiconductor layer. For example, a sputtering method, a CVD method, a plasma treatment method (including a plasma CVD method), an adsorption method, or a method of applying a metal salt solution can be employed. Among them, the method using a solution is simple and easy, and advantageous in easy adjustment of the concentration of the metal element. It is preferable to form an oxide film on the surface of the amorphous semiconductor layer by UV irradiation in an oxygen atmosphere, a thermal oxidation method, treatment with ozone water or hydrogen peroxide including a hydroxyl radical, or the like so that the wettability of the surface of the amorphous semiconductor layer is improved and an aqueous solution is easily spread over the entire surface of the amorphous semiconductor layer.

In order to remove the element that promotes crystallization from the crystalline semiconductor layer or reduce the element, a semiconductor layer containing an impurity element is formed in contact with the crystalline semiconductor layer. Such a semiconductor layer containing an impurity element functions as a gettering sink. The impurity element may be an impurity element imparting n-type conductivity, an impurity element imparting p-type conductivity, a rare gas element, or the like. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing the element that promotes crystallization, and thermal treatment (at 550 to 750° C. for 3 minutes to 24 hours) is performed. The element that promotes crystallization in the crystalline semiconductor layer moves into the semiconductor layer containing a rare gas element; thus, the element that promotes crystallization in the crystalline semiconductor layer is removed or reduced. After that, the semiconductor layer containing a rare gas element, which serves as a gettering sink, is removed.

Laser irradiation can be performed by relatively moving a laser beam and the semiconductor layer. For laser irradiation, a marker can be formed in order to overlap a beam with high accuracy or control the start position or the end position of laser irradiation. Such a marker may be formed over the substrate at the same time as the formation of the amorphous semiconductor layer.

In the case of using laser irradiation, a continuous-wave laser beam (a CW laser beam) or a pulsed laser beam can be used. Laser beams that can be used here are beams emitted from one or more kinds of the following lasers: a gas laser such as an Ar laser, a Kr laser, or an excimer laser; a laser using, as a medium, single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta is added as a dopant; a glass laser; a ruby laser; an alexandrite laser; a Ti:sapphire laser; a copper vapor laser; and a gold vapor laser. Crystals having a large grain diameter can be obtained by irradiation with the fundamental wave of the above laser beam or the second harmonic to the fourth harmonic of the fundamental wave thereof. For example, the second harmonic (532 nm) or the third harmonic (355 nm) of a Nd:YVO$_4$ laser (the fundamental wave: 1064 nm) can be used. This laser can emit either a CW laser beam or a pulsed laser beam. In the case where a CW laser beam is emitted, the power density of the laser needs to be about 0.01 to 100 MW/cm$^2$ (preferably, 0.1 to 10 MW/cm$^2$. The scanning rate is set to about 10 to 2000 cm/sec for irradiation.

Note that the laser using, as a medium, single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta is added as a dopant; an Ar ion laser; or a Ti:sapphire laser can perform continuous oscillation. In addition, it can also perform pulsed oscillation at a repetition rate of 10 MHz or more by performing Q-switching operation, mode locking, or the like. A pulsed laser, which can emit a laser beam with a pulse width in a range of picoseconds or in a range of femtoseconds ($10^{-15}$ seconds), may be used. When a laser beam is pulsed at a repetition rate of 10 MHz or more, it is possible for a semiconductor layer to be irradiated with the next pulse after it is melted by the previous laser beam and before it becomes solidified. Therefore, unlike the case of using a pulsed laser with a low repetition rate, a solid-liquid interface of the semiconductor layer can be moved continuously. Thus, crystal grains that have grown continuously in the scanning direction can be obtained.

When ceramic (polycrystal) is used as a medium, the medium can be formed into a desired shape in a short time at low cost. In the case of using single crystals, a columnar medium having a diameter of several millimeters and a length of several tens of millimeters is generally used. However, in the case of using ceramic, a medium larger than that can be formed.

The concentration of the dopant such as Nd or Yb in the medium, which directly contributes to light emission, cannot be changed to a large degree either in single crystals or polycrystals. Therefore, there is a limitation on improvement of the laser output by increasing the concentration of the dopant. However, in the case of using ceramic, a laser output can be drastically increased because the size of the medium can be significantly increased compared with the case of using single crystals.

Further, in the case of using ceramic, a medium with a parallelepiped shape or a rectangular parallelepiped shape can be formed easily. When a medium with such a shape is used and oscillated light is made to travel inside the medium in a zigzag manner, a long oscillation path can be obtained. Therefore, large amplification can be achieved and high output can be obtained. In addition, since a laser beam emitted from the medium with such a shape has a quadrangular cross section at the time of emission, it can easily be shaped into a linear beam compared with the case of using a circular beam, which is advantageous. When the laser beam emitted in this manner is shaped with an optic system, a linear beam with a short side of one millimeter or less and a long side of several millimeters to several meters can be easily obtained. In addition, when the medium is uniformly irradiated with excitation light, a linear beam with a uniform energy distribution in the long-side direction can be obtained. Moreover, the semiconductor layer is preferably irradiated with the laser beam at an incident angle θ ($0°<θ<90°$) in order to prevent laser interference.

When the semiconductor layer is irradiated with the linear beam, the entire surface of the semiconductor layer can be annealed more uniformly. In the case where uniform annealing is required from one end to the other end of the linear laser beam, it is necessary to exercise ingenuity, for example, by providing slits or the like at both ends so as to shield light at a portion where energy is attenuated.

The laser beam irradiation may be performed in an inert gas atmosphere such as in a rare gas or nitrogen. Accordingly, surface roughness of the semiconductor layer due to laser beam irradiation can be suppressed, and variation of threshold voltage caused by variation of the interface state density can be suppressed.

The amorphous semiconductor layer may be crystallized by a combination of thermal treatment and laser beam irradiation, or plural times of either thermal treatment or laser irradiation.

Figure 2A:
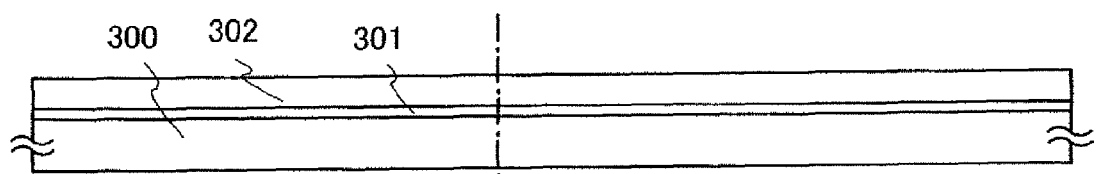
FIGS. 2A to 2E show a manufacturing method of a semiconductor device according to the present invention.

In this embodiment mode, an amorphous semiconductor film is formed over the insulating layer 301, and the amorphous semiconductor film is crystallized by laser beam irradiation; accordingly, a semiconductor film 302 that is a crystalline semiconductor film is formed (FIG. 2A).

The semiconductor film obtained as described above is selectively doped with a slight amount of impurity elements (boron or phosphorus) for controlling threshold voltage of a thin film transistor. This doping of the impurity elements may also be performed to the amorphous semiconductor film, before the crystallization step. When the semiconductor film in an amorphous state is doped with the impurity elements, the impurity elements can also be activated by subsequent heat treatment for crystallization. Further, defects and the like generated in doping can be improved as well.

Figure 2B:
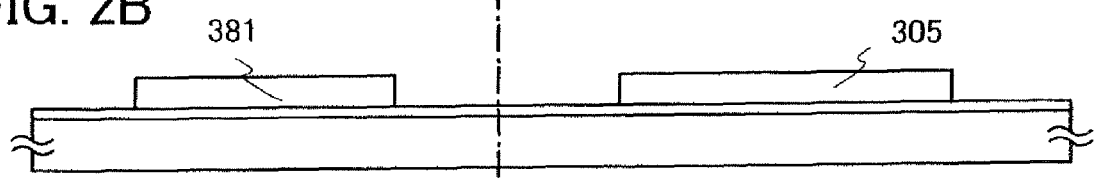

The semiconductor film 302 is processed into a desired shape by using a mask. In this embodiment mode, after removing an oxide film formed over the semiconductor film 302, an oxide film is newly formed. Then, a photomask is formed and process treatment using a photolithography technique is conducted, so that a semiconductor layer 381 and the semiconductor layer 305 are formed (FIG. 2B).

Figure 2C:
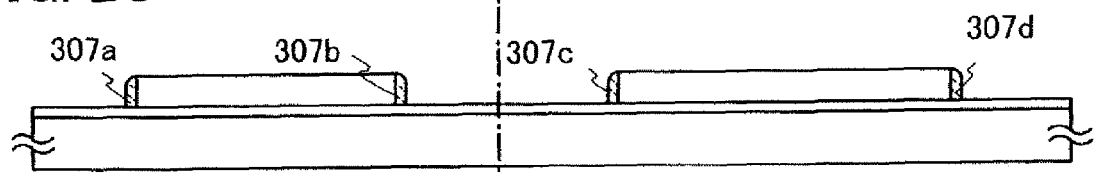

The insulating layers 307*a* to 307*d* that are in contact with side surfaces of the semiconductor layers 381 and 305 are formed (FIG. 2C). By forming the insulating layers 307*a* to 307*d* that are in contact with the side surfaces of the semiconductor layers 381 and 305, coverage with gate insulating layers at end portions of the semiconductor layers 381 and 305 can be improved. Therefore, defects caused by insufficient coverage with the gate insulating layers at the end portions of the semiconductor layers 381 and 305, such as short circuit between the semiconductor layer and the gate electrode layer, generation of leak current, and electrostatic breakdown, can be prevented. After formation of the semiconductor layers 381 and 305, the insulating layers 307a to 307d can be formed in a self-aligning manner by stacking a silicon oxide film or a silicon nitride film and conducting anisotropic etching.

In this specification, an "end portion" of a semiconductor layer indicates an edge portion of an island-shaped semiconductor layer, and a "side surface" of a semiconductor layer indicates a face of an edge portion of the semiconductor layer.

Figure 2D:
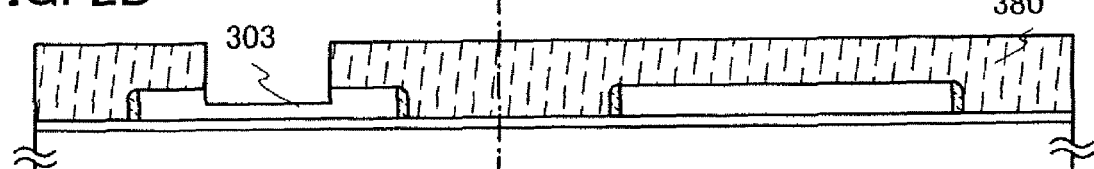

A mask 380, which selectively covers part of the semiconductor layer 381, the semiconductor layer 305, and the insulating layers 307a to 307d, is formed. The mask 380 covers regions of the semiconductor layers which are not thinned in a later step. The semiconductor layer 381 is locally etched to be thin using the mask 380, so that the semiconductor layer 303 is formed. Thus, the semiconductor layer 303 that includes a channel formation region having a smaller thickness than the semiconductor layer 305 is formed (FIG. 2D). After etching, the semiconductor layer 303 formed has a depressed portion, and the depressed portion is the thinned region.

Figure 15A:
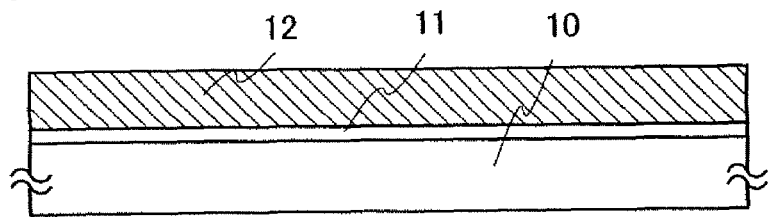
FIGS. 15A to 15D show a manufacturing method of a semiconductor device according to the present invention.
Figure 15B:
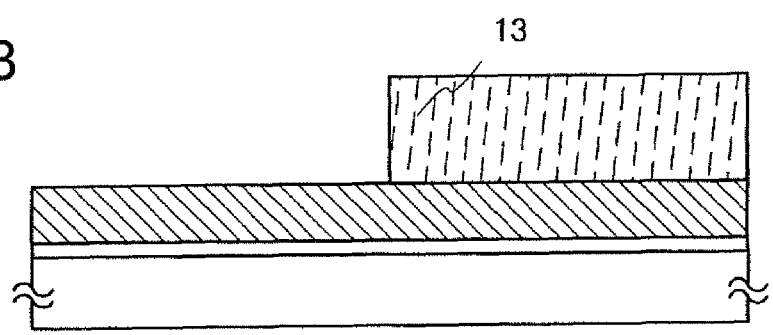
Figure 15C:
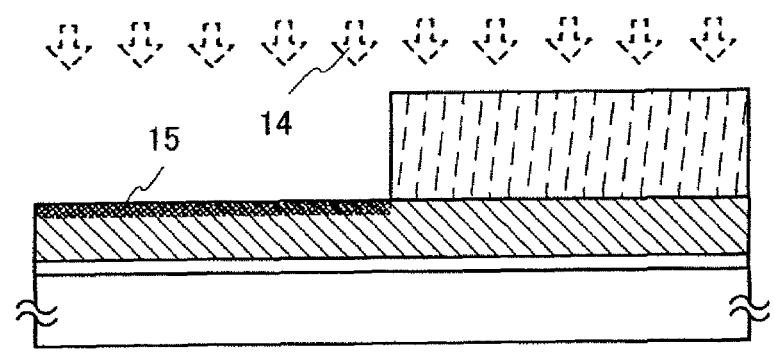
Figure 15D:
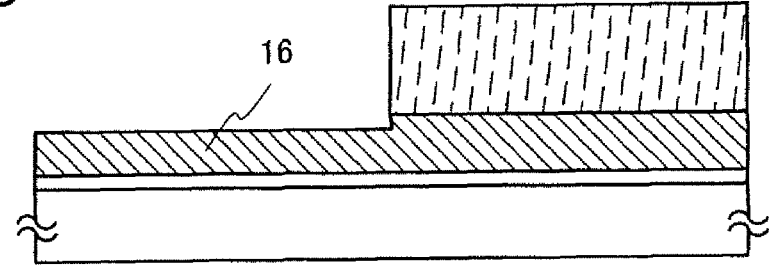

The semiconductor layer may be thinned by a one-time etching step or a plurality of etching steps. The semiconductor layer may be etched directly with an etching gas (or an etching solution). Alternatively, part of a surface of the semiconductor layer may be processed to be modified, and only the modified region may be selectively removed. An example of thinning a semiconductor layer in a plurality of steps is shown in FIGS. 15A to 15D. In FIG. 15A, a base film 11 is provided over a substrate 10, and a semiconductor layer 12 is formed thereover. A mask 13 is selectively formed over the semiconductor layer 12 (FIG. 15B). The semiconductor layer 12 is selectively modified (oxidized, in this embodiment mode) by plasma treatment 14, so that a modified (oxidized, in this embodiment mode) region 15 is formed (FIG. 15C). The modified region 15 is removed under an etching condition (an etching gas, an etching solution) such that only the modified region 15 can be removed without etching of the semiconductor layer 12, to form a semiconductor layer 16 that is partially thinned (FIG. 15D). The process shown in FIGS. 15C and 15D is repeated, so that the semiconductor layer can be thinned to a desired thickness.

As an etching processing, either plasma etching (dry etching) or wet etching may be employed. In the case where a large-area substrate is processed, plasma etching is suitable. As an etching gas, a fluorine-based gas such as $CF_4$ or $NF_3$, or a chlorine-based gas such as $Cl_2$ or $BCl_3$ is used, to which an inert gas such as He or Ar may be appropriately added. When an etching processing by atmospheric pressure discharge is employed, local electric discharge can also be realized, which does not require a mask to be formed over the entire surface of the substrate.

In the present invention, a conductive layer for forming a wiring layer or an electrode layer, a mask for forming a predetermined pattern, or the like may be formed by a method capable of selectively forming a pattern, such as a droplet discharge method. In the droplet discharge (jet) method (also referred to as an ink-jet method depending on the system), a droplet of a composition prepared for a specific purpose can be selectively discharged (jetted), and a predetermined pattern (a conductive layer, an insulating layer, or the like) can be formed. At that time, treatment for controlling wettability or adhesiveness may be performed on a formation region. Alternatively, a method by which a pattern can be transferred or drawn, for example, a printing method (a method for forming a pattern, such as screen printing or offset printing), or the like can also be used.

In this embodiment mode, a resin material such as an epoxy resin, an acrylic resin, a phenol resin, a novolac resin, a melamine resin, or a urethane resin is used as a mask. Alternatively, an organic material such as benzocyclobutene, parylene, fluorinated arylene ether, or polyimide having a light-transmitting property; a compound material formed by polymerization of siloxane-based polymers or the like; a composition material containing a water-soluble homopolymer and a water-soluble copolymer; or the like can also be used. Further alternatively, a commercially available resist material including a photosensitive agent may also be used, and for example, positive type resists or negative type resists may be used. When a droplet discharge method is used with any material, the surface tension and the viscosity of a material are appropriately adjusted by adjusting the concentration of a solvent, adding a surfactant or the like, or the like.

The thickness of the channel formation region of the semiconductor layer 303 is smaller than that of the channel formation region of the semiconductor layer 305, and may be equal to or greater than 5 nm and equal to or less than 30 nm, more preferably equal to or greater than 10 nm and equal to or less than 20 nm. On the other hand, the thicknesses of the source region and the drain region of the semiconductor layer 303, and the semiconductor layer 305 including the source region, the drain region, and the channel formation region are larger than that of the channel formation region of the semiconductor layer 303, and are each equal to or greater than 25 nm and equal to or less than 100 nm, and more preferably equal to or greater than 50 nm and equal to or less than 60 nm.

In this embodiment mode, one feature is that the channel formation region of the semiconductor layer included in the thin film transistor, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with the source electrode layer and the drain electrode layer respectively, are not thinned (the thickness is preferably equal to or greater than 25 nm and equal to or less than 100 nm, and more preferably equal to or greater than 50 nm and equal to or less than 60 nm). Therefore, part of the source region and the drain region; low concentration impurity regions which can be provided between the channel formation region, and the source region and the drain region; or the like, other than the channel formation region, in the semiconductor layer may be thinned.

Thinning of the semiconductor layer can suppress the short-channel effect. Moreover, the threshold voltage of the transistor can become lower, which enables low voltage driving. The end portion of the semiconductor layer is formed to have a slant angle (taper angle). The angle is preferably equal to or more than 45° and equal to or less than 95°. In order to avoid influence by formation of a parasitic transistor whose characteristics are different from those of a center part of the semiconductor layer in this region, it is preferable that the slant angle be close to a right angle.

Figure 2E:
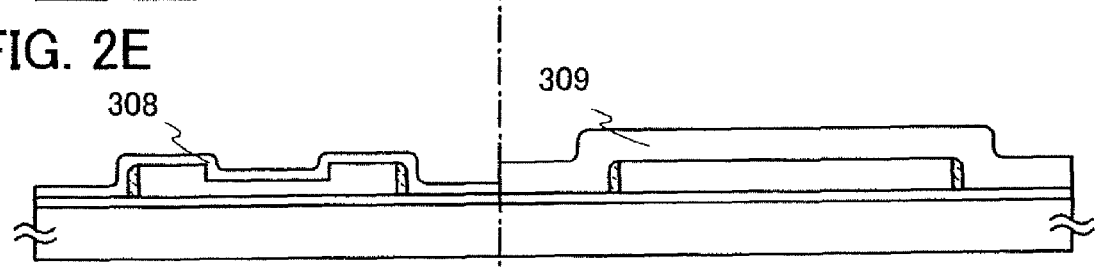

The oxide film over the semiconductor layer is removed, and then the gate insulating layer 308, which covers the semiconductor layer 303 and the insulating layers 307a and 307b, and the gate insulating layer 309, which covers the semiconductor layer 305 and the insulating layers 307c and 307d, are formed (FIG. 2E). The gate insulating layer 308 and the gate insulating layer 309 each having a different thickness are formed in the following manner: an insulating film is formed by a plasma CVD method, a sputtering method, or the like and selectively etched to be thinned. Thinning of the gate insulating layer 308 has an effect of driving the thin film transistor at high speed and low voltage. When the gate insulating layer 309 is thick, the thin film transistor can have high resistance to high voltage; accordingly reliability can be heightened.

The gate insulating layers 308 and 309 may be formed using silicon oxide or a stacked structure of silicon oxide and silicon nitride. The gate insulating layers 308 and 309 may be formed by stacking an insulating film by a plasma CVD method or a low-pressure CVD method, or may be formed by solid-phase oxidation or solid-phase nitridation using plasma treatment. This is because a gate insulating layer formed by oxidizing or nitriding a semiconductor layer by plasma treatment is dense, has high withstand voltage, and is highly reliable.

In the solid-phase oxidation treatment or solid-phase nitridation treatment by the plasma treatment, plasma, which is excited by microwaves (typically, 2.45 GHz) and has an electron density of greater than or equal to $1 \times 10^{11}$ cm$^{-3}$ and less than or equal to $1 \times 10^{13}$ cm$^{-3}$ and an electron temperature of greater than or equal to 0.5 eV and less than or equal to 1.5 eV, is preferably used. This condition is employed to form a dense insulating film and obtain a practical reaction speed in the solid-phase oxidation treatment or solid-phase nitridation treatment at a temperature of 500° C. or less.

When the surface of the semiconductor layer is oxidized by this plasma treatment, the plasma treatment is performed under an oxygen atmosphere (for example, an atmosphere containing oxygen ($O_2$) or dinitrogen monoxide ($N_2O$), and a rare gas (containing at least one of He, Ne, Ar, Kr, and Xe), or an atmosphere containing oxygen or dinitrogen monoxide, hydrogen ($H_2$), and a rare gas). Further, when the surface of the semiconductor layer is nitrided by the plasma treatment, the plasma treatment is performed under a nitrogen atmosphere (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a gas in which Ar and Kr are mixed may also be used.

It is to be noted that the plasma treatment includes oxidation treatment, nitridation treatment, oxynitridation treatment, hydrogenation treatment, and surface modification treatment performed to a semiconductor layer, an insulating layer, and a conductive layer. For these treatment, a supplied gas may be selected in accordance with an intended purpose.

Oxidation treatment or nitridation treatment may be performed to the semiconductor layer as follows. First, a processing chamber is evacuated and a gas containing oxygen or nitrogen for plasma treatment is introduced from a gas supply portion. The substrate is heated at room temperature or at temperatures of 100 to 550° C. by a temperature control portion.

Next, microwaves are supplied from a microwave supply portion to an antenna. Then, the microwaves are introduced from the antenna into the processing chamber through a dielectric plate; thus, plasma is generated. When the plasma is excited by the introduced microwaves, plasma which has a low electron temperature (less than or equal to 3 eV, preferably less than or equal to 1.5 eV) and a high electron density ($1 \times 10^{11}$ cm$^{-3}$ or more) can be generated. With oxygen radicals (containing OH radicals in some cases) and/or nitrogen radicals (containing NH radicals in some cases) generated by this high-density plasma, the surface of the semiconductor layer can be oxidized or nitrided. A plasma treatment gas mixed with a rare gas such as argon enables oxygen radicals or nitrogen radicals to be generated efficiently due to excited species of a rare gas. In this method, through the effective use of active radicals excited by plasma, oxidation or nitridation treatment, or concurrent treatment of oxygen and nitridation by a solid-phase reaction can be performed at low temperatures of less than or equal to 500° C.

As one preferable example of the gate insulating layer formed by the plasma treatment, there is a layer having a stacked structure, which is formed in the following manner: a silicon oxide layer with a thickness of 3 nm to 6 nm is formed by conducting plasma treatment to a semiconductor layer under an oxygen atmosphere, and a silicon nitride layer is formed by nitriding the surface of the silicon oxide layer in a nitrogen atmosphere after formation of the silicon oxide layer. The surface of the silicon layer, which is a typical example of a semiconductor layer, is oxidized by plasma treatment, whereby a dense oxide film without distortions at the interface can be formed. Further, when a nitride layer is formed by nitridation of the oxide layer by plasma treatment and replacement of oxygen in a surface portion with nitrogen, the film can be even denser. Accordingly, an insulating layer having high withstand voltage can be formed.

In any case, through the use of solid-phase oxidation treatment or solid-phase nitridation treatment by the plasma treatment as described above, an insulating layer similar to a thermal oxide film, which is formed at 950° C. to 1050° C., can be obtained even with the use of a glass substrate having a temperature limit of less than or equal to 700° C. In other words, a film having high reliability can be formed as a gate insulating layer of a transistor.

As the gate insulating layers 308 and 309, a high dielectric constant material may be used. When a high dielectric constant material is used for the gate insulating layers 308 and 309, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

As a method for forming a thin silicon oxide film, the surface of the semiconductor region can be oxidized by a GRTA method, an LRTA method, or the like to form a thermal oxide film, thereby forming a thin silicon oxide film. Note that a rare gas element such as argon is preferably contained in a reaction gas and mixed into an insulating film to be formed, in order to form a dense insulating film having little gate leak current at a low film formation temperature.

Then, a first conductive film having a thickness of 20 to 100 nm and a second conductive film having a thickness of 100 to 400 nm, each of which serves as a gate electrode layer, are stacked over the gate insulating layers 308 and 309. The first conductive film and the second conductive film can be formed by a method such as a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or compound material containing the element as its main component. A semiconductor film typified by a polycrystalline silicon film doped with an impurity element such as phosphorus, or an AgPdCu alloy may also be used as the first conductive film and the second conductive film. The conductive film is not limited to the two-layer structure, and for example, may have a three-layer structure where a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film are sequentially stacked. In a case of the three-layer structure, tungsten nitride may be used instead of tungsten for the first conductive film; an aluminum-titanium alloy (Al—Ti) film may be used instead of an aluminum-silicon (Al—Si) alloy film for the second conductive film; or a titanium film may be used instead of a titanium nitride film for the third conductive film as well. Moreover, a single-layer structure may also be used. In this embodiment mode, a tantalum nitride film with a thickness of 30 nm is formed as the first conductive film and tungsten (W) with a thickness of 370 nm is formed as the second conductive film.

Figure 3A:
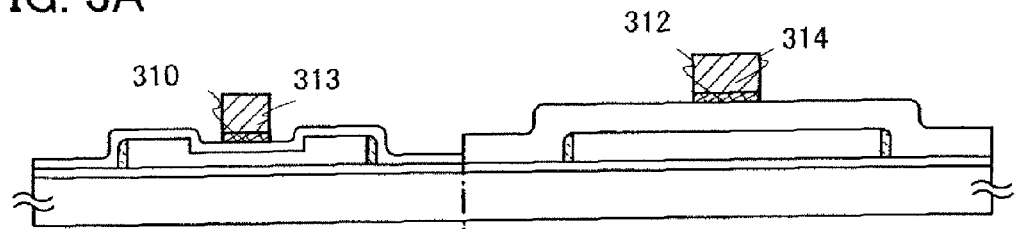
FIGS. 3A to 3D show a manufacturing method of a semiconductor device according to the present invention.

Next, a mask is formed of a resist by a photolithography method, and the first conductive film and the second conductive film are processed into a desired shape to form a first gate electrode layer 310, a first gate electrode layer 312, a second gate electrode layer 313, and a second gate electrode layer 314 (FIG. 3A). The first gate electrode layers and the second gate electrode layers can be etched to have a desired taper shape by appropriately adjusting an etching condition (the electric power applied to a coil-shaped electrode layer, the electric power applied to an electrode layer on the substrate side, an electrode temperature on the substrate side, and the like) by an ICP (inductively coupled plasma) etching method. In addition, an angle and the like of the taper shape can also be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used.

In this embodiment mode, each of the first gate electrode layers and the second gate electrode layers is formed to have a perpendicular side surface; however, the present invention is not limited to this. Both the first gate electrode layers and the second gate electrode layers may have a taper shape. Alternatively, only one of the first gate electrode layers and the second gate electrode layers may have a taper shape while the other may have a perpendicular side surface by anisotropic etching. The taper angles may be different or the same between the stacked gate electrode layers. With a taper shape, coverage by a film to be stacked thereover is improved and a defect is reduced; thus, reliability is enhanced.

The gate insulating layers 308 and 309 may be etched to some extent and thinned (so-called film reduction) by the etching step in forming the gate electrode layers.

In this embodiment mode, for high speed operation of the thin film transistor, the gate electrode layers (the first gate electrode layer 310 and the second gate electrode layer 313) are each formed to have a small width in a channel direction.

Two methods for forming a gate electrode layer having a small width in a channel direction will be shown below.

A first method is to form a mask for a gate electrode layer and then narrow the mask in a width direction by etching, ashing, or the like to form a mask with a narrower width. By using the mask formed in a shape having a narrow width in advance, the gate electrode layer can also be formed in a shape having a narrow width.

A second method is to form a normal mask and then form a gate electrode layer using the mask. Then, the obtained gate electrode layer is narrowed in a width direction by conducting side etching. Thus, a gate electrode layer with a narrower width can be finally formed. Through the above steps, a thin film transistor with a short channel length can be formed, which can realize a thin film transistor capable of high speed operation.

Figure 3B:
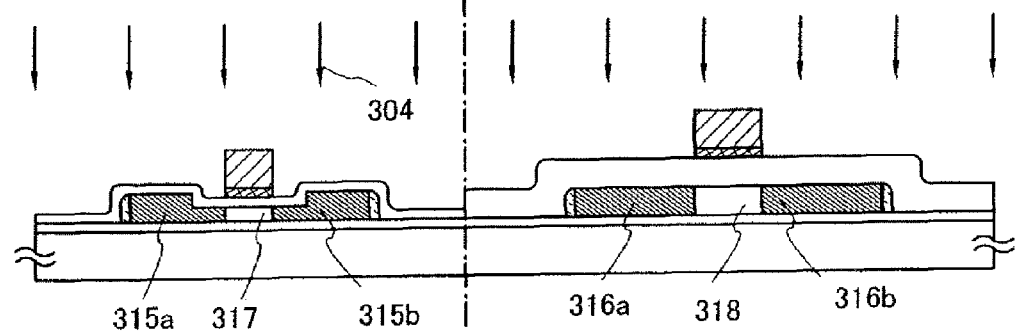

Next, an impurity element 304 imparting one conductivity type is added using the first gate electrode layer 310, the first gate electrode layer 312, the second gate electrode layer 313, and the second gate electrode layer 314 as masks, so that the impurity regions 315a, 315b, 316a, and 316b which have one conductivity type and are source regions and drain regions, are formed. In the semiconductor layers 303 and 305, the channel formation regions 317 and 318 are formed (FIG. 3B). The impurity element imparting one conductivity type may be an n-type impurity element (e.g., phosphorus (P), arsenic (As), or the like) or a p-type impurity element (e.g., boron (B), aluminum (Al), gallium (Ga), or the like). In this embodiment mode, phosphorus (P), which is an n-type impurity element, is used as the impurity element imparting one conductivity type. In this embodiment mode, phosphine ($PH_3$) is used as a doping gas containing an impurity element. Here, the impurity element imparting one conductivity type is added so as to be contained at concentrations of about $5\times10^{19}$ to $5\times10^{20}$ atoms/cm$^3$ in the impurity regions 315a, 315b, 316a, and 316b having one conductivity type, which are source regions and drain regions.

In this embodiment mode, a region of an impurity region, which overlaps with a gate electrode layer with a gate insulating layer interposed therebetween, is referred to as a "Lov region", and a region of an impurity region, which does not overlap with a gate electrode layer with a gate insulating layer interposed therebetween, is referred to as a "Loff region".

The impurity regions having one conductivity type 315a, 315b, 316a, and 316b function as source regions and drain regions.

Thermal treatment, intense light irradiation, or laser irradiation may be performed to activate the impurity element. Accordingly, at the same time as the activation, plasma damage to the gate insulating layer or the interface between the gate insulating layer and the semiconductor layer can be recovered.

Figure 3C:
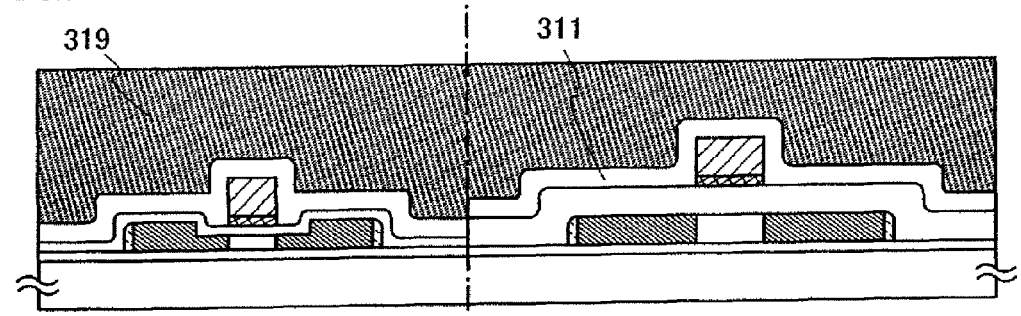

Then, an interlayer insulating layer is formed to cover the gate electrode layers and the gate insulating layers. In this embodiment mode, the interlayer insulating layer has a stacked structure of an insulating film 311 containing hydrogen and an insulating layer 319 (FIG. 3C). The insulating film 311 and the insulting layer 319 can be formed by depositing a silicon nitride film, a silicon nitride oxide film, a silicon oxynitride film, a silicon oxide film, or the like by a sputtering method or a plasma CVD method. Alternatively, a single layer or a stacked structure of three or more layers, which include another insulating film containing silicon, may also be used.

Further, thermal treatment is performed in a nitrogen atmosphere at 300 to 550° C. for 1 to 12 hours to hydrogenate the semiconductor layers. Preferably, it is performed at 400 to 500° C. This step is a step of terminating dangling bonds of the semiconductor layers with hydrogen contained in the insulating film 311 that is the interlayer insulating layer. In this embodiment mode, thermal treatment is performed at 410° C. for one hour.

The insulating film 311 and the insulating layer 319 can also be formed using a material selected from inorganic insulating substances, such as aluminum nitride (AlN), aluminum oxynitride (AlON), aluminum nitride oxide (AlNO) containing more nitrogen than oxygen, aluminum oxide, diamond-like carbon (DLC), a nitrogen-containing carbon (CN) film, and the like. Alternatively, a siloxane resin may be used. An organic insulating material may also be used. Examples of the organic material include polyimide, acrylic, polyamide, polyimide amide, resist, benzocyclobutene, and polysilazane. A coating film with a favorable planarity formed by a coating method may also be used.

The insulating film 311 and the insulating layer 319 can be formed using dipping, spray coating, a doctor knife, a roll coater, a curtain coater, a knife coater, a CVD method, an evaporation method, or the like. The insulating film 311 and the insulating layer 319 may also be formed by a droplet discharge method. In a case of using a droplet discharge method, a material solution can be saved. In addition, a method by which a pattern can be transferred or drawn similarly to a droplet discharge method such as, for example, a printing method (a method for forming a pattern, such as screen printing or offset printing) can also be used.

Then, contact holes (openings) which reach the semiconductor layers are formed in the insulating film 311 and the insulating layer 319 using a mask made of resist. Etching may be performed once or plural times in accordance with a selection ratio of a material to be used. The insulating film 311 and the insulating layer 319 are removed by etching to form the openings reaching the impurity regions 315a, 315b, 316a, and 316b which have one conductivity type and are source regions and drain regions. Etching may be performed by wet etching, dry etching, or both of them. As an etchant of wet etching, a hydrofluoric acid-based solution such as a mixed solution of ammonium hydrogen fluoride and ammonium fluoride may be used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas to be used. As an inert element to be added, one or more of elements selected from He, Ne, Ar, Kr, or Xe can be used.

A conductive film is formed so as to cover the openings, and the conductive film is etched to form wiring layers 320a, 320b, 321a, and 321b, which are electrically connected to portions of respective source regions and drain regions and function as source electrode layers and drain electrode layers. The wiring layers can be formed by forming the conductive film by a PVD method, a CVD method, an evaporation method, or the like, and then, etching the conductive film into a desired shape. Alternatively, a conductive layer can be selectively formed in a predetermined position by a droplet discharge method, a printing method, an electroplating method, or the like. Moreover, a reflow method or a damascene method may also be used. As a material for the wiring layers, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked structure of these materials may also be employed. In this embodiment mode, titanium (Ti) is formed to be 60 nm thick, a titanium nitride film is formed to be 40 nm thick, aluminum is formed to be 700 nm thick, and titanium (Ti) is formed to be 200 nm thick so that a stacked structure is formed. Then, the stacked structure is processed into a desired shape.

In this embodiment mode, only the channel formation region 317 is locally thinned in the thin film transistor 322 capable of high speed operation. Therefore, regions that are in contact with the wiring layers 320a and 320b, which are a source electrode layer and a drain electrode layer, in the impurity regions 315a and 315b, which are a source region and a drain region, are not thinned and thicker than the channel formation region 317. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

Figure 3D:
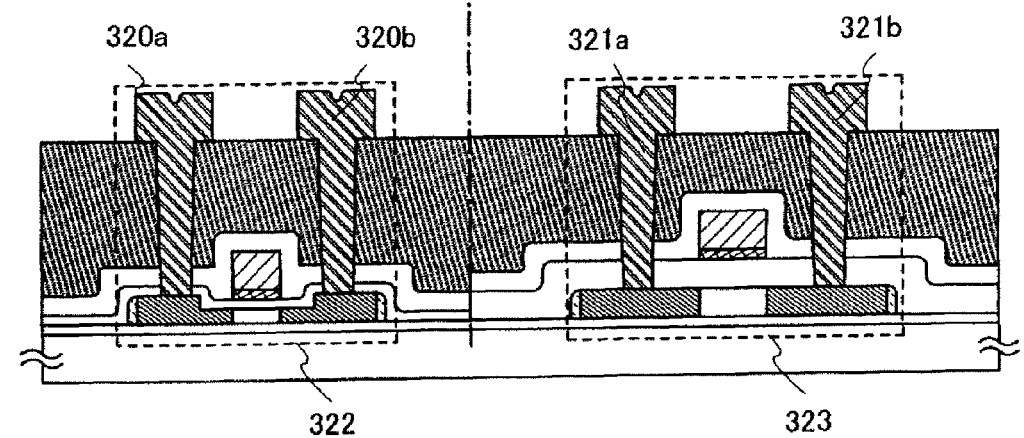

Through the above-described process, a semiconductor device including the thin film transistor 322 capable of high speed operation, in which the channel formation region of the semiconductor layer is locally thinned, and the thin film transistor 323 having high withstand voltage to high voltage, in which the semiconductor layer is not thinned, can be manufactured (FIG. 3D).

Thus, by using the present invention, a semiconductor device with low power consumption and high reliability can be provided.

EMBODIMENT MODE 2

Embodiment Mode 2 will describe another semiconductor device with low power consumption and high reliability, and a manufacturing method thereof, with reference to FIGS. 4A to 4E. In this embodiment mode, an example of providing insulating layers having a sidewall structure on side surfaces of the gate electrode layers of the thin film transistors in the semiconductor device manufactured in Embodiment Mode 1 will be described. Therefore, repeated description for the same portion or a portion having a similar function to that in Embodiment Mode 1 is omitted.

Figure 4A:
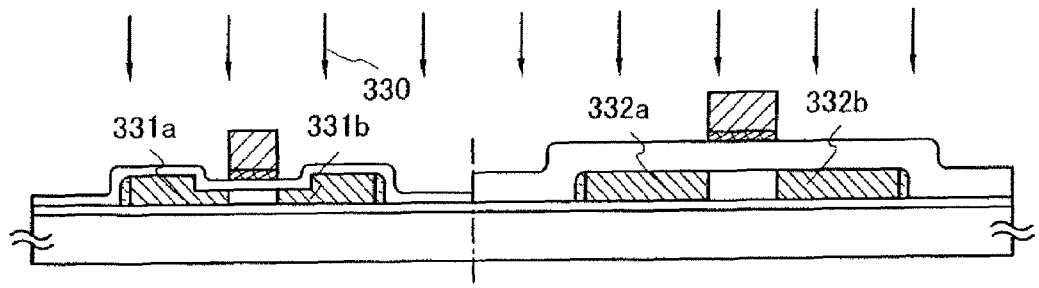
FIGS. 4A to 4E show a manufacturing method of a semiconductor device according to the present invention.

FIG. 4A shows a semiconductor device in a manufacturing process and shows a step next to the manufacturing step of the semiconductor device shown in FIG. 3A of Embodiment Mode 1. In FIGS. 4A to 4E, thin film transistors with different characteristics are selectively formed over the same substrate.

Next, an impurity element 330 imparting one conductivity type is added using the first gate electrode layer 310, the first gate electrode layer 312, the second gate electrode layer 313, and the second gate electrode layer 314 as masks, so that first impurity regions 331a, 331b, 332a, and 332b having one conductivity type are formed (FIG. 4A). The impurity element imparting one conductivity type may be an n-type impurity element (e.g., phosphorus (P), arsenic (As), or the like) or a p-type impurity element (e.g., boron (B), aluminum (Al), gallium (Ga), or the like). In this embodiment mode, phosphorus (P), which is an n-type impurity element, is used as the impurity element imparting one conductivity type. In this embodiment mode, phosphine ($PH_3$) is used as a doping gas containing an impurity element. Here, the impurity element imparting one conductivity type is added so as to be contained at concentrations of about $1\times10^{17}$ to $5\times10^{18}$ atoms/cm$^3$ in the impurity regions 331a, 331b, 332a, and 332b having one conductivity type.

Figure 4B:
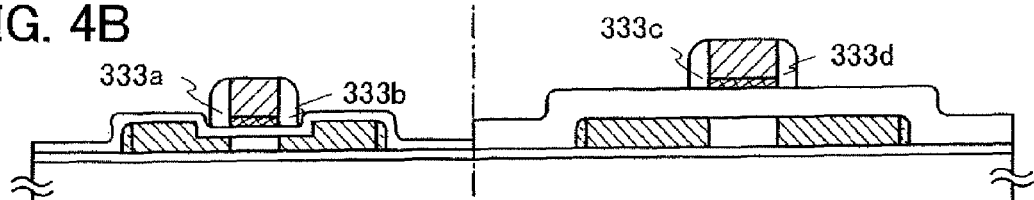

Insulating layers 333a to 333d with a sidewall structure are formed on side surfaces of the first gate electrode layer 310, the first gate electrode layer 312, the second gate electrode layer 313, and the second gate electrode layer 314 (FIG. 4B). The insulating layers 333a to 333d with a sidewall structure may be formed on the side surfaces of the first gate electrode layer 310, the first gate electrode layer 312, the second gate electrode layer 313, and the second gate electrode layer 314 in a self-aligning manner, in the following manner: an insulating layer covering the gate insulating layers 308 and 309, the first gate electrode layer 310, the first gate electrode layer 312, the second gate electrode layer 313, and the second gate electrode layer 314 is formed; and the insulating layer is processed by anisotropic etching using a RIE (reactive ion etching) method. Here, the insulating layers are not particularly limited and are preferably a layer of silicon oxide with favorable step coverage, which is formed by reacting TEOS (tetra-ethyl-ortho-silicate), silane, or the like with oxygen, nitrous oxide, or the like. The insulating layers can be formed by a thermal CVD method, a plasma CVD method, a normal-pressure CVD method, a bias ECRCVD method, a sputtering method, or the like.

In this embodiment mode, in etching the insulating layer, portions of the insulating layer over the second gate electrode layers are removed to expose the second gate electrode layers.

However, the insulating layers 333a to 333d may be formed to have a shape in which portions of the insulating layer over the second gate electrode layers remain. In this embodiment mode, an insulating film 341 is formed over the second gate electrode layers as a protective film in a later step. By protecting the second gate electrode layers in this manner, film reduction of the second gate electrode layers can be prevented in an etching process. In the case of forming silicide in a source region or a drain region, since a metal film formed in formation of the silicide is not contact with the gate electrode layer, even when a material of the metal film can easily react with a material of the gate electrode layer, defects such as chemical reaction and diffusion can be prevented. Various etching methods such as a dry etching method and a wet etching method may be used for etching. In this embodiment mode, a dry etching method is used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used.

Figure 4C:
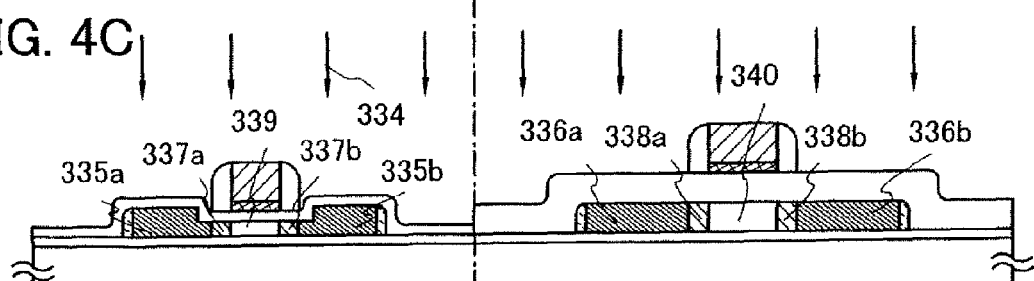

An impurity element 334 imparting one conductivity type is added using the first gate electrode layer 310, the first gate electrode layer 312, the second gate electrode layer 313, the second gate electrode layer 314, and the insulating layers 333a to 333d as masks, so that second impurity regions 335a, 335b, 336a, and 336b having one conductivity type and third impurity regions 337a, 337b, 338a, and 338b having n-type conductivity are formed. In this embodiment mode, phosphorus (P), which is an n-type impurity element, is used as the impurity element 334 imparting one conductivity type. The impurity element imparting one conductivity type is added so as to be contained at concentrations of about $5\times10^{19}$ to $5\times10^{20}$ atoms/cm$^3$ in the second impurity regions 335a, 335b, 336a, and 336b having one conductivity type. In addition, a channel formation region 339 is formed in the semiconductor layer 303, and a channel formation region 340 is formed in the semiconductor layer 305 (FIG. 4C).

The second impurity regions 335a, 335b, 336a, and 336b having one conductivity type are high-concentration impurity regions and function as sources and drains. On the other hand, the third impurity regions 337a, 337b, 338a, and 338b having n-type conductivity are low-concentration impurity regions and also LDD (lightly doped drain) regions. Since the third impurity regions 337a, 337b, 338a, and 338b having n-type conductivity are formed in Loff regions, which are not covered with the first gate electrode layers 310 and 312 and the second gate electrode layers 313 and 314, off current can be reduced. Accordingly, a semiconductor device with higher reliability and lower power consumption can be manufactured.

FIGS. 4A to 4E show an example in which the low-concentration impurity regions functioning as the LDD regions are formed in the locally-thinned region of the semiconductor layer; however, the low-concentration impurity regions may be formed in the region which is not thinned in the semiconductor layer or may be formed across the thinned region and the region which is not thinned.

Figure 4D:
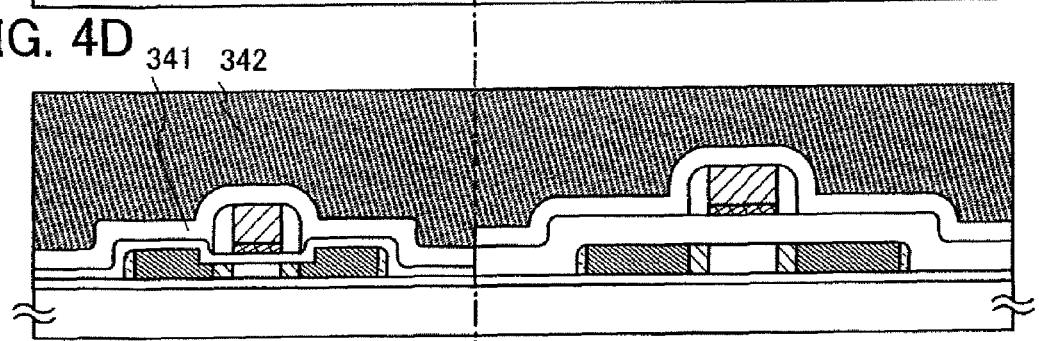

The insulating film 341 is formed over the gate insulating layers 308 and 309, the first gate electrode layers 310 and 312, the second gate electrode layers 313 and 314, and the insulating layers 333a to 333d, and an insulating layer 342 is formed over the insulating film 341 (FIG. 4D). Openings reaching the source regions and the drain regions of the semiconductor layers are formed in the gate insulating layers 308 and 309, the insulating film 341, and the insulating layer 342. Wiring layers 343a, 343b, 344a, and 344b, which are source electrode layers and drain electrode layers, are formed in the openings. The insulating film 341, the insulating layer 342, and the wiring layers 343a, 343b, 344a, and 344b can be formed using materials and a process similar to those of the insulating film 311, the insulating layer 319, and the wiring layers 320a, 320b, 321a, and 321b described in Embodiment Mode 1, respectively.

In this embodiment mode, only the channel formation region 339 is locally thinned in the thin film transistor 345. Therefore, regions that are in contact with the wiring layers 343a and 343b, which are a source electrode layer and a drain electrode layer, in the impurity regions 335a and 335b, which are a source region and a drain region, are not thinned and thicker than the channel formation region. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

Figure 4E:
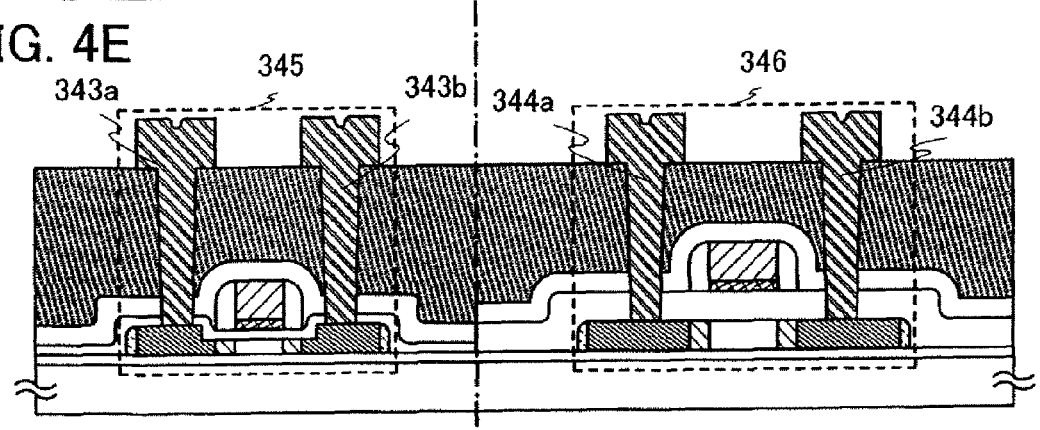

Through the above-described process, a semiconductor device including the thin film transistor 345, in which the low-concentration impurity regions are formed in the Loff regions, and the thin film transistor 346, in which the low-concentration impurity regions are formed in the Loff regions, can be manufactured (FIG. 4E).

The semiconductor device of this embodiment mode that uses the present invention includes the plural kinds of thin film transistors 345 and 346 with different thicknesses of the channel formation regions of the semiconductor layers, over the same substrate 300. The channel formation region 339 of the semiconductor layer 303 included in the thin film transistor 345, for which high speed operation is required, is thinned locally, so that the channel formation region 339 of the semiconductor layer 303 is made thinner than the channel formation region 340 of the semiconductor layer 305 included in the thin film transistor 346, for which high withstand voltage is required. Since only the channel formation region is locally thinned in the thin film transistor 345, for which high speed operation is required, regions of the source region and the drain region, which are in contact with the source electrode layer and the drain electrode layer respectively, are not thinned and thicker than the channel formation region. Further, the gate insulating layer of the thin film transistor 345, for which high speed operation is required, is also preferably thinner than the gate insulating layer of the thin film transistor 346, for which high withstand voltage is required.

In order that the thin film transistors 345 and 346 with different thicknesses of the channel formation regions of the semiconductor layers each fulfill a necessary function in the same circuit, the thin film transistor 345 can be provided in a region where high speed operation is required, and the thin film transistor 346 can be provided in a region where high withstand voltage is required. For example, in the case of a semiconductor device including a circuit of a memory or the like, a channel formation region of a semiconductor layer included in a specific thin film transistor in the memory may be selectively and locally thinned, whereas a semiconductor layer included in a specific thin film transistor to which high current and high voltage are applied may be left thick.

In the case where a plurality of circuits are provided in a semiconductor device, a thin film transistor with a different thickness of the channel formation region of the semiconductor layer may be provided in each of the circuits in accordance with the function required for the circuits. The thin film transistor 345 may be selectively provided in a circuit for which high speed operation is required and the thin film transistor 346 may be selectively provided in a circuit for which high withstand voltage is required. For example, in the case where a memory cell array including memory elements, a booster circuit portion, a driver circuit portion, a control circuit portion, and the like are provided in a memory, channel formation regions of semiconductor layers included in thin film transistors provided in the driver circuit portion, the control circuit portion, and the like, for which high speed operation is required, are selectively and locally thinned, whereas semiconductor layers included in the memory elements of the memory cell array and thin film transistors, for which high withstand voltage is required, are not thinned and preferably thicker than the semiconductor layers included in the thin film transistors provided in the driver circuit portion, the control circuit portion, and the like.

In addition to the memory, in the case where a plurality of circuits are provided in the semiconductor device, a thin film transistor in which a semiconductor layer is locally thinned may be provided in a circuit that serves as a logic circuit and is required to operate at high speed. A thin film transistor having a semiconductor layer that is not thinned and has a thickness to withstand high voltage may be provided in a circuit such as a power supply circuit, to which high voltage is applied.

In the semiconductor device of the present invention, the semiconductor layer of the thin film transistor 345 provided in the driver circuit portion, the control circuit portion, or the like, for which high speed operation is required, preferably has a thickness equal to or greater than 5 nm and equal to or less than 30 nm, and more preferably equal to or more than 10 nm and equal to or less than 20 nm. On the other hand, the semiconductor layer of the thin film transistor 346 provided in the memory cell array or the power supply circuit, for which high withstand voltage is required, preferably has a thickness equal to or greater than 25 nm and equal to or less than 100 nm, and more preferably equal to or greater than 50 nm and equal to or less than 60 nm.

In the semiconductor device of the present invention, the channel formation region of the semiconductor layer included in the thin film transistor 345 provided in the driver circuit portion, the control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, the source region and the drain region of the semiconductor layer included in the thin film transistor 345 provided in the driver circuit portion, the control circuit portion, or the like, for which high speed operation is required, and the semiconductor layer (the source region, the drain region, and the channel formation region) included in the thin film transistor 346 provided in the memory cell array or the power supply circuit, for which high withstand voltage is required, each preferably have a thickness equal to or greater than 25 nm and equal to or less than 100 nm, and more preferably equal to or greater than 50 nm and equal to or less than 60 nm.

In the present invention, the channel formation region of the semiconductor layer included in the thin film transistor 345, which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with the source electrode layer and the drain electrode layer respectively, are not thinned (the thickness is preferably equal to or greater than 25 nm and equal to or less than 100 nm, and more preferably equal to or greater than 50 nm and equal to or less than 60 nm). Therefore, part of the source region and the drain region, low-concentration impurity regions that can be provided between the channel formation region and the source and drain regions, and the like in the semiconductor layer, other than the channel formation region, may also be thinned.

In the semiconductor device of the present invention, the gate insulating layer 308 included in the thin film transistor 345 that is provided in the driver circuit portion, the control circuit portion, or the like, for which high speed operation is required, preferably has a thickness equal to or greater than 1 nm and equal to or less than 10 nm, and more preferably about 5 nm. On the other hand, the gate insulating layer 309 included in the thin film transistor 346 that is provided in the memory cell array, the power supply circuit, or the like, for which high withstand voltage is required, preferably has a thickness equal to or greater than 50 nm and equal to or less than 150 nm, and more preferably a thickness equal to or greater than 60 nm and equal to or less than 80 nm.

In this embodiment mode, the thin film transistor 345 for which high speed operation is required preferably has a channel length shorter than the thin film transistor 346 for which high withstand voltage is required. The channel length of the thin film transistor 345, for which high speed operation is required, of this embodiment mode is preferably 0.1 μm to 1 μm. In addition, the channel length of the thin film transistor 346 that is provided in the memory cell array or the power supply circuit, for which high withstand voltage is required, is preferably 1 μm to 5 μm (more preferably, 1 μm to 3 μm).

In the thin film transistor, by shortening the channel length that is represented as a length of the gate electrode between a source and a drain, a traveling distance of carriers flowing through a channel of the transistor is shortened, so that high speed operation can be performed.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation region of the semiconductor layer included in the thin film transistor that is provided in the driver circuit portion, the control circuit portion, or the like, for which high speed operation is required, acts on an entire region of the channel formation region to be depleted, thereby suppressing the short-channel effect. In addition, the threshold voltage of the thin film transistor can be reduced. Accordingly, miniaturization and high performance of the thin film transistor that is provided in the driver circuit portion, the control circuit portion, or the like can be realized. Therefore, low voltage driving of the semiconductor device can be performed, and low power consumption can be realized. Since miniaturization of the thin film transistor can be realized by thinning the semiconductor layer (or, the gate insulating layer as well), reduction in area of the driver circuit portion or the control circuit portion can be achieved, and miniaturization of the semiconductor device can be realized.

Furthermore, since only the channel formation region is locally thinned in the thin film transistor 345 for which high speed operation is required, regions in the source region and the drain region, which are in contact with the wiring layers that are a source electrode layer and a drain electrode layer, are not thinned and thicker than the channel formation region. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

On the other hand, the semiconductor layer (or, the gate insulating layer as well) of the thin film transistor provided in the memory cell array, the power supply circuit, or the like, for which high withstand voltage is required, is made thicker than those of the driver circuit portion, the control circuit portion, and the like; accordingly, a semiconductor device with high withstand voltage and high reliability can be provided.

Thus, a semiconductor device of the present invention can have low power consumption and high reliability.

EMBODIMENT MODE 3

Embodiment Mode 3 will describe another semiconductor device with low power consumption and high reliability, and a manufacturing method thereof, with reference to FIGS. 5A to 5E and FIGS. 6A and 6B. In this embodiment mode, an example of providing silicides in the source region and the drain region of a thin film transistor in the semiconductor device that is manufactured in Embodiment Modes 1 and 2 will be described. Therefore, repeated description for the same portion or a portion having a similar function to that in Embodiment Modes 1 and 2 is omitted.

Figure 5A:
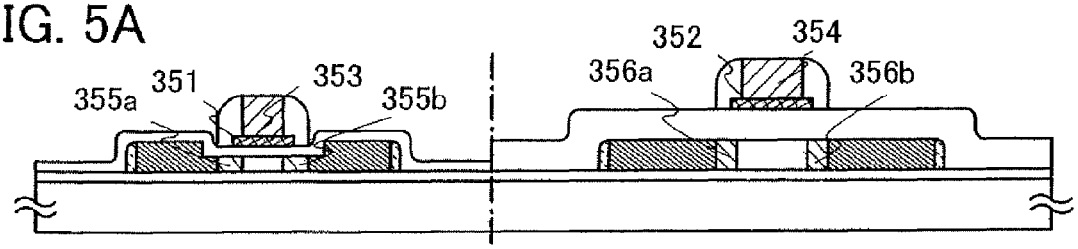
FIGS. 5A to 5E show a manufacturing method of a semiconductor device according to the present invention.

FIG. 5A shows a semiconductor device in a manufacturing process and corresponds to the semiconductor device shown in FIG. 4C of Embodiment Mode 2. In FIGS. 5A to 6B, thin film transistors with different characteristics are selectively formed over the same substrate.

In this embodiment mode, as shown in FIGS. 5A to 5E, the first gate electrode layers 351 and 352 have shapes different from those of the second gate electrode layers 353 and 354, and end portions of the first gate electrode layers 351 and 352 are not aligned with end portions of the second gate electrode layers 353 and 354. The edge portions of the first gate electrode layers 351 and 352 are positioned outer than the edge portions of the second gate electrode layers 353 and 354. Since an impurity element is added to the semiconductor layer using the second gate electrode layers 353 and 354 as masks, impurity regions are formed in portions of the semiconductor layer, which overlap with regions of the first gate electrode layers 351 and 352, over which the second gate electrode layers 353 and 354 are not stacked.

Accordingly, third impurity regions 355a and 355b that have one conductivity type and partially overlap with the first gate electrode layer 351, and third impurity regions 356a and 356b that have one conductivity type and partially overlap with the first gate electrode layer 352 are formed. Thus, Lov regions, which are portions of the impurity regions covered with the gate electrode layer with the gate insulating layer interposed therebetween, can relieve an electric field in the vicinity of a drain and suppress degradation of an on current due to hot carriers. Therefore, a thin film transistor capable of high speed operation can be formed.

Figure 5B:
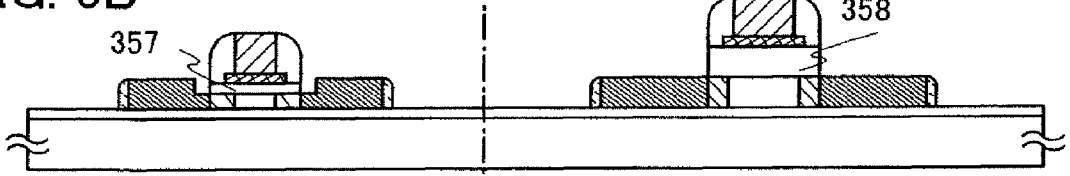

The gate insulating layer 308 and the gate insulating layer 309 are etched using the insulating layers 333a to 333d, the first gate electrode layers 351 and 352, and the second gate electrode layers 353 and 354 as masks, so that the source regions and drain regions of the semiconductor layers 303 and 305 are exposed. The gate insulating layers 308 and 309 are selectively etched to become gate insulating layers 357 and 358 (FIG. 5B). As an example of addition (doping) of an impurity element to the semiconductor layers, addition through the gate insulating layer is described in this embodiment mode. However, in forming the insulating layers 333a to 333d covering the side surfaces of the first gate electrode layers and the second gate electrode layers, the gate insulating layers 308 and 309 may be etched and an impurity element may be added in a state that the semiconductor layer is exposed.

Figure 5C:
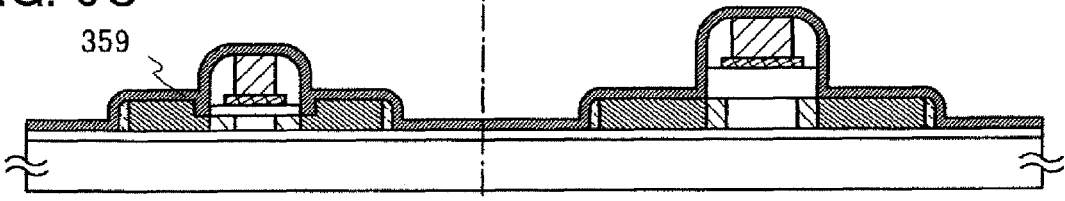

A conductive film 359 is formed over the semiconductor layers 303 and 305, the insulating layers 333a to 333d, and the second gate electrode layers 353 and 354 (FIG. 5C). The conductive film 359 is formed using a material such as titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Here, a nickel film is formed by a sputtering method.

Next, silicon in the semiconductor layer of the exposed source region and the drain region is reacted with the conductive film 359 by heat treatment, a GRTA method, an LRTA method, or the like, to form silicides 360a and 360b and silicides 361a and 361b. Alternatively, the silicides may be formed by laser irradiation or light irradiation using a lamp. Thereafter, part of the conductive film 359, which is not reacted with the semiconductor layer, is removed (FIG. 5D).

Next, an insulating film 362 containing hydrogen is formed as a passivation film. This insulating film 362 may be formed by forming an insulating film containing silicon with a thickness of 100 to 200 nm by a plasma CVD method or a sputtering method, and can be formed using a material and a process similar to those of the insulating film 311 described in Embodiment Mode 1.

Further, thermal treatment is performed in a nitrogen atmosphere at 300 to 550° C. for 1 to 12 hours to hydrogenate the semiconductor layer. Preferably, it is performed at 400 to 500° C. This step is a step of terminating dangling bonds of the semiconductor layer with hydrogen contained in the insulating film 362.

Figure 5D:
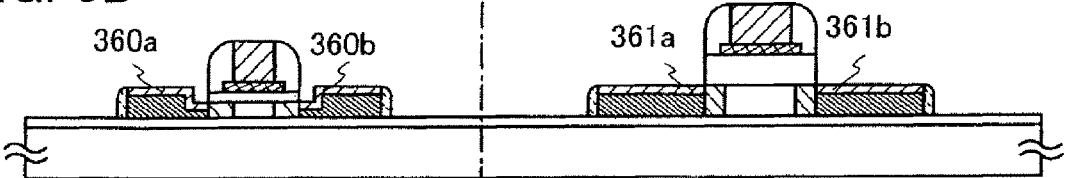
Figure 5E:
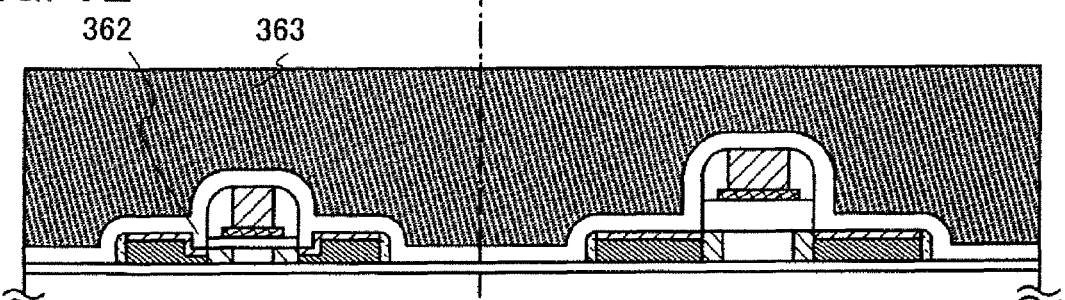

Next, an insulating layer 363 serving as an interlayer insulating film is formed (FIG. 5D). In the present invention, the interlayer insulating film provided for planarization is required to have high heat resistance, a high insulating property, and high planarity. The insulating layer 363 can be formed using a material and a process similar to those of the insulating layer 319 described in Embodiment Mode 1.

Contact holes (openings) reaching the semiconductor layers 303 and 305 are formed in the insulating film 362 and the insulating layer 363 using a mask formed of a resist. Etching may be performed once or plural times in accordance with a selection ratio of a material to be used. By etching, the openings reaching the silicides 360a and 360b and the silicides 361a and 361b, which are source regions and drain regions, are formed.

A conductive film is formed and etched to form wiring layers 364a, 364b, 365a, and 365b, which are source electrode layers and drain electrode layers electrically connected to the silicides 360a and 360b and the silicides 361a and 361b. The wiring layers 364a, 364b, 365a, and 365b can be formed by forming the conductive film by a PVD method, a CVD method, an evaporation method, or the like, and then, etching the conductive film into a desired shape. Alternatively, a conductive layer can be selectively formed in a predetermined position by a droplet discharge method, a printing method, an electroplating method, or the like. Moreover, a reflow method or a damascene method may also be used. As a material for the wiring layers 364a, 364b, 365a, and 365b, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked structure of these materials such as Ti/Al/Ti may also be employed.

Although the example in which the silicides 360a and 360b and the silicides 361a and 361b are formed in surface portions of the impurity regions that are the source regions and the drain regions, is shown, silicide may be formed in a larger region or in the entire region of the impurity regions. Silicide can be controlled by the thickness of the conductive film and heat conditions (such as temperature and time). A thin film transistor 370 shown in FIG. 6B is an example in which silicides 372a and 372b are formed in the larger region of the source region and the drain region than the silicides 360a and 360b of the thin film transistor 366, and a thin film transistor 371 is an example in which silicides 373a and 373b are also formed in a large region in the source region and the drain region than the silicides 361a and 361b of the thin film transistor 367.

In this embodiment mode, only the channel formation region 339 is locally thinned in the thin film transistor 370. Therefore, regions that are in contact with the wiring layers 364a and 364b, which are a source electrode layer and a drain electrode layer, in the impurity regions, which are a source region and a drain region and include silicides, are not thinned and thicker than the channel formation region. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

Figure 6A:
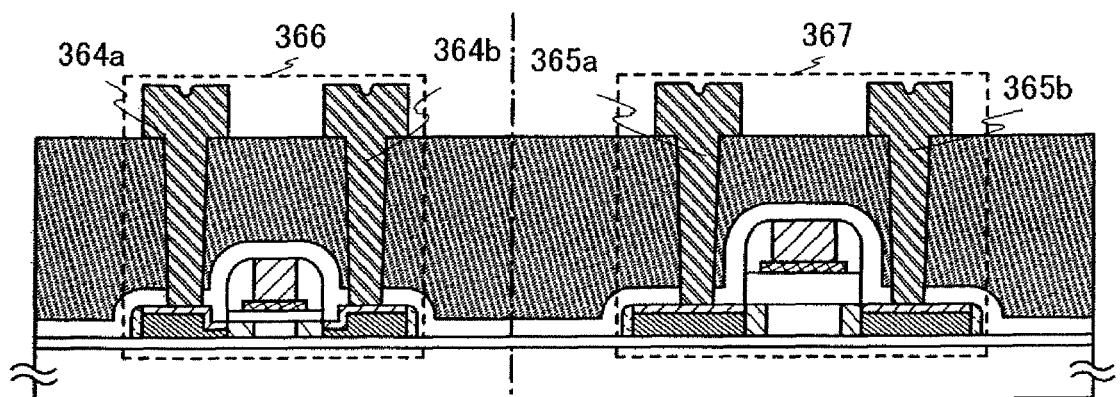
FIGS. 6A and 6B show manufacturing methods of semiconductor devices according to the present invention.
Figure 6B:
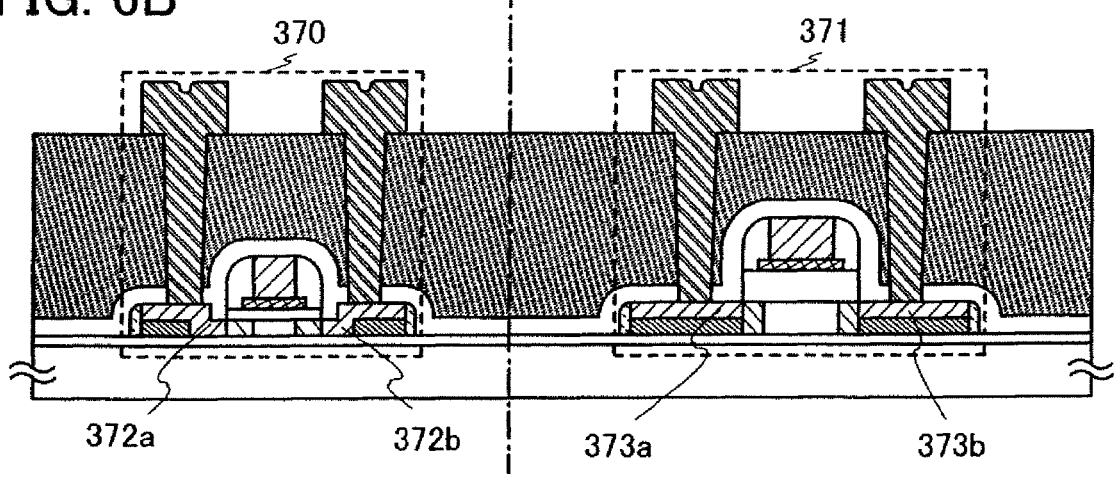

Through the above-described process, a semiconductor device including the thin film transistor 366 in which the low-concentration impurity regions are formed in the Lov regions and Loff regions, and the thin film transistor 367 in which the low-concentration impurity regions are formed in the Lov regions and Loff regions, can be manufactured (FIG. 6A). Further, since the thin film transistors 366 and 367 each have a silicide structure, reduction in resistance of the source regions and the drain regions is possible, so that higher speed operation of a semiconductor device can be realized. Moreover, since operation at low voltage is possible, power consumption can be reduced.

The semiconductor device of this embodiment mode that uses the present invention includes the two kinds of thin film transistors 370 and 371 with different thicknesses of the semiconductor layers, over the same substrate 300. The semiconductor layer 303 of the thin film transistor 370 for which high speed operation is required is made thinner than the semiconductor layer 305 of the thin film transistor 371 for which high withstand voltage is required so that the semiconductor layer 303 becomes thin. In addition, the gate insulating layer of the thin film transistor 370 for which high speed operation is required is also preferably thinner than the gate insulating layer of the thin film transistor 371 for which high withstand voltage is required.

In order that the thin film transistors 370 and 371 with different thicknesses of the semiconductor layers each fulfill a necessary function in the same circuit, the thin film transistor 370 can be provided in a region where high speed operation is required, and the thin film transistor 371 can be provided in a region where high withstand voltage is required. For example, in the case of a semiconductor device including a circuit of a memory or the like, a semiconductor layer included in a specific thin film transistor in the memory may be selectively thinned, whereas a semiconductor layer included in a specific thin film transistor to which high current and high voltage are applied may be left thick.

In the case where a plurality of circuits are provided in a semiconductor device, a thin film transistor with a different thickness of a semiconductor layer may be provided in each of the circuits in accordance with the function required for the circuits. The thin film transistor 370 may be selectively provided in a circuit for which high speed operation is required and the thin film transistor 371 may be selectively provided in a circuit for which high withstand voltage is required. For example, in the case where a memory cell array including memory elements, a booster circuit portion, a driver circuit portion, a control circuit portion, and the like are provided in a memory, the semiconductor layers of the thin film transistors provided in the driver circuit portion, the control circuit portion, and the like, for which high speed operation is required, are selectively thinned, whereas the semiconductor layers of the memory elements of the memory cell array and the thin film transistor, for which high withstand voltage is required, are not thinned and preferably thicker than the semiconductor layers included in the thin film transistors provided in the driver circuit portion, the control circuit portion, and the like.

The semiconductor device of this embodiment mode that uses the present invention includes the plural kinds of the thin film transistors 370 and 371 with different thicknesses of the channel formation regions of the semiconductor layers, over the same substrate 300. The channel formation region 339 of the semiconductor layer 303 included in the thin film transistor 370, for which high speed operation is required, is thinned locally, so that the channel formation region 339 of the semiconductor layer 303 is made thinner than the channel formation region 340 of the semiconductor layer 305 included in the thin film transistor 371, for which high withstand voltage is required. Since only the channel formation region is locally thinned in the thin film transistor 370, for which high speed operation is required, regions of the source region and the drain region, which are in contact with the source electrode layer and the drain electrode layer respectively, are not thinned and thicker than the channel formation region. Further, the gate insulating layer of the thin film transistor 370, for which high speed operation is required, is also preferably thinner than the gate insulating layer of the thin film transistor 371, for which high withstand voltage is required.

In order that the thin film transistors 370 and 371 with different thicknesses of the channel formation regions of the semiconductor layers each fulfill a necessary function in the same circuit, the thin film transistor 370 can be provided in a region where high speed operation is required, and the thin film transistor 371 can be provided in a region where high withstand voltage is required. For example, in the case of a semiconductor device including a circuit of a memory or the like, a channel formation region of a semiconductor layer included in a specific thin film transistor in the memory may be selectively and locally thinned, whereas a semiconductor layer included in a specific thin film transistor to which high current and high voltage are applied may be left thick.

In the case where a plurality of circuits are provided in a semiconductor device, a thin film transistor with a different thickness of a channel formation region of a semiconductor layer may be provided in each of the circuits in accordance with the function required for the circuits. The thin film transistor 370 may be selectively provided in a circuit for which high speed operation is required and the thin film transistor 371 may be selectively provided in a circuit for which high withstand voltage is required. For example, in the case where a memory cell array including memory elements, a booster circuit portion, a driver circuit portion, a control circuit portion, and the like are provided in a memory, the channel formation regions of the semiconductor layers included in the thin film transistors provided in the driver circuit portion, the control circuit portion, and the like, for which high speed operation is required, are selectively and locally thinned, whereas the semiconductor layers included in the memory elements of the memory cell array and the thin film transistors, for which high withstand voltage is required, are not thinned and preferably thicker than the semiconductor layers included in the thin film transistors provided in the driver circuit portion, the control circuit portion, and the like.

In addition to the memory, in the case where a plurality of circuits are provided in the semiconductor device, a thin film transistor in which a semiconductor layer is locally thinned may be provided in a circuit that serves as a logic circuit and is required to operate at high speed. A thin film transistor having a semiconductor layer that is not thinned and has a thickness to withstand high voltage may be provided in a circuit such as a power supply circuit, to which high voltage is applied.

In the semiconductor device of this embodiment mode that uses the present invention, the channel formation region of the semiconductor layer included in the thin film transistor 370 provided in the driver circuit portion, the control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, the source region and the drain region of the semiconductor layer included in the thin film transistor 370 provided in the driver circuit portion, the control circuit portion, or the like, for which high speed operation is required, and the semiconductor layer (the source region, the drain region, and the channel formation region) included in the thin film transistor 371 provided in the memory cell array or the power supply circuit, for which high withstand voltage is required, each preferably have a thickness equal to or greater than 25 nm and equal to or less than 100 nm, and more preferably equal to or greater than 50 nm and equal to or less than 60 nm.

In this embodiment mode, the channel formation region of the semiconductor layer included in the thin film transistor 370, which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions which are in contact with the wiring layers 364a and 364b, which are the source electrode layer and the drain electrode layer, in the silicides and the impurity regions which are the source region and the drain region are not thinned (the thickness is preferably equal to or greater than 25 nm and equal to or less than 100 nm, and more preferably equal to or greater than 50 nm and equal to or less than 60 nm). Therefore, part of the source region and the drain region, low-concentration impurity regions that can be provided between the channel formation region and the source and drain regions, and the like in the semiconductor layer, other than the channel formation region, may also be thinned.

In the semiconductor device of the present invention, the gate insulating layer 308 included in the thin film transistor 370 that is provided in the driver circuit portion, the control circuit portion, or the like, for which high speed operation is required, preferably has a thickness equal to or greater than 1 nm and equal to or less than 10 nm, and more preferably about 5 nm. On the other hand, the gate insulating layer 309 included in the thin film transistor 371 that is provided in the memory cell array, the power supply circuit, or the like, for which high withstand voltage is required, preferably has a thickness equal to or greater than 50 nm and equal to or less than 150 nm, and more preferably equal to or greater than 60 nm and equal to or less than 80 nm.

In this embodiment mode, the thin film transistor 370 for which high speed operation is required preferably has a channel length shorter than the thin film transistor 371 for which high withstand voltage is required. The channel length of the thin film transistor 370, for which high speed operation is required, of this embodiment mode is preferably 0.1 μm to 1 μm. In addition, the channel length of the thin film transistor 371 that is provided in the memory cell array or the power supply circuit, for which high withstand voltage is required, is preferably 1 μm to 5 μm (more preferably, 1 μm to 3 μm).

In the thin film transistor, by shortening the channel length that is represented as a length of the gate electrode between a source and a drain, a traveling distance of carriers flowing through a channel of the transistor is shortened, so that high speed operation can be performed.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation region of the semiconductor layer included in the thin film transistor that is provided in the driver circuit portion, the control circuit portion, or the like, for which high speed operation is required, acts on an entire region of the channel formation region to be depleted, thereby suppressing the short-channel effect. In addition, the threshold voltage of the thin film transistor can be reduced. Accordingly, miniaturization and high performance of the thin film transistor that is provided in the driver circuit portion, the control circuit portion, or the like can be realized. Therefore, low voltage driving of the semiconductor device can be performed, and low power consumption can be realized. Since miniaturization of the thin film transistor can be realized by thinning the semiconductor layer (or, the gate insulating layer as well), reduction in area of the driver circuit portion or the control circuit portion can be achieved, and miniaturization of the semiconductor device can be realized.

Furthermore, since only the channel formation region is locally thinned in the thin film transistor 370 for which high speed operation is required, regions in the source region and the drain region, which are in contact with the wiring layers that are a source electrode layer and a drain electrode layer, are not thinned and thicker than the channel formation region. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

On the other hand, the semiconductor layer (or, the gate insulating layer as well) of the thin film transistor provided in the memory cell array, the power supply circuit, or the like, for which high withstand voltage is required, is made thinner than those of the driver circuit portion, the control circuit portion, and the like; accordingly, a semiconductor device with high withstand voltage and high reliability can be provided.

Thus, a semiconductor device of the present invention can have low power consumption and high reliability.

EMBODIMENT MODE 4

Embodiment Mode 4 will describe an example of a semiconductor device including a memory as a semiconductor device with low power consumption and high reliability, with reference to the drawings.

A semiconductor device of this embodiment mode includes a memory including a memory cell array and a driver circuit portion which drives the memory cell array. A memory element and a control thin film transistor provided in the memory cell array are required to have high withstand voltage since driving voltage thereof is high. On the other hand, since a thin film transistor provided in the driver circuit portion is required to operate at high speed, semiconductor elements having semiconductor layers including channel formation regions with different thicknesses between the memory cell array 206 and the driver circuit portion 204 are manufactured.

As a base film over a substrate 100 having an insulating surface, an insulating layer 101 is formed. In this embodiment mode, a stacked structure is employed for the insulating layer 101, and a silicon nitride oxide film is formed with a thickness of 10 to 200 nm (preferably, 50 to 150 nm) and a silicon oxynitride film is formed with a thickness of 50 to 200 nm (preferably, 100 to 150 nm). In this embodiment mode, the insulating layer 101 is formed by a plasma CVD method. The base film may have a single layer structure or a stacked structure of, for example, two or three layers.

The insulating layer 101 may be formed using a material of an inorganic material such as silicon oxide, silicon nitride, silicon oxynitride, or silicon nitride oxide; an acrylic acid, a methacrylic acid, or derivatives thereof; a heat-resistant high-molecular compound such as polyimide, aromatic polyamide, or polybenzimidazole; or a siloxane resin. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, a photo-curing polybenzoxazole or the like can be used.

The insulating layer 101 can be formed by a sputtering method, a PVD (physical vapor deposition) method, a CVD (chemical vapor deposition) method such as a low-pressure CVD (LPCVD) method or a plasma CVD method, or the like. Further, a droplet discharge method, a printing method (a method for forming a pattern such as screen printing or offset printing), a coating method such as a spin coating method, a dipping method, a dispenser method, or the like can also be used.

As the substrate 100, a glass substrate or a quartz substrate can be used. Alternatively, a plastic substrate having heat resistance, which can withstand a processing temperature of this embodiment mode, or a flexible substrate such as a film may also be used. As the plastic substrate, a substrate formed of PET (polyethylene terephthalate), PEN (polyethylene naphthalate), or PES (polyether sulfone) can be used, and as the flexible substrate, a synthetic resin such as acrylic can be used.

Next, a semiconductor film is formed over the insulating layer 101. The semiconductor film may be formed with a thickness of 25 to 200 nm (preferably 30 to 150 nm) by a method (such as a sputtering method, an LPCVD method, or a plasma CVD method).

In this embodiment mode, an amorphous semiconductor film is formed over the insulating layer 101, and the amorphous semiconductor film is laser-crystallized to form a semiconductor film 102 that is a crystalline semiconductor film (FIG. 7A).

The semiconductor film obtained as described above is selectively doped with a slight amount of impurity elements (boron or phosphorus) for controlling the threshold voltage of a thin film transistor. This doping of the impurity elements may also be performed to the amorphous semiconductor film, before the crystallization step. When the semiconductor film in an amorphous state is doped with the impurity elements, the impurity elements can also be activated by subsequent heat treatment for crystallization. Further, defects and the like generated in doping can be improved as well.

The semiconductor film 102 is processed into a desired shape by using a mask. In this embodiment mode, after removing an oxide film formed over the semiconductor film 102, an oxide film is newly formed. Then, a photomask is formed and process treatment using a photolithography technique is conducted, so that a semiconductor layer 158, a semiconductor layer 159, a semiconductor layer 105, and a semiconductor layer 106 are formed (FIG. 7B).

Insulating layers 107a to 107h in contact with side surfaces of the semiconductor layers 158, 159, 105, and 106 are formed (FIG. 7C). By forming the insulating layers 107a to 107h which are in contact with the side surfaces of the semiconductor layers 158, 159, 105, and 106, coverage with the gate insulating layers at end portions of the semiconductor layers 158, 159, 105, and 106 can be improved. Therefore, a defect caused by insufficient coverage with the gate insulating layers at the end portions of the semiconductor layers 158, 159, 105, and 106 such as short circuit between the semiconductor layer and the gate electrode layer, generation of leak current, electrostatic breakdown, and the like, can be prevented.

After formation of the semiconductor layers 158, 159, 105, and 106, the insulating layers 107a to 107h can be formed in a self-aligning manner by stacking a silicon oxide film or a silicon nitride film and conducting anisotropic etching.

Alternatively, the insulating layers 107a to 107h can be formed by subjecting the end portions of the semiconductor layers 158, 159, 105, and 106 to oxidation treatment so as to be insulated selectively. The oxidation treatment can be performed by plasma treatment in an atmosphere containing oxygen. Alternatively, surfaces may be subjected to oxidation treatment using an aqueous solution (also referred to as wet oxidation). Halogen such as fluorine or chlorine may be introduced into the end portions of the semiconductor layers before plasma treatment, and then plasma treatment may be performed. When halogen is introduced, oxidation speed is high and oxidation proceeds preferentially. Therefore, thick insulating layers can be formed in the end portions of the semiconductor layers.

By thus covering the end portions of the semiconductor layers 158, 159, 105, and 106 with the gate insulating layers enough, and preferably, by increasing the thickness of the insulating layers in the regions which are in contact with the side surfaces of the semiconductor layers 158, 159, 105, and 106, an electric field applied to the end portions of the semiconductor layers 158, 159, 105, and 106 can be relaxed, and generation of leak current, or the like can be prevented.

Further, the insulating layers 107a to 107h each preferably have a lower dielectric constant than the gate insulating layers 108 and 109. By making the dielectric constant of the insulating layers 107a to 107h lower than those of the gate insulating layers 108 and 109, electric field concentration in the end portions of the semiconductor layers, especially at corner portions (corners), can be reduced. For example, the insulating layers 107a to 107h may be formed using a low dielectric constant material having a dielectric constant of 2.5 or lower. As the low dielectric constant material, porous silicon oxide manufactured by a CVD method, silicon oxide containing carbon or fluorine, or the like can be used. By forming the insulating layers 107a to 107h using a low dielectric constant material, effect similar to the case where the insulating layers are formed to be thick can be obtained. Accordingly, local application of excessive electric field to the gate insulating layers can be prevented, and insufficient insulation of the gate insulating layers can be prevented. Thus, high-yield manufacturing of thin film transistors can be realized, and reliability of a semiconductor device can be improved.

A mask 157, which covers part of the semiconductor layers 158 and 159, and the semiconductor layers 105 and 106, is formed. The mask 157 covers the memory cell array 206 and part of the driver circuit portion 204. The semiconductor layers 158 and 159 are locally etched to be thin using the mask 157, so that the semiconductor layers 103 and 104 are formed in the driver circuit portion 204. Thus, the semiconductor layers 103 and 104 of the driver circuit portion 204, each of which includes a channel formation region having a smaller thickness than the semiconductor layers 105 and 106 in the memory cell array 206, are formed (FIG. 7C). After etching, each of the semiconductor layers 103 and 104 formed has a depressed portion, and the depressed portion is the thinned region.

The semiconductor layer may be thinned by a one-time etching step or a plurality of etching steps. The semiconductor layer may be etched directly with an etching gas (or an etching solution). Alternatively, part of a surface of the semiconductor layer may be processed to be modified, and only the modified region may be selectively removed.

The thicknesses of source regions and drain regions of the semiconductor layers 103 and 104, which are provided in the driver circuit portion 204, and source regions, drain regions, and channel formation regions of the semiconductor layers 105 and 106, which are provided in the memory cell array 206, are larger than that of channel formation regions of the semiconductor layers 103 and 104, and are each equal to or greater than 25 nm and equal to or less than 100 nm, and more preferably equal to or greater than 50 nm and equal to or less than 60 nm.

In this embodiment mode, one feature is that the channel formation regions of the semiconductor layers included in the thin film transistors, for which high speed operation is required, are locally thinned (the thickness is preferably equal to or greater than 5 nm and equal to or less than 30 nm, and more preferably equal to or greater than 10 nm and equal to or less than 20 nm), and the regions of the source regions and the drain regions, which are in contact with the source electrode layers and the drain electrode layers respectively, are not thinned (the thickness is preferably equal to or greater than 25 nm and equal to or less than 100 nm, and more preferably equal to or greater than 50 nm and equal to or less than 60 nm). Therefore, part of the source regions and the drain regions, low-concentration impurity regions that can be provided between the channel formation regions and the source and drain regions, and the like in the semiconductor layers, other than the channel formation regions, may also be thinned.

Thinning of the channel formation regions of the semiconductor layers can suppress the short-channel effect. Moreover, the threshold voltage of the transistors can become lower, which enables low voltage driving. The end portions of the semiconductor layers are formed to have a slant angle (taper angle). The angle is preferably equal to or more than 45° and equal to or less than 95°. In order to avoid influence by formation of a parasitic transistor whose characteristics are different from those of a center part of the semiconductor layer in this region, it is preferable that the slant angle be close to a right angle.

As an etching processing, either plasma etching (dry etching) or wet etching may be employed. In the case where a large-area substrate is processed, plasma etching is suitable. As an etching gas, a fluorine-based gas such as $CF_4$ or $NF_3$, or a chlorine-based gas such as $Cl_2$ or $BCl_3$ is used, to which an inert gas such as He or Ar may be appropriately added. When an etching processing by atmospheric pressure discharge is employed, local electric discharge can also be realized, which does not require a mask to be formed over the entire surface of the substrate.

An insulating layer 110 is formed over the semiconductor layer 105. The insulating layer 110 may be formed using silicon oxide or a stacked structure of silicon oxide and silicon nitride. The insulating layer 110 may be formed by stacking an insulating layer by a plasma CVD method or a low-pressure CVD method, or is preferably formed by solid-phase oxidation or solid-phase nitridation using plasma treatment. This is because an insulating layer formed by oxidizing or nitriding a semiconductor layer (typically, silicon layer) by plasma treatment is dense, has high withstand voltage, and is highly reliable. Since the insulating layer 110 is used as a tunnel insulating layer for injecting charges into a charge accumulation layer 111, the insulating layer 110 is preferably strong like the one shown above. This insulating layer 110 is preferably formed with a thickness of 1 to 20 nm, and preferably 3 to 6 nm.

The insulating layer 110 is preferably formed by plasma treatment in such a way that, for example, a silicon oxide layer is formed with a thickness of 3 to 6 nm over the semiconductor layer by plasma treatment under an oxygen atmosphere, and a nitrogen-plasma-treated layer is formed by treating the surface of the silicon oxide layer with nitrogen plasma under a nitrogen atmosphere. Specifically, the silicon oxide layer is formed to a thickness of 3 to 6 nm on the semiconductor layer by plasma treatment under an oxygen atmosphere. Subsequently, by conducting plasma treatment under a nitrogen atmosphere, the nitrogen-plasma-treated layer containing a high concentration of nitrogen is provided on the surface of the silicon oxide layer or in the vicinity of the surface. Note that the vicinity of the surface means a region from the surface of the silicon oxide layer to a depth of about 0.5 to 1.5 nm. For example, by conducting plasma treatment under a nitrogen atmosphere, a structure is obtained in which the silicon oxide layer contains 20 to 50 atomic % nitrogen in a region from the surface to a depth of about 1 nm.

By oxidizing the surface of a silicon layer which is a typical example of a semiconductor layer by plasma treatment, a dense oxide layer without a distorted interface can be formed. Further, by forming a nitride layer by nitriding the oxide layer by plasma treatment so as to substitute nitrogen for oxygen of the outermost surface, an even denser film can be obtained. Accordingly, an insulating layer with high withstand voltage can be formed.

In any instances, by using the above-described solid-phase oxidation treatment or solid-phase nitridation treatment by the plasma treatment, an insulating layer which is substantially the same as a thermally oxidized film that is formed at a temperature of 950 to 1050° C. can be obtained even when a glass substrate with an allowable temperature limit of 700° C. or less is used. That is, a tunnel insulating layer which has high reliability as a tunnel insulating layer of a nonvolatile memory element can be formed.

The charge accumulation layer 111 is formed over the insulating layer 110. This charge accumulation layer 111 may be provided as either a single layer or stacked layers.

The charge accumulation layer 111 can be a floating gate formed of a layer or particles of a semiconductor material or a conductive material. As the semiconductor material, silicon, silicon germanium, or the like may be used. In the case of using silicon, amorphous silicon or polysilicon can be used. Further, polysilicon doped with phosphorus can be used. As the conductive material, an element selected from tantalum (Ta), titanium (Ti), molybdenum (Mo), or tungsten (W); an alloy including the element as a main component; an alloy film in which the element is combined (representatively, a Mo—W alloy film or a Mo—Ta alloy film); or a silicon film having conductivity may be used. Under the conductive layer formed of such a material, a nitride such as tantalum nitride, tungsten nitride, titanium nitride, or molybdenum nitride; or a silicide such as tungsten silicide, titanium silicide, or molybdenum silicide may be formed. Further, a stacked structure which includes above-described semiconductor materials, conductive materials, or above-described semiconductor material and the conductive material may be employed. For example, a stacked structure which includes a silicon layer and a germanium layer may be used.

Alternatively, the charge accumulation layer 111 may be formed as an insulating material having a trap which holds charges. Typical examples of such a material are a silicon compound or a germanium compound. As the silicon compound, silicon nitride, silicon oxynitride, silicon oxynitride to which hydrogen is added, or the like may be used. As the germanium compound, germanium nitride, germanium nitride to which oxygen is added, germanium oxide to which nitrogen is added, germanium nitride to which oxygen and hydrogen are added, germanium oxide to which nitrogen and hydrogen are added, or the like may be used.

The oxide film over the semiconductor layer is removed, and then the gate insulating layer 108, which covers the semiconductor layer 103, the semiconductor layer 104, and the gate insulating layers 107a to 107d; and the gate insulating layer 109, which covers the semiconductor layer 105, the semiconductor layer 106, the insulating layers 107e to 107h, the insulating layer 110, and the charge accumulation layer 111 are formed. The gate insulating layer 108 and the gate insulating layer 109 each having a different thickness are formed in the following manner: an insulating film is formed by a plasma CVD method, a sputtering method, or the like and selectively etched only in the driver circuit portion 204 to be thinned. Thinning of the gate insulating layer 108 has an effect of driving the thin film transistors in the driver circuit portion 204 at high speed and low voltage. When the gate insulating layer 109 is thick in the memory cell array 206, the thin film transistor and the memory element can have high resistance to high voltage; accordingly reliability can be heightened.

Note that although the gate insulating layer 109 formed over the semiconductor layer 105 functions as a control insulating layer of a memory element which is completed later, the insulating layer 109 formed over the semiconductor layer 106 functions as a gate insulating layer of the transistor. Therefore, the layer is called the gate insulating layer 109.

In the semiconductor device of the present invention, the thickness of the gate insulating layer 108 included in the thin film transistors, which are provided in the driver circuit portion 204, is preferably equal to or greater than 1 nm and equal to or less than 10 nm, and more preferably about 5 nm. On the other hand, the thickness of the gate insulating layer 109 included in the thin film transistors, which are provided in the memory cell array 206, is preferably equal to or greater than 50 nm and equal to or less than 150 nm, and more preferably equal to or greater than 60 nm and equal to or less than 80 nm.

The gate insulating layers 108 and 109 may be formed using silicon oxide or a stacked structure of silicon oxide and silicon nitride. The gate insulating layers 108 and 109 may be formed by stacking an insulating film by a plasma CVD method or a low-pressure CVD method, or may be formed by solid-phase oxidation or solid-phase nitridation using plasma treatment. This is because a gate insulating layer formed by oxidizing or nitriding a semiconductor layer by plasma treatment is dense, has high withstand voltage, and is highly reliable.

As the gate insulating layers 108 and 109, a high dielectric constant material may be used. When a high dielectric constant material is used for the gate insulating layers 108 and 109, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

As a method for forming a thin silicon oxide film, the surface of the semiconductor region can be oxidized by a GRTA method, an LRTA method, or the like to form a thermal oxide film, thereby forming a thin silicon oxide film. Note that a rare gas element such as argon is preferably contained in a reaction gas and mixed into an insulating film to be formed, in order to form a dense insulating film having little gate leak current at a low film formation temperature.

Then, a first conductive film having a thickness of 20 to 100 nm and a second conductive film having a thickness of 100 to 400 nm, each of which serves as a gate electrode layer, are stacked over the gate insulating layers 108 and 109. The first conductive film and the second conductive film can be formed by a method such as a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or compound material containing the element as its main component. A semiconductor film typified by a polycrystalline silicon film doped with an impurity element such as phosphorus or an AgPdCu alloy may also be used as the first conductive film and the second conductive film. The conductive film is not limited to the two-layer structure, and for example, may have a three-layer structure where a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film are sequentially stacked. In the case of the three-layer structure, tungsten nitride may be used instead of tungsten for the first conductive film; an aluminum-titanium alloy (Al—Ti) film may be used instead of the aluminum-silicon alloy (Al—Si) film for the second conductive film; or a titanium film may be used instead of the titanium nitride film for the third conductive film as well. Moreover, a single-layer structure may also be used. In this embodiment mode, a tantalum nitride film with a thickness of 30 nm is formed as the first conductive film and tungsten (W) with a thickness of 370 nm is formed as the second conductive film.

Next, a mask is formed of a resist by a photolithography method, and the first conductive film and the second conductive film are processed into a desired shape to form a first gate electrode layer 112, a first gate electrode layer 113, a first gate electrode layer 114, a second gate electrode layer 116, a second gate electrode layer 117, a second gate electrode layer 118, a first control gate electrode layer 115, and a second control gate electrode layer 119 (FIG. 8B). The first gate electrode layers and the second gate electrode layers can be etched to have a desired taper shape by appropriately adjusting etching conditions (the amount of electric power applied to a coil-shaped electrode layer, the amount of electric power applied to an electrode layer on the substrate side, an electrode temperature on the substrate side, and the like) by an ICP (inductively coupled plasma) etching method. In addition, an angle and the like of the taper shape can also be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used.

In this embodiment mode, each of the first gate electrode layers and the second gate electrode layers (the first control gate electrode layer and the second control gate electrode layer) is formed to have a perpendicular side surface; however, the present invention is not limited to this. Both the first gate electrode layers and the second gate electrode layers (the first control gate electrode layer and the second control gate electrode layer) may have a taper shape. Alternatively, only one layer of either the first gate electrode layers or the second gate electrode layers (the first control gate electrode layer or the second control gate electrode layer) may have a taper shape while the other may have a perpendicular side surface by anisotropic etching. The taper angles may be different or the same between the stacked gate electrode layers. With a taper shape, coverage by a film to be stacked thereover is improved and a defect is reduced; thus, reliability is enhanced.

The gate insulating layers 108 and 109 may be etched to some extent and thinned (so-called film reduction) by the etching step in forming the gate electrode layers (and the control gate electrode layers).

The thin film transistors of this embodiment mode, which are provided in the driver circuit portion, each preferably have a channel length shorter than the thin film transistors, which are provided in the memory cell array. The channel length of each of the thin film transistors, which are provided in the driver circuit portion, of this embodiment mode is preferably 0.1 µm to 1 µm. In addition, the channel length of each of the thin film transistors, which are provided in the memory cell array, is preferably 1 µm to 5 µm (more preferably, 1 µm to 3 µm).

Next, a mask 121, which covers the semiconductor layer 104, the semiconductor layer 105, and the semiconductor layer 106, is formed. An impurity element 120 imparting p-type conductivity is added using the mask 121, the first gate electrode layer 112, and the second gate electrode layer 116 as masks to form a p-type impurity region 122a and a p-type impurity region 122b. In this embodiment mode, boron (B) is used as an impurity element, and doping is performed using diborane ($B_2H_6$) as a doping gas containing an impurity element (in the doping gas, $B_2H_6$ is diluted with hydrogen ($H_2$), and the ratio of $B_2H_6$ in the gas is 15%) with a gas flow rate of 70 sccm, a beam current of 180 µA/cm, an acceleration voltage of 80 kV, and a dose of $2.0 \times 10^{15}$ ions/cm$^2$. Here, doping is performed so that the p-type impurity region 122a and the p-type impurity region 122b contain the impurity element imparting p-type conductivity at a concentration of about $1 \times 10^{20}$ to $5 \times 10^{21}$ atoms/cm$^3$. Further, a channel formation region 123 is formed in the semiconductor layer 103 (FIG. 8C).

The p-type impurity region 122a and the p-type impurity region 122b are high-concentration p-type impurity regions and serve as a source region and a drain region.

Next, a mask 125, which covers the semiconductor layer 103, is formed. An n-type impurity element 124 is added using the mask 125, the first gate electrode layer 113, the first gate electrode layer 114, the second gate electrode layer 117, the second gate electrode layer 118, the first control gate electrode layer 115, and the second control gate electrode layer 119 as masks, so that an n-type impurity region 126a, an n-type impurity region 126b, an n-type impurity region 127a, an n-type impurity region 127b, an n-type impurity region 128a, and an n-type impurity region 128b are formed. In this embodiment mode, phosphorus (P) is used as the impurity element. Here, the n-type impurity element is added so as to be contained at concentrations of approximately $5 \times 10^{19}$ to $5 \times 10^{20}$ atoms/cm$^3$ in the n-type impurity region 126a, the n-type impurity region 126b, the n-type impurity region 127a, the n-type impurity region 127b, the n-type impurity region 128a, and the n-type impurity region 128b. A channel formation region 129, a channel formation region 130, and a channel formation region 131 are formed in the semiconductor layer 104, the semiconductor layer 105, and the semiconductor layer 106, respectively (FIG. 9A).

The n-type impurity region 126a, the n-type impurity region 126b, the n-type impurity region 127a, the n-type impurity region 127b, the n-type impurity region 128a, and the n-type impurity region 128b are high-concentration n-type impurity regions and serve as sources and drains.

The mask 125 is removed by $O_2$ ashing or using a resist removing solution, and the oxide film is also removed. After that, an insulating film, namely, a so-called sidewall may be formed so as to cover side surfaces of the gate electrode layers. The sidewall can be formed of an insulating film containing silicon by a plasma CVD method or a low-pressure CVD (LPCVD) method.

In order to activate the impurity element, thermal treatment, intense light irradiation, or laser irradiation may be performed. At the same time as the activation, plasma damage to the gate insulating layer and plasma damage to an interface between the gate insulating layer and the semiconductor layer can be recovered.

Then, an interlayer insulating layer, which covers the gate electrode layers, the control gate electrode layers, and the gate insulating layers, is formed. In this embodiment mode, a stacked structure of an insulating film 167 and an insulating layer 168 is employed (FIG. 9B). The insulating film 167 and the insulating layer 168 may be formed of a silicon nitride film, a silicon nitride oxide film, a silicon oxynitride film, or a silicon oxide film by a sputtering method or a plasma CVD method. Alternatively, a single-layer structure or a stacked structure of three or more layers of another insulating film containing silicon may also be employed.

Further, heat treatment is performed in a nitrogen atmosphere at 300 to 550° C. for 1 to 12 hours, and the semiconductor layer is hydrogenated. Preferably, this step is performed at 400 to 500° C. This step is a step of terminating dangling bonds in the semiconductor layer with hydrogen contained in the insulating film 167 that is an interlayer insulating layer. In this embodiment mode, heat treatment is performed at 410° C. for one hour.

In addition, the insulating film 167 and the insulating layer 168 can also be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), or another substance containing an inorganic insulating material. A siloxane resin may also be used. Further, an organic insulating material such as polyimide, acrylic, polyamide, polyimide amide, resist, benzocyclobutene, or polysilazane can also be used. A coating film with a favorable planarity formed by a coating method may also be used.

The insulating film 167 and the insulating layer 168 can be formed using dipping, spray coating, a doctor knife, a roll coater, a curtain coater, a knife coater, a CVD method, an evaporation method, or the like. The insulating film 167 and the insulating layer 168 may also be formed by a droplet discharge method. In the case of using a droplet discharge method, a material solution can be saved. In addition, a method by which a pattern can be transferred or drawn similarly to a droplet discharge method such as, for example, a printing method (a method for forming a pattern, such as screen printing or offset printing) can also be used.

Then, contact holes (openings), which reach the semiconductor layers, are formed in the insulating film 167, the insulating layer 168, the gate insulating layers 108 and 109, and the insulating layer 110 using a mask made of resist. Etching may be performed once or plural times in accordance with a selection ratio of a material to be used. Etching is performed to remove the insulating film 167, the insulating layer 168, the gate insulating layers 108 and 109, and the insulating layer 110, so that the openings reaching the p-type impurity region 122a, the p-type impurity region 122b, the n-type impurity region 126a, the n-type impurity region 126b, the n-type impurity region 127a, the n-type impurity region 127b, the n-type impurity region 128a, and the n-type impurity region 128b, which are source regions and drain regions, are formed. Etching may be performed by wet etching, dry etching, or both of them. As an etchant of wet etching, a hydrofluoric acid-based solution such as a mixed solution of ammonium hydrogen fluoride and ammonium fluoride may be used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas to be used. As an inert element to be added, one or more of elements selected from He, Ne, Ar, Kr, or Xe can be used.

A conductive film is formed so as to cover the openings, and the conductive film is etched to form wiring layers 169a, 169b, 170a, 170b, 171a, 171b, 172a, and 172b, which are source electrode layers and drain electrode layers electrically connected to portions of respective source regions and drain regions. The wiring layers can be formed by forming a conductive film by a PVD method, a CVD method, an evaporation method, or the like, and then, etching the conductive film into a desired shape. Further, a conductive layer can be selectively formed in a predetermined position by a droplet discharge method, a printing method, an electroplating method, or the like. Moreover, a reflow method or a damascene method may also be used. As a material for the source electrode layers and drain electrode layers, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked structure of these materials may also be employed. In this embodiment mode, titanium (Ti) is formed to be 60 nm thick, a titanium nitride film is formed to be 40 nm thick, aluminum is formed to be 700 nm thick, and titanium (Ti) is formed to be 200 nm thick, so that a stacked structure can be formed, and then, the stacked structure is processed into a desired shape.

Through the above steps, a semiconductor device can be manufactured, in which a p-channel thin film transistor 173 having a p-type impurity region and an n-channel thin film transistor 174 having an n-type impurity region are provided in the driver circuit portion 204; and a memory element 175 having an n-type impurity region and an n-channel thin film transistor 176 having an n-type impurity region are provided in the memory cell array 206 (FIG. 9C).

In this embodiment mode, only the channel formation regions 123 and 129 are locally thinned in the thin film transistors 173 and 174. Therefore, regions that are in contact with the wiring layers 169a, 169b, 170a, and 170b that are source electrode layers and drain electrode layers, in the p-type impurity regions 122a and 122b and the n-type impurity regions 126a and 126b that are source regions and drain regions, are not thinned and thicker than the channel formation regions 123 and 129. Thus, when the openings (contact holes) which expose the source regions and the drain regions are formed, the semiconductor layers near the openings can be prevented from being removed entirely, and increase of contact resistance (between the semiconductor layers and the wiring layers) can be prevented. As a result, reduction in yield in a manufacturing process can be prevented and high performance of a semiconductor device can be realized.

Features of the semiconductor device of this embodiment mode are that the driver circuit portion 204 includes the thin film transistors 173 and 174 and the memory cell array 206 includes the memory element 175 and the thin film transistor 176, and that the channel formation regions of the semiconductor layers 103 and 104 included in the thin film transistors 173 and 174, which are provided in the driver circuit portion, are thinner than the channel formation regions of the semiconductor layers 105 and 106 included in the memory element 175 and the thin film transistor 176, which are provided in the memory cell array. Further, in the semiconductor layers 103 and 104 of the thin film transistors 173 and 174 provided in the driver circuit portion 204, the channel formation regions 123 and 129 are locally thinned and regions that are in contact with the source electrode layers and the drain electrode layers, in the source regions and the drain regions, are not thinned and thicker than the channel formation regions.

As in this embodiment mode, the gate insulating layer of the thin film transistors 173 and 174 provided in the driver circuit portion may be thinner than the gate insulating layer of the memory element 175 and the thin film transistor 176 provided in the memory cell array.

In the semiconductor device of this embodiment mode, the semiconductor layers of the thin film transistors 173 and 174 provided in the driver circuit portion each preferably have a thickness equal to or greater than 5 nm and equal to or less than 30 nm, and more preferably equal to or greater than 10 nm and equal to or less than 20 nm. On the other hand, the semiconductor layers of the memory element 175 and the thin film transistor 176 provided in the memory cell array each preferably have a thickness equal to or greater than 25 nm and equal to or less than 100 nm, and more preferably equal to or greater than 50 nm and equal to or less than 60 nm.

In the semiconductor device of this embodiment mode, the channel formation regions of the semiconductor layers included in the thin film transistors 173 and 174 provided in the driver circuit portion each preferably have a thickness equal to or greater than 5 nm and equal to or less than 30 nm, and more preferably equal to or greater than 10 nm and equal to or less than 20 nm. On the other hand, the source regions and the drain regions of the semiconductor layers included in the thin film transistors 173 and 174 provided in the driver circuit portion, and the semiconductor layers (the source regions, the drain regions, and the channel formation regions) included in the thin film transistor 176 and the memory element 175 provided in the memory cell array each preferably have a thickness equal to or greater than 25 nm and equal to or less than 100 nm, and more preferably equal to or greater than 50 nm and equal to or less than 60 nm.

In this embodiment mode, the channel formation regions of the semiconductor layers 103 and 104 included in the thin film transistors 173 and 174, which are provided in the driver circuit portion 204 for which high speed operation is required, are locally thinned (the thickness is preferably equal to or greater than 5 nm and equal to or less than 30 nm, and more preferably equal to or greater than 10 nm and equal to or less than 20 nm), and the regions of the source regions and the drain regions, which are in contact with the source electrode layers and the drain electrode layers respectively, are not thinned (the thickness is preferably equal to or greater than 25 nm and equal to or less than 100 nm, and more preferably equal to or greater than 50 nm and equal to or less than 60 nm).

In the semiconductor device of the present invention, the thickness of the gate insulating layer included in the thin film transistors 173 and 174, which are provided in the driver circuit portion, is preferably equal to or greater than 1 nm and equal to or less than 10 nm, and more preferably about 5 nm. On the other hand, the thickness of the gate insulating layer included in the memory element 175 and the thin film transistor 176, which are provided in the memory cell array, is preferably equal to or greater than 50 nm and equal to or less than 150 nm, and more preferably equal to or greater than 60 nm and equal to or less than 80 nm.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation regions of the semiconductor layers in the driver circuit portion, acts on an entire region of the channel formation region to be depleted, thereby suppressing the short-channel effect. In addition, the threshold voltage of the thin film transistors can be reduced. Accordingly, miniaturization and high performance of the thin film transistors that are provided in the driver circuit portion can be realized. Therefore, low voltage driving of the semiconductor device can be performed, and low power consumption can be realized. Since miniaturization of the thin film transistors can be realized by thinning the semiconductor layers (or, the gate insulating layer as well), reduction in area of the driver circuit portion and the control circuit portion can be achieved, and miniaturization of the semiconductor device can be realized.

In this embodiment mode, the thin film transistors 173 and 174 provided in the driver circuit portion each preferably have a channel length shorter than the memory element 175 and the thin film transistor 176 provided in the memory cell array. The channel lengths of the thin film transistors 173 and 174 of this embodiment mode provided in the driver circuit portion are each preferably 0.1 μm to 1 μm. In addition, the channel length of the memory element 175 and the thin film transistor 176 provided in the memory cell array is preferably 1 μm to 5 μm (more preferably, 1 μm to 3 μm).

Furthermore, since only the channel formation regions are locally thinned in the thin film transistors 173 and 174 for which high speed operation is required, regions in the source regions and the drain regions, which are in contact with the wiring layers that are source electrode layers and drain electrode layers, are not thinned and thicker than the channel formation regions. Thus, when the openings (contact holes) which expose the source regions and the drain regions are formed, the semiconductor layers near the openings can be prevented from being removed entirely, and increase of contact resistance (between the semiconductor layers and the wiring layers) can be prevented. As a result, reduction in yield in a manufacturing process can be prevented and high performance of a semiconductor device can be realized.

On the other hand, the semiconductor layers (or, the gate insulating layer as well) of the memory element 175 and the thin film transistor 176 provided in the memory cell array are made thicker than that of the driver circuit portion; accordingly, a semiconductor device having high withstand voltage with respect to driving voltage and high reliability can be provided.

Thus, a semiconductor device of the present invention can have low power consumption and high reliability.

EMBODIMENT MODE 5

Embodiment Mode 5 will describe an example of a semiconductor device having a memory, as a semiconductor device with low power consumption and high reliability, with reference to the drawings. In this embodiment mode, an example in which silicides are provided in the source regions and the drain regions of the thin film transistors and the memory element in the semiconductor device manufactured in Embodiment Mode 4, will be described. Therefore, repeated description for the same portion or a portion having a similar function to that in Embodiment Mode 4 is omitted.

FIG. 10A shows a semiconductor device in a manufacturing process and shows a step next to the manufacturing step of the semiconductor device of FIG. 8C that is described in Embodiment Mode 4. In FIGS. 10A to 11C, thin film transistors with different characteristics are selectively formed over the same substrate.

A mask 751 is formed to cover the semiconductor layer 103. An impurity element 750 imparting n-type conductivity is added using the mask 751, the first gate electrode layers 113 and 114, the second gate electrode layers 117 and 118, the first control gate electrode layer 115, and the second control gate electrode layer 119 as masks, so that a first n-type impurity region 752a, a first n-type impurity region 752b, a first n-type impurity region 753a, a first n-type impurity region 753b, a first n-type impurity region 754a, and a first n-type impurity region 754b are formed (FIG. 10A). Here, the impurity element imparting n-type conductivity is added so as to be contained at concentrations of about $1\times10^{17}$ to $5\times10^{18}$ atoms/cm$^3$ in the first n-type impurity region 752a, the first n-type impurity region 752b, the first n-type impurity region 753a, the first n-type impurity region 753b, the first n-type impurity region 754a, and the first n-type impurity region 754b. In this embodiment mode, phosphorus (P) is used as the impurity element imparting n-type conductivity.

The gate electrode layers 108 and 109 and the insulating layer 110 are selectively removed using the first gate electrode layers 112, 113, and 114, the second gate electrode layers 116, 117, and 118, the first control gate electrode layer 115, and the second control gate electrode layer 119 as masks, so that gate insulating layers 762, 763, and 765, a first insulating layer 764, and a second insulating layer 761 are formed.

Insulating layers 708a to 708h having a sidewall structure are formed on side surfaces of the first gate electrode layers 112, 113, and 114, the second gate electrode layers 116, 117, and 118, the first control gate electrode layer 115, and the second control gate electrode layer 119, the gate insulating layers 762, 763, and 765, the first insulating layer 764, and the second insulating layer 761 (FIG. 10B). The insulating layers 708a to 708h having a sidewall structure may be formed in a self-aligning manner by forming an insulating layer, which covers the gate electrode layers and the semiconductor layers, and processing the insulating layer by anisotropic etching of an RIE (reactive ion etching) method. Here, the insulating layer is not particularly limited. However, it is preferable that the insulating layer includes silicon oxide formed to have good step coverage, which is formed by reacting TEOS (Tetra-Ethyl-Ortho-Silicate), silane, or the like with oxygen, nitrous oxide, or the like. The insulating layer can be formed by a thermal CVD method, a plasma CVD method, an atmospheric pressure CVD method, a bias ECR CVD method, a sputtering method, or the like.

A mask 710, which covers the semiconductor layer 103, is formed. An impurity element 709 imparting n-type conductivity is added using the mask 710, the second gate electrode layer 117, the second gate electrode layer 118, the second control gate electrode layer 119, and the insulating layers 708a to 708h as masks, so that second n-type impurity regions 711a, 711b, 712a, 712b, 717a, and 717b, and third n-type impurity regions 713a, 713b, 714a, 714b, 718a, and 718b are formed. In this embodiment mode, phosphorus (P) that is an impurity element imparting n-type conductivity is used as the impurity element 709 imparting one conductivity type. The impurity element imparting n-type conductivity is added so as to be contained at concentrations of about $5\times10^{19}$ to $5\times10^{20}$ atoms/cm$^3$ in the second n-type impurity regions 711a, 711b, 712a, 712b, 717a, and 717b. Further, a channel formation region 715, a channel formation region 716, and a channel formation region 719 are formed in the semiconductor layer 104, the semiconductor layer 105, and the semiconductor layer 106, respectively (FIG. 10C).

The second n-type impurity regions 711a, 711b, 712a, 712b, 717a, and 717b are high-concentration impurity regions and serve as sources and drains. On the other hand, the third n-type impurity regions 713a, 713b, 714a, 714b, 718a, and 718b are low-concentration impurity regions and serve as LDD (Lightly Doped Drain) regions. Accordingly, a semiconductor device with higher reliability and less power consumption can be manufactured.

A conductive film 766 is formed over the semiconductor layers 103, 104, 105, and 106, the insulating layers 708a to 708h, the second gate electrode layers 116, 117, and 118, and the second control gate electrode layer 119 (FIG. 10D). The conductive film 766 is formed using a material such as titanium (Ti), nickel (Ni), tungsten (W), molybdenum (Mo), cobalt (Co), zirconium (Zr), hafnium (Hf), tantalum (Ta), vanadium (V), neodymium (Nb), chromium (Cr), platinum (Pt), palladium (Pd), or the like. Here, a nickel film is formed by a sputtering method.

Next, silicon in the semiconductor layers of the exposed source regions and the drain regions is reacted with the conductive film 766 by heat treatment, a GRTA method, an LRTA method, or the like, to form silicides 767a, 767b, 768a, 768b, 769a, 769b, 770a, and 770b. Alternatively, the silicides may be formed by laser irradiation or light irradiation using a lamp. Then, part of the conductive film 766, which is not reacted with the semiconductor layers, is removed (FIG. 11A).

Next, an insulating film 772 containing hydrogen is formed as a passivation film. This insulating film 772 may be formed by forming an insulating film containing silicon with a thickness of 100 to 200 nm by a plasma CVD method or a sputtering method, and can be formed using a material and a process similar to those of the insulating film 311 described in Embodiment Mode 1.

Further, thermal treatment is performed in a nitrogen atmosphere at 300 to 550° C. for 1 to 12 hours to hydrogenate the semiconductor layers. Preferably, it is performed at 400 to 500° C. This step is a step of terminating dangling bonds of the semiconductor layers with hydrogen contained in the insulating film 772.

Figures 11A, 11B, 11C:
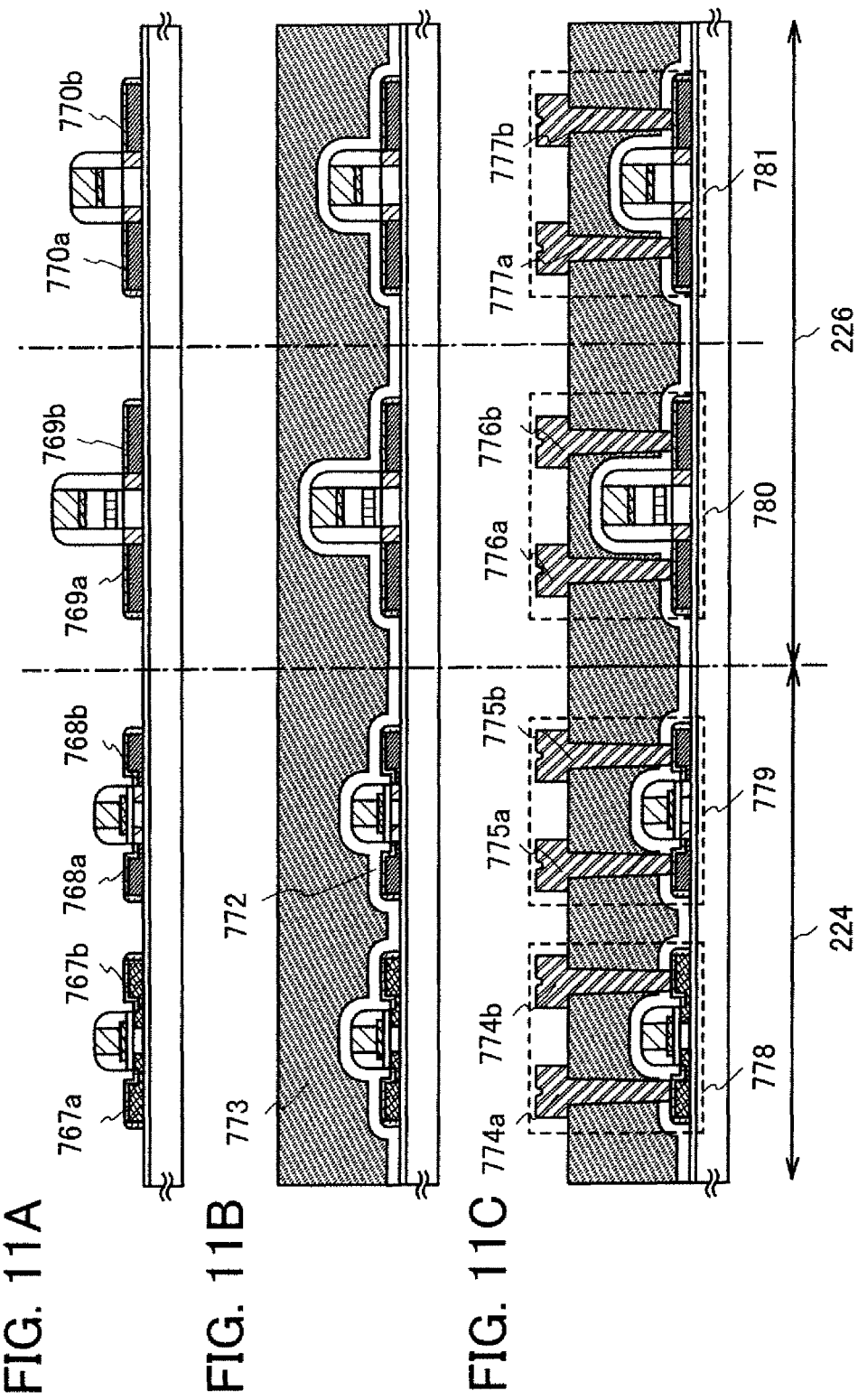
FIGS. 11A to 11C show a manufacturing method of a semiconductor device according to the present invention.

Next, an insulating layer 773 serving as an interlayer insulating film is formed (FIG. 11B). In the present invention, the interlayer insulating film provided for planarization is required to have high heat resistance, a high insulating property, and high planarity. The insulating layer 773 can be formed using a material and a process similar to those of the insulating layer 319 described in Embodiment Mode 1.

Contact holes (openings) reaching the semiconductor layers 103, 104, 105, and 106 are formed in the insulating film 772 and the insulating layer 773 using a mask formed of a resist. Etching may be performed once or plural times in accordance with a selection ratio of a material to be used. By etching, the openings reaching the silicides 767a, 767b, 768a, 768b, 769a, 769b, 770a, and 770b, which are source regions and drain regions, are formed.

A conductive film is formed and etched to form wiring layers 774a, 774b, 775a, 775b, 776a, 776b, 777a, and 777b, which are source electrode layers and drain electrode layers electrically connected to the silicides 767a, 767b, 768a, 768b, 769a, 769b, 770a, and 770b, respectively. The wiring layers 774a, 774b, 775a, 775b, 776a, 776b, 777a, and 777b can be formed by forming the conductive film by a PVD method, a CVD method, an evaporation method, or the like, and then, etching the conductive film into a desired shape. Alternatively, a conductive layer can be selectively formed in a predetermined position by a droplet discharge method, a printing method, an electroplating method, or the like. Moreover, a reflow method or a damascene method may also be used. As a material for the wiring layers 774a, 774b, 775a, 775b, 776a, 776b, 777a, and 777b, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked structure of these materials such as Ti/Al/Ti may also be employed.

Although the example in which the silicides 767a, 767b, 768a, 768b, 769a, 769b, 770a, and 770b are formed in surface portions of the impurity regions that are the source regions and the drain regions, is shown, silicides may be formed in a deeper region or in the entire region of the impurity regions. Silicides can be controlled by the thickness of the conductive film and heat conditions (such as temperature and time).

Through the above steps, a semiconductor device can be manufactured, in which a p-channel thin film transistor 778 having a p-type impurity region and an n-channel thin film transistor 779 having an n-type impurity region are provided in the driver circuit portion 224; and a memory element 780 having an n-type impurity region and an n-channel thin film transistor 781 having an n-type impurity region are provided in the memory cell array 226 (FIG. 11C). Further, since the thin film transistors 778, 779, and 781 and the memory element 780 each have a silicide structure, reduction in resistance of the source regions and the drain regions is possible, so that higher speed operation of a semiconductor device can be realized. Moreover, since operation at low voltage is possible, power consumption can be reduced.

In this embodiment mode, only the channel formation regions are locally thinned in the thin film transistors 778 and 779. Therefore, regions that are in contact with the wiring layers 774a, 774b, 775a, and 775b, which are source electrode layers and drain electrode layers, in the impurity regions containing silicides, which are source regions and drain regions, are not thinned and thicker than the channel formation regions. Thus, when the openings (contact holes) which expose the source regions and the drain regions are formed, the semiconductor layers near the openings can be prevented from being removed entirely, and increase of contact resistance (between the semiconductor layers and the wiring layers) can be prevented. As a result, reduction in yield in a manufacturing process can be prevented and high performance of a semiconductor device can be realized.

Features of the semiconductor device of this embodiment mode are that the driver circuit portion 224 includes the thin film transistors 778 and 779 and the memory cell array 226 includes the memory element 780 and the thin film transistor 781, and that the semiconductor layers included in the thin film transistors 778 and 779, which are provided in the driver circuit portion, are thinner than the semiconductor layers included in the memory element 780 and the thin film transistor 781, which are provided in the memory cell array. As in this embodiment mode, the gate insulating layer of the thin film transistors 778 and 779 provided in the driver circuit portion may be thinner than the gate insulating layer of the memory element 780 and the thin film transistor 781 provided in the memory cell array.

In the semiconductor device of this embodiment mode, the semiconductor layers of the thin film transistors 778 and 779 provided in the driver circuit portion each preferably have a thickness equal to or greater than 5 nm and equal to or less than 30 nm, and more preferably equal to or more than 10 nm and equal to or less than 20 nm. On the other hand, the semiconductor layers of the memory element 780 and the thin film transistor 781 provided in the memory cell array each preferably have a thickness equal to or greater than 25 nm and equal to or less than 100 nm, and more preferably equal to or greater than 50 nm and equal to or less than 60 nm.

Features of the semiconductor device of this embodiment mode are that the driver circuit portion 224 includes the thin film transistors 778 and 779 and the memory cell array 226 includes the memory element 780 and the thin film transistor 781, and that the channel formation regions of the semiconductor layers included in the thin film transistors 778 and 779, which are provided in the driver circuit portion, are thinner than the channel formation regions of the semiconductor layers included in the memory element 780 and the thin film transistor 781, which are provided in the memory cell array 226. Further, in the semiconductor layers of the thin film transistors 778 and 779 provided in the driver circuit portion 224, the channel formation regions are locally thinned and regions that are in contact with the source electrode layers and the drain electrode layers, in the source regions and the drain regions, are not thinned and thicker than the channel formation regions.

As in this embodiment mode, the gate insulating layer of the thin film transistors 778 and 779 provided in the driver circuit portion 224 may be thinner than the gate insulating layer of the memory element 780 and the thin film transistor 781 provided in the memory cell array.

In the semiconductor device of this embodiment mode, the semiconductor layers of the thin film transistors 778 and 779 provided in the driver circuit portion 224 each preferably have a thickness equal to or greater than 5 nm and equal to or less than 30 nm, and more preferably equal to or more than 10 nm and equal to or less than 20 nm. On the other hand, the semiconductor layers of the memory element 780 and the thin film transistor 781 provided in the memory cell array 226 each preferably have a thickness equal to or greater than 25 nm and equal to or less than 100 nm, and more preferably equal to or greater than 50 nm and equal to or less than 60 nm.

In the semiconductor device of this embodiment mode, the channel formation regions of the semiconductor layers included in the thin film transistors 778 and 779 provided in the driver circuit portion 224 each preferably have a thickness equal to or greater than 5 nm and equal to or less than 30 mm, and more preferably equal to or greater than 10 nm and equal to or less than 20 nm. On the other hand, the source regions and the drain regions of the semiconductor layers included in the thin film transistors 778 and 779 provided in the driver circuit portion 224, and the semiconductor layers (the source regions, the drain regions, and the channel formation regions) included in the memory element 780 and the thin film transistor 781 provided in the memory cell array 226 each preferably have a thickness equal to or greater than 25 nm and equal to or less than 100 nm, and more preferably equal to or greater than 50 nm and equal to or less than 60 nm.

In this embodiment mode, the channel formation regions of the semiconductor layers included in the thin film transistors 778 and 779, which are provided in the driver circuit portion 224, for which high speed operation is required, are locally thinned (the thickness is preferably equal to or greater than 5 nm and equal to or less than 30 nm, and more preferably equal to or greater than 10 nm and equal to or less than 20 nm), and the regions of the source regions and the drain regions, which are in contact with the source electrode layers and the drain electrode layers respectively, are not thinned (the thickness is preferably equal to or greater than 25 nm and equal to or less than 100 nm, and more preferably equal to or greater than 50 nm and equal to or less than 60 nm).

In the semiconductor device of the present invention, the gate insulating layer included in the thin film transistors 778 and 779 that are provided in the driver circuit portion preferably has a thickness equal to or greater than 1 nm and equal to or less than 10 nm, and more preferably about 5 nm. On the other hand, the gate insulating layer included in the memory element 780 and the thin film transistor 781 that are provided in the memory cell array preferably has a thickness equal to or greater than 50 nm and equal to or less than 150 nm, and more preferably equal to or greater than 60 nm and equal to or less than 80 nm.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation regions of the semiconductor layers in the driver circuit portion, acts on an entire region of the channel formation regions to be depleted, thereby suppressing the short-channel effect. In addition, the threshold voltage of the thin film transistors can be reduced. Accordingly, miniaturization and high performance of the thin film transistors that are provided in the driver circuit portion can be realized. Therefore, low voltage driving of the semiconductor device can be performed, and low power consumption can be realized. Since miniaturization of the thin film transistors can be realized by thinning the semiconductor layers (or, the gate insulating layer as well), reduction in area of the driver circuit portion and the control circuit portion can be achieved, and miniaturization of the semiconductor device can be realized.

In this embodiment mode, the thin film transistors 778 and 779 provided in the driver circuit portion each preferably have a channel length shorter than the memory element 780 and the thin film transistor 781 provided in the memory cell array. The channel lengths of the thin film transistors 778 and 779 of this embodiment mode provided in the driver circuit portion are each preferably 0.1 μm to 1 μm. In addition, the channel lengths of the memory element 780 and the thin film transistor 781 provided in the memory cell array are each preferably 1 μm to 5 μm (more preferably, 1 μm to 3 μm).

Furthermore, since only the channel formation regions are locally thinned in the thin film transistors 778 and 779 for which high speed operation is required, regions in the source regions and the drain regions, which are in contact with the wiring layers that are source electrode layers and drain electrode layers, are not thinned and thicker than the channel formation regions. Thus, when the openings (contact holes) which expose the source regions and the drain regions are formed, the semiconductor layers near the openings can be prevented from being removed entirely, and increase of contact resistance (between the semiconductor layers and the wiring layers) can be prevented. As a result, reduction in yield in a manufacturing process can be prevented and high performance of a semiconductor device can be realized.

On the other hand, the semiconductor layers (or, the gate insulating layer as well) of the memory element 780 and the thin film transistor 781 provided in the memory cell array are made thicker than those of the driver circuit portion; accordingly, a semiconductor device having high withstand voltage with respect to driving voltage and high reliability can be provided.

Thus, a semiconductor device of the present invention can have low power consumption and high reliability.

EMBODIMENT MODE 6

Embodiment Mode 6 will describe an example of a nonvolatile semiconductor memory device as a semiconductor device with low power consumption and high reliability, with reference to the drawings.

A nonvolatile memory element is similar in structure to a MOSFET (metal oxide semiconductor field effect transistor), and includes a region capable of accumulating charges for a long time, over a channel formation region. Since such a charge accumulation region is formed over an insulating layer and electrically insulated from surrounding regions, it is also called a floating gate electrode layer. In addition, since the floating gate electrode layer has a function of accumulating charges, it is also called a charge accumulation layer. In this specification, the charge accumulation region including the floating gate electrode layer is mainly called a charge accumulation layer. Over the floating gate electrode layer, a control gate electrode layer is further provided with an insulating layer interposed therebetween.

In a so-called floating-gate nonvolatile semiconductor memory device having the above-described structure (also simply referred to as a semiconductor device), charges are accumulated in or released from the charge accumulation layer by voltage applied to the control gate electrode layer. That is, by injecting or releasing charges into/from the charge accumulation layer, data can be stored. Specifically, injection and releasing of charges into/from the charge accumulation layer are conducted by applying a high voltage between the control gate electrode layer and the semiconductor layer in which the channel formation region is formed. At this time, it is considered that Fowler-Nordheim (F—N) tunnel current (in the case of a NAND type) or thermoelectrons (in the case of a NOR type) flow through the insulating layer over the channel formation region. Therefore, this insulating layer is also called a tunnel insulating layer.

By combining the semiconductor layer, the charge accumulation layer, and the control gate electrode layer with various sizes, it becomes possible to control the capacitance that is stored in a second gate insulating layer between the charge accumulation layer and the control gate electrode layer and also control the capacitance that is stored in a first insulating layer between the charge accumulation layer and the semiconductor layer. Therefore, a value of the voltage applied thereto can also be controlled.

As a method for injecting electrons into the charge accumulation layer, there is a method using thermoelectrons or a method using F—N tunnel current. In the case of utilizing thermoelectrons, a positive voltage is applied to the control gate electrode layer and a high voltage is applied to the drain so that thermoelectrons are generated. Therefore, thermoelectrons can be injected into the charge accumulation layer. In the case of utilizing F—N tunnel current, a positive voltage is applied to the control gate electrode layer so that electrons are injected from the semiconductor layer into the charge accumulation layer by F—N tunnel current.

Figure 12:
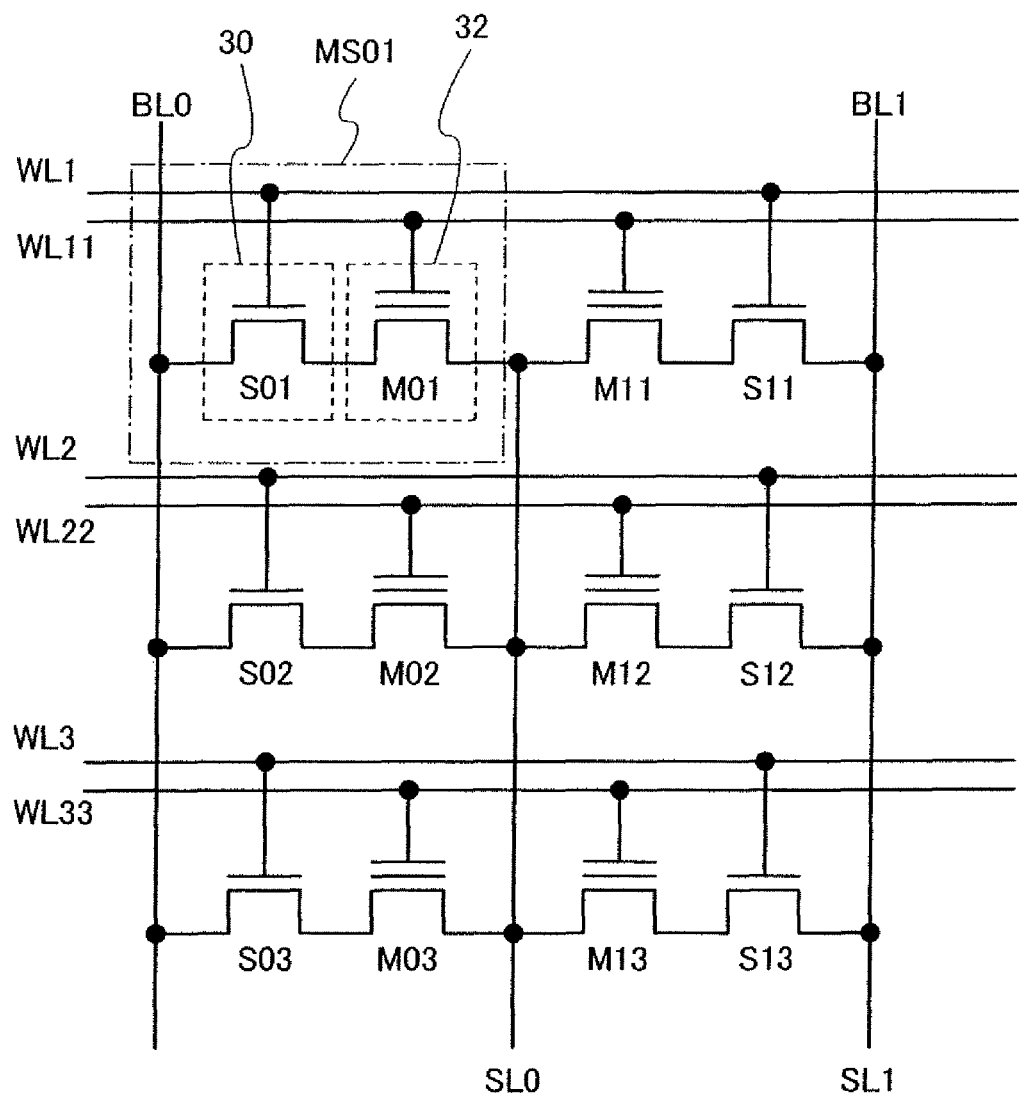
FIG. 12 shows an example of an equivalent circuit of a semiconductor device.

As examples of a semiconductor device using the present invention, various modes of nonvolatile semiconductor memory devices having nonvolatile memory elements can be given. FIG. 12 shows an exemplary equivalent circuit of a nonvolatile memory cell array. A memory cell MS01 which stores data of 1 bit includes a selection transistor S01 and a nonvolatile memory element M01. The selection transistor S01 is connected in series between a bit line BL0 and the nonvolatile memory element M01, and a gate of the selection transistor S01 is connected to a word line WL1. A gate of the nonvolatile memory element M01 is connected to a word line WL11. When writing data into the nonvolatile memory element M01, the word line WL1 and the bit line BL0 are set at H level, a bit line BL1 is set at L level, and a high voltage is applied to the word line WL11, so that charges are accumulated in the charge accumulation layer in the above-described manner. When deleting data, the word line WL1 and the bit line BL0 may be set at H level, and a high voltage of negative polarity may be applied to the word line WL11.

In this memory cell MS01, when the selection transistor S01 and the nonvolatile memory element M01 are formed using semiconductor layers 30 and 32 respectively, it is possible to prevent mutual interference with other selection transistors or nonvolatile memory elements. In addition, since both of the selection transistor S01 and the nonvolatile memory element M01 included in the memory cell MS01 are n-channel transistors, when the two elements are formed using one semiconductor layer, a wiring for connecting the two elements can be omitted.

Figure 13:
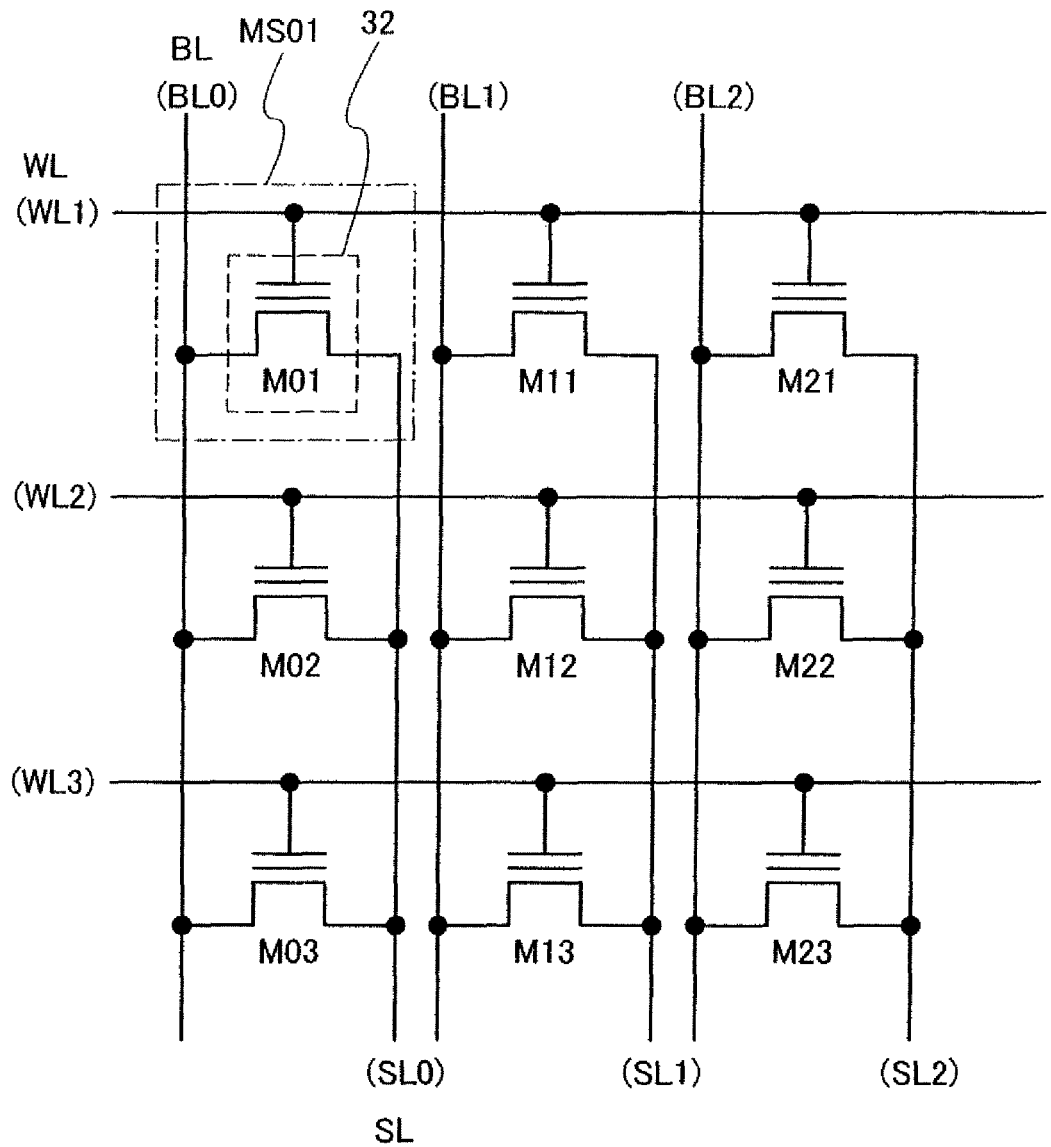
FIG. 13 shows an example of an equivalent circuit of a semiconductor device.

FIG. 13 shows an equivalent circuit of a NOR-type memory cell array in which nonvolatile memory elements are connected to a bit line. In this memory cell array, word lines WL and bit lines BL are disposed to intersect with each other, and a nonvolatile memory element is disposed at each intersection portion. In the NOR-type memory cell array, drains of the individual nonvolatile memory elements are connected to the bit line BL, and sources of the nonvolatile memory elements are commonly connected to the source line SL.

Further, when a plurality of nonvolatile memory elements (e.g., M01 to M23 shown in FIG. 13) is regarded as one block, and the nonvolatile memory elements in one block are formed using a semiconductor layer, a deletion operation can be conduced per block.

The operation of the NOR-type memory cell array is as follows. In data writing, the source line SL is set at 0 V, a high voltage is applied to the word line WL which is selected for data writing, and a potential corresponding to the data of "0" or "1" is applied to the bit line BL. For example, a H-level potential corresponding to "0" or a L-level potential corresponding to "1" is applied to the bit line BL. In the nonvolatile memory element to which a H-level potential is applied to write the data of "0", hot electrons are generated in the vicinity of the drain and then injected into the charge accumulation layer. In writing the data of "1", such electron injection does not occur.

In the memory cell which has received the data of "0", hot electrons, which are generated in the vicinity of the drain due to a strong transverse electric field between the drain and the source, are injected into the charge accumulation layer. The state in which the threshold voltage is increased with the electrons injected into the charge accumulation layer corresponds to "0". When writing the data of "1", hot electrons are not generated and a state that the threshold voltage remains low without electrons injected into the charge accumulation layer, i.e., a deleted state is retained.

When deleting data, a positive voltage of about 10 V is applied to the source line SL, and the bit line BL is set in a floating state. Then, by applying a high voltage of negative polarity to the word line WL (applying a high voltage of negative polarity to the control gate), electrons are extracted from the charge accumulation layer. Accordingly, a deleted state with the data of "1" is obtained.

The data reading is conducted through the steps of: setting the source line SL at 0 V, setting the bit line BL at about 0.8 V, applying a reading voltage that is set at an intermediate value between the threshold voltages of the data "0" and "1" to the selected world line WL, and judging the presence of a current drawn into the nonvolatile memory element, using a sense amplifier which is connected to the bit line BL.

Figure 14:
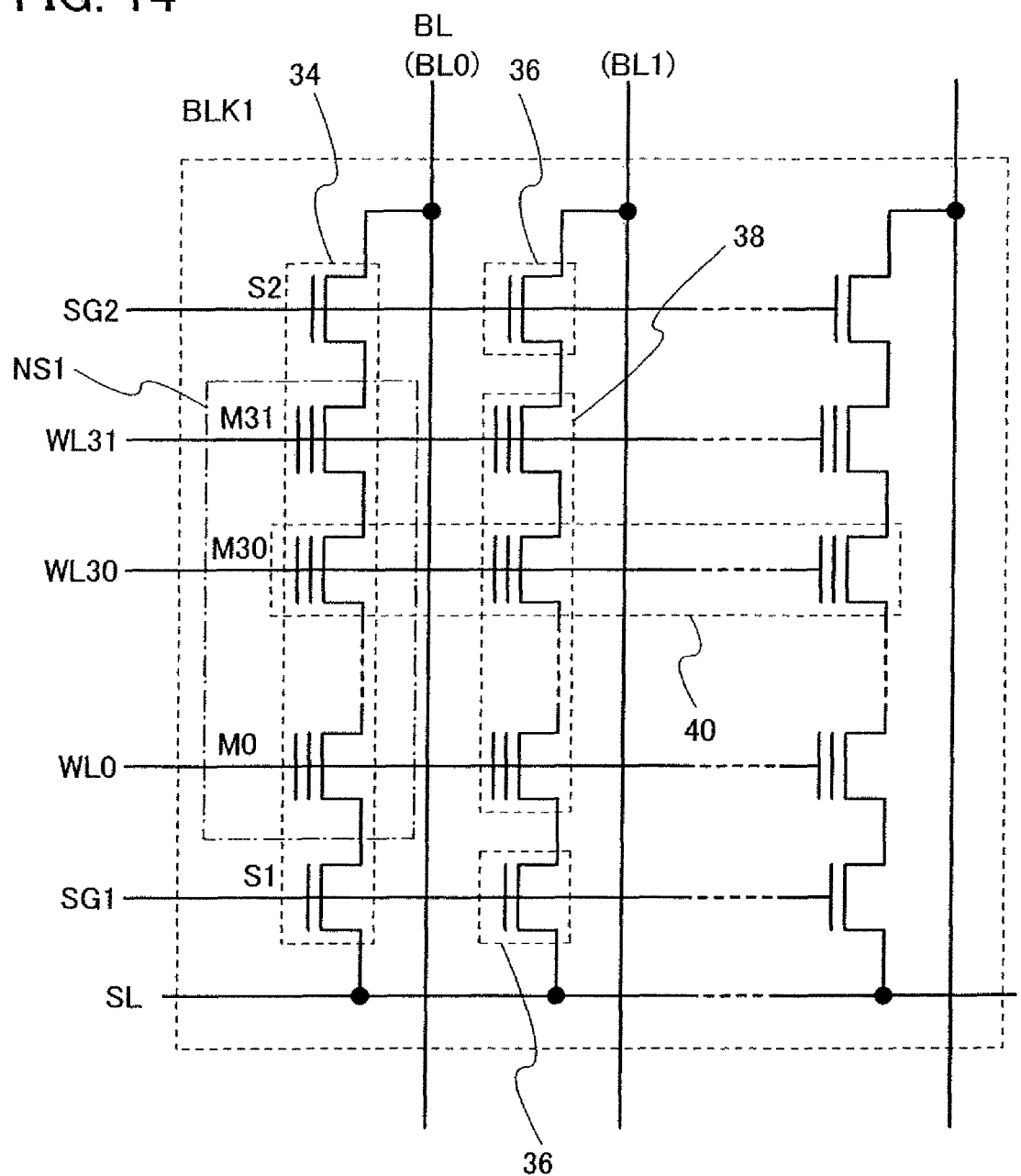
FIG. 14 shows an example of an equivalent circuit of a semiconductor device.

FIG. 14 shows an equivalent circuit of a NAND-type memory cell array. A bit line BL is connected to a NAND-type cell NS1 which has a plurality of nonvolatile memory elements connected in series. A plurality of NAND-type cells forms one block BLK. A block BLK1 shown in FIG. 14 has 32 word lines (word lines WL0 to WL31). Nonvolatile memory elements positioned in the same row in the block BLK1 are commonly connected to the word line corresponding to the row.

In this case, since selection transistors S1 and S2 and nonvolatile memory elements M0 to M31 are connected in series, these elements may be formed together by using one semiconductor layer 34. Accordingly, a wiring for connecting the nonvolatile memory elements can be omitted, and the degree of integration can be increased. Further, separation of the adjacent NAND-type cells can be conducted easily. It is also possible to separately form a semiconductor layer 36 of the selection transistors S1 and S2 and a semiconductor layer 38 of the NAND-type cell. When conducting a deletion operation by which charges are extracted from the charge accumulation layers of the nonvolatile memory elements M0 to M31, the deletion operation can be conducted per NAND-type cell. In addition, it is also possible to form the nonvolatile memory elements which are commonly connected to one word line (e.g., in the row of M30) by using one semiconductor layer 40.

The writing operation is conducted after setting the NAND-type cell NS1 to a deleted state, i.e., the state in which the threshold voltage of each nonvolatile memory element in the NAND-type cell NS1 is set at a negative value. Writing is conducted sequentially starting from the memory element M0 on the source line SL side. Data writing into the nonvolatile memory element M0 is exemplarily described below.

FIG. 23A shows the case of writing "0". The selection transistor S2 is turned on by applying, for example, $V_{cc}$ (the power supply voltage) to a selection gate line SG2, and the bit line BL is set at 0 V (the ground voltage). The selection transistor S1 is turned off by setting a selection gate line SG1 at 0 V. Next, a word line WL0 connected to the memory element M0 is set at a high voltage $V_{pgm}$ (about 20 V), and the other word lines are set at an intermediate voltage $V_{pass}$ (about 10 V). Since the voltage of the bit line BL is 0 V, the potential of the channel formation region of the selected memory element M0 is also 0 V. Thus, there is a big potential difference between the word line WL0 and the channel formation region, and therefore, electrons are injected into the charge accumulation layer of the memory element M0 due to F—N tunnel current in the above-described manner. Accordingly, the threshold voltage of the memory element M0 has a positive value (the state in which "0" is written).

On the other hand, in the case of writing "1", the bit line BL is set at, for example, $V_{cc}$ (the power supply voltage) as shown in FIG. 23B. Since the selection gate line SG2 has a voltage $V_{cc}$, the selection transistor S2 is turned off when the threshold voltage $V_{th}$ of the selection transistor S2 is higher than $V_{cc}$ ($V_{th}>V_{cc}$). Therefore, the channel formation region of the memory element M0 is brought into a floating state. Next, when a high voltage $V_{pgm}$ (20 V) is applied to the word line WL0 and an intermediate voltage $V_{pass}$ (10V) is applied to the other word lines, the voltage of the channel formation region increases from Vcc-Vth to, for example, about 8 V by the capacitive coupling of each word line and the channel formation region. Although the voltage of the channel formation region is increased, there is a small potential difference between the word line WL0 and the channel formation region unlike the case of writing "0". Therefore, electron injection into the charge accumulation layer of the memory element M0 due to F—N tunnel current does not occur. Thus, the threshold voltage of the memory element M0 is kept at a negative value (the state in which "1" is written).

Figure 24A:
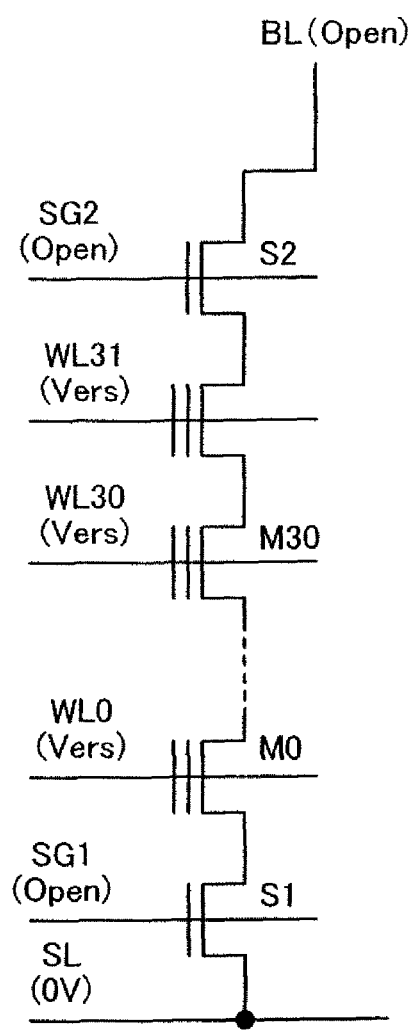
FIGS. 24A and 24B show erasing operation and reading operation of a semiconductor device.

In the case of conducting a deletion operation, as shown in FIG. 24A, a high voltage of negative polarity ($V_{ers}$) is applied to all word lines in a selected block. The bit line BL and the source line SL are made in a floating state. Then, electrons in the charge accumulation layer of the all memory elements in the block can be released to the semiconductor layer due to tunnel current. As a result, the threshold voltage of these memory elements shifts in the negative direction.

Figure 24B:
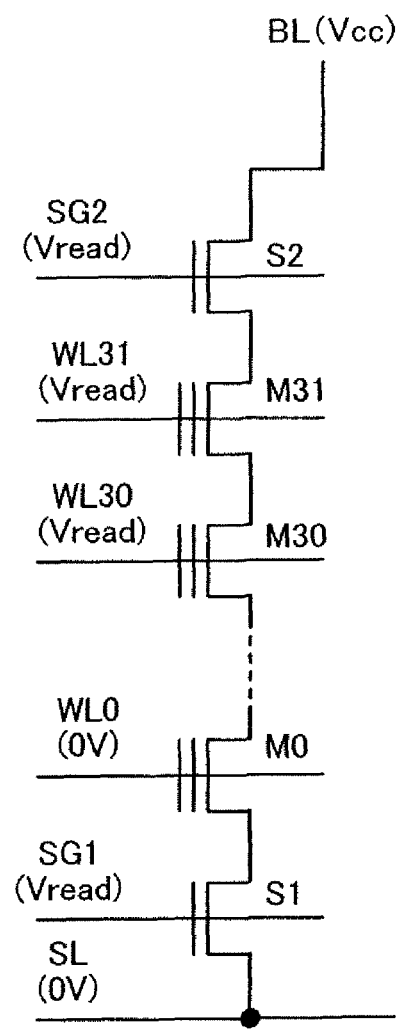

In the reading operation shown in FIG. 24B, the word line WL0 connected to the memory element M0 which is selected to read out data is set at a voltage $V_r$ (e.g., 0 V), while the word lines WL1 to WL31 connected to the non-selected memory elements and the selection gate lines SG1 and SG2 are set at an intermediate voltage $V_{read}$ that is a little higher than the power supply voltage. That is, as shown in FIG. 13, the memory elements other than the selected memory element function as transfer transistors. Accordingly, it is detected whether a current is flowing into the memory element M0 which is selected to read out data. That is, when data stored in the memory element MO is "0", the memory element M0 is off; therefore, the bit line BL is not discharged. On the other hand, when data stored in the memory element M0 is "1", the memory element M0 is on; therefore, the bit line BL is discharged.

FIG. 17 shows an example of a circuit block diagram of a nonvolatile semiconductor memory device. In the nonvolatile semiconductor memory device, a memory cell array 52 and a peripheral circuit 54 are formed over the same substrate. The memory cell array 52 has the configuration shown in FIG. 12, 13, or 14. The peripheral circuit 54 has the following configuration.

A row decoder 62 for selecting word lines and a column decoder 64 for selecting bit lines are provided around the memory cell array 52. An address is transmitted to a control circuit 58 through an address buffer 56, and an internal row address signal and an internal column address signal are transmitted to the row decoder 62 and the column decoder 64, respectively.

In order to write or delete data, a potential obtained by boosting the power supply potential is used. Therefore, a booster circuit 60 which is controlled by the control circuit 58 corresponding to the operation mode is provided. The output of the booster circuit 60 is supplied to word lines WL and bit lines BL through the row decoder 62 and the column decoder 64. Data output from the column decoder 64 is input to a sense amplifier 66. Data read out by the sense amplifier 66 is held in a data buffer 68, and the data is randomly accessed by the control of the control circuit 58. Then, the accessed data is output through a data input/output buffer 70. Meanwhile, data to be written is, after being input through the data input/output buffer 70, once held in the data buffer 68, and then transferred to the column decoder 64 by the control of the control circuit 58.

In this manner, in the nonvolatile semiconductor memory device, the memory cell array 52 is required to use a potential which is different from the power supply potential. Therefore, it is desirable that at least the memory cell array 52 and the peripheral circuit 54 be electrically insulated from each other.

In the semiconductor device of this embodiment mode, different functions are required for a plurality of thin film transistors that are provided over the same substrate, depending on the circuit formed (or depending on the role of each thin film transistor). By applying the present invention, thin film transistors having different film thicknesses can be formed in accordance with the required function; accordingly, characteristics of the thin film transistors can be controlled.

Features of the semiconductor device of this embodiment mode are that each of the memory cell array 52, the booster circuit 60, the row decoder 62 and the column decoder 64, which are driver circuit portions, and the control circuit 58, which conducts data writing and reading, includes a thin film transistor; and that the channel formation regions of the semiconductor layers included in the thin film transistors provided in the row decoder 62, the column decoder 64, and the control circuit 58 are thinner than the channel formation regions of the semiconductor layers included in the thin film transistors provided in the memory cell array 52 and the booster circuit 60. The gate insulating layer of the thin film transistors provided in the row decoder 62, the column decoder 64, and the control circuit 58 may be thinner than the gate insulating layer of the thin film transistors provided in the memory cell array 52 and the booster circuit 60.

In the semiconductor device of this embodiment mode, each of the memory cell array 52, the booster circuit 60, the row decoder 62 and the column decoder 64, which are driver circuit portions, and the control circuit 58, which conducts data writing and reading, includes a thin film transistor. The channel formation regions of the semiconductor layers included in the thin film transistors provided in the row decoder 62, the column decoder 64, and the control circuit 58 are locally thinned and made thinner than the channel formation regions of the semiconductor layers included in the thin film transistors provided in the memory cell array 52 and the booster circuit 60. Since only the channel formation regions are locally thinned in the thin film transistors provided in the row decoder 62, the column decoder 64, and the control circuit 58 for which high speed operation is required, regions in the source regions and the drain regions, which are in contact with source electrode layers and drain electrode layers, are not thinned and thicker than the channel formation regions. The gate insulating layer of the thin film transistors, for which high speed operation is required, is preferably thinner than the gate insulating layer of the thin film transistors provided in the memory cell array 52 and the booster circuit 60 for which high withstand voltage is required.

In the semiconductor device of this embodiment mode, the channel formation regions of the semiconductor layers included in the thin film transistors provided in the row decoder 62, the column decoder 64, and the control circuit 58 each preferably have a thickness equal to or greater than 5 nm and equal to or less than 30 nm, and more preferably equal to or greater than 10 nm and equal to or less than 20 nm. On the other hand, the source regions and the drain regions of the semiconductor layers included in the thin film transistors provided in the row decoder 62, the column decoder 64, and the control circuit 58, and the semiconductor layers (the source regions, the drain regions, and the channel formation regions) included in the thin film transistors provided in the memory cell array 52 and the booster circuit 60 each preferably have a thickness equal to or greater than 25 nm and equal to or less than 100 nm, and more preferably equal to or greater than 50 nm and equal to or less than 60 nm.

In this embodiment mode, the channel formation regions of the semiconductor layers included in the thin film transistors, which are provided in the row decoder 62, the column decoder 64, and the control circuit 58, are locally thinned (the thickness is preferably equal to or greater than 5 nm and equal to or less than 30 nm, and more preferably equal to or greater than 10 nm and equal to or less than 20 nm), and the regions of the source regions and the drain regions, which are in contact with the source electrode layers and the drain electrode layers respectively, are not thinned (the thickness is preferably equal to or greater than 25 nm and equal to or less than 100 nm, and more preferably equal to or greater than 50 nm and equal to or less than 60 nm). Therefore, part of the source regions and the drain regions; low concentration impurity regions which can be provided between the channel formation regions, and the source regions and the drain regions; or the like, other than the channel formation regions, in the semiconductor layers may be thinned.

In the semiconductor device of the present invention, the gate insulating layers included in the thin film transistors, which are provided in the row decoder 62, the column decoder 64, and the control circuit 58, each preferably have a thickness equal to or greater than 1 nm and equal to or less than 10 nm, and more preferably about 5 nm. On the other hand, the gate insulating layers included in the thin film transistors, which are provided in the memory cell array 52 and the booster circuit 60, each preferably have a thickness equal to or greater than 50 nm and equal to or less than 150 nm, and more preferably equal to or greater than 60 nm and equal to or less than 80 nm.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation regions of the semiconductor layers in the row decoder 62, the column decoder 64, and the control circuit 58, acts on an entire region of the channel formation regions to be depleted, thereby suppressing the short-channel effect. In addition, the threshold voltage of the thin film transistors can be reduced. Accordingly, miniaturization and high performance of the thin film transistors that are provided in the driver circuit portion and the control circuit portion can be realized. Therefore, low voltage driving of the semiconductor device can be performed, and low power consumption can be realized. Since miniaturization of the thin film transistors can be realized by thinning the semiconductor layers (or, the gate insulating layers as well), reduction in area of the driver circuit portion and the control circuit portion can be achieved, and miniaturization of the semiconductor device can be realized.

The thin film transistors of this embodiment mode, provided in the driver circuit portion and the control circuit portion each preferably have a channel length shorter than the thin film transistors provided in the memory cell array. The channel lengths of the thin film transistors of this embodiment mode provided in the driver circuit portion and the control circuit portion are each preferably 0.1 µm to 1 µm. In addition, the channel lengths of the thin film transistors provided in the memory cell array are each preferably 1 µm to 5 µm (more preferably, 1 µm to 3 µm).

Furthermore, since only the channel formation regions are locally thinned in the thin film transistors provided in the driver circuit portion and the control circuit portion, regions in the source regions and the drain regions, which are in contact with the wiring layers that are source electrode layers and drain electrode layers, are not thinned and thicker than the channel formation regions. Thus, when the openings (contact holes) which expose the source regions and the drain regions are formed, the semiconductor layers near the openings can be prevented from being removed entirely, and increase of contact resistance (between the semiconductor layers and the wiring layers) can be prevented. As a result, reduction in yield in a manufacturing process can be prevented and high performance of a semiconductor device can be realized.

On the other hand, the semiconductor layers (or, the gate insulating layer as well) of the thin film transistors provided in the memory cell portion and the booster circuit, are made thicker than those of the driver circuit portion and the control circuit portion; accordingly, a semiconductor device having high withstand voltage with respect to driving voltage and high reliability can be provided.

Thus, a semiconductor device of the present invention can have low power consumption and high reliability.

EMBODIMENT MODE 7

Embodiment Mode 7 will describe another example of adding an impurity element to a semiconductor layer in the semiconductor device described in Embodiment Modes 1 to 6. Therefore, repeated description for the same portion or a portion having a similar function to that in Embodiment Modes 1 to 6 is omitted. A manufacturing process of a semiconductor device of this embodiment mode will be described with reference to FIGS. 16A to 16D.

Figure 16A:
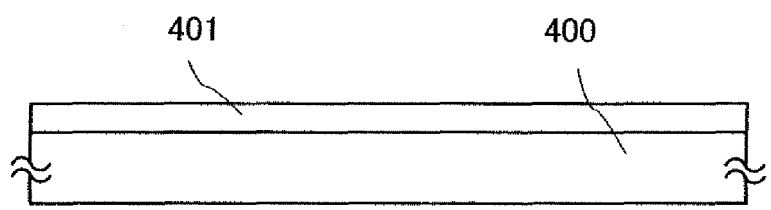
FIGS. 16A to 16D show a manufacturing method of a semiconductor device according to the present invention.

An insulating layer 401 is formed as a base film over a substrate 400 (FIG. 16A).

For the substrate 400 having an insulating surface, a glass substrate, a quartz substrate, a sapphire substrate, a ceramic substrate, a metal substrate having an insulating layer formed on its surface, or the like can be used. Alternatively, a plastic substrate which can withstand the processing temperature in this embodiment mode, or a flexible substrate such as a film can also be used. As a plastic substrate, a substrate made of PET (polyethylene terephthalate), PEN (polyethylene naphthalate), or PES (polyethersulfone) can be used. For a flexible substrate, a synthetic resin such as acrylic can be used.

For the insulating layer 401, silicon oxide, silicon nitride, silicon oxynitride, silicon nitride oxide, or the like can be used, and either a single-layer structure or a stacked structure of two layers can be employed.

Alternatively, the insulating layer 401 can be formed using materials selected from among aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, or other substances containing inorganic insulating materials. It is also possible to use a material containing siloxane.

The insulating layer 401 can be formed by a sputtering method, a PVD (physical vapor deposition) method, a CVD (chemical vapor deposition) method such as a low-pressure CVD (LPCVD) method or a plasma CVD method, a droplet discharge method by which patterns can be formed selectively, a printing method by which patterns can be transferred or drawn (a method by which patterns are formed such as screen printing or offset printing), a coating method such as spin coating, a dipping method, a dispensing method, or the like.

A thin film transistor is a switching element that is turned on when a certain amount of voltage (referred to as a threshold or a threshold voltage) is applied to a gate electrode and is turned off when a voltage less than that amount is applied. Therefore, it is very important to control a threshold voltage precisely in terms of accurate operation of a circuit.

However, a threshold voltage of a TFT is sometimes moved (shifted) toward the minus side or the plus side by an indefinite factor such as an influence of a movable ion due to contamination and an influence of difference in work function and an interface charge in the periphery of a gate of the TFT.

As a technique proposed as means for solving such phenomena, a channel doping method is given. The channel doping method is a technique in which an impurity element imparting one conductivity type (typically, P, As, B, or the like) is added to at least a channel formation region of a TFT and a threshold voltage is controlled by being shifted intentionally.

Figure 16B:
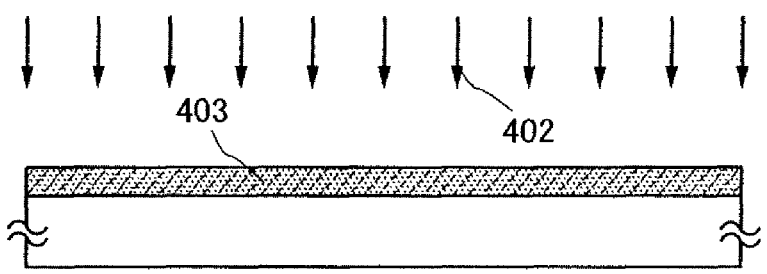

An impurity element 402 imparting p-type conductivity is added as an impurity element imparting one conductivity type to the insulating layer 401, so that an insulating layer 403, which is a p-type impurity region, is formed (FIG. 16B).

The impurity element 402 can be introduced (added) by an ion injecting method or an ion doping method. The impurity element 402 is a p-type impurity element, and boron (B), arsenic (As), or the like can be used. In the case of employing a doping method, the dosage of the impurity element 402 may be about $1\times10^{13}$ atoms/cm$^2$.

Figure 16C:
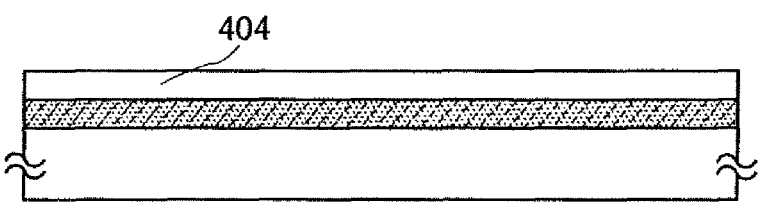

A semiconductor film 404 is formed over the insulating layer 403 that is a p-type impurity region (FIG. 16C). In this embodiment mode, an amorphous semiconductor film is formed as the semiconductor film 404. As a material of the semiconductor film, silicon is preferable. Further, a silicon germanium semiconductor can also be used. As a method, a sputtering method, a plasma CVD method, or a low-pressure CVD method may be used.

Figure 16D:
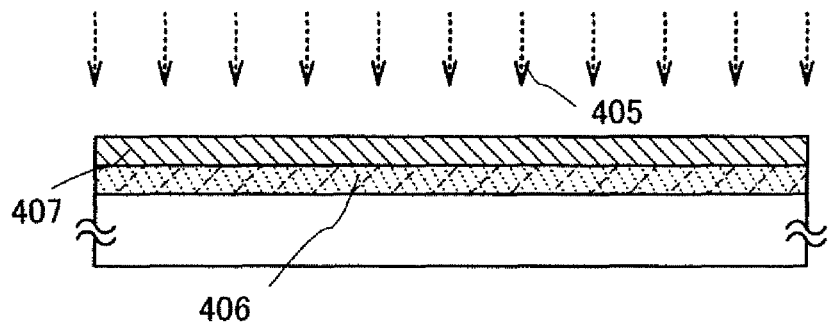

Heat treatment is performed to the insulating layer 403 and the semiconductor film 404, so that the semiconductor film 404 is crystallized. In this embodiment mode, the insulating layer 403 and the semiconductor film 404 are crystallized by being irradiated with a laser beam 405. By this laser irradiation treatment, the p-type impurity element contained in the insulating layer 403 is diffused into the semiconductor film 404. Thus, the insulating layer 403 becomes an insulating layer 406 having a lower concentration of the p-type impurity element than the insulating layer 403, and the semiconductor film 404 becomes a semiconductor film 407 that contains the p-type impurity element and has crystallinity (FIG. 16D).

The concentration of the p-type impurity element contained in the semiconductor film 407 may be about $5\times10^{15}$ to $1\times10^{16}$ atoms/cm$^3$. The added impurity element controls the threshold voltage of a transistor and effectively functions by being added to a channel formation region.

By adding the impurity element to the insulating layer that is a base film and by indirectly adding the impurity element to the semiconductor film by heat treatment in the above-described manner, the impurity element is not directly added to the semiconductor film by doping or the like. Thus, defects and the like generated in doping can be prevented, and crystallinity of the semiconductor film is not adversely affected. Further, by the heat treatment for crystallization, the impurity element can be activated.

The crystalline semiconductor film 407 thus obtained is processed into a desired shape, so that it can be used as a semiconductor layer of the semiconductor device in Embodiment Modes 1 to 6.

In the semiconductor device of the present invention, channel doping may be selectively performed depending on the required thin film transistor characteristics. For example, the concentration of an impurity element with which channel formation regions of thin film transistors are doped may differ between a memory element portion and a driver circuit portion that drives memory elements. In the case of a NOR-type memory element portion, when a memory element portion is channel-doped with boron or the like at a higher concentration than that of a driver circuit portion, thin film transistors in the memory element portion can be controlled to be normally on.

In the case where an impurity element is added to an insulating layer, which is a base film and formed below a semiconductor film, and the impurity element is added to the semiconductor film by heat treatment as in this embodiment mode, the impurity element may be selectively added to the insulating layer that is a base film at a desired concentration. Of course, after formation of the semiconductor film, the impurity element may be directly and selectively added to the semiconductor film at a desired concentration.

Thus, a semiconductor device of the present invention can have low power consumption and high reliability.

EMBODIMENT MODE 8

Embodiment Mode 8 will describe an example in which the etching shape of a semiconductor layer is different from those of the semiconductor devices described in Embodiment Modes 1 to 7. Therefore, repeated description for the same portion or a portion having a similar function to that in Embodiment Modes 1 to 7 is omitted. A manufacturing process of a semiconductor device of this embodiment mode will be described with reference to FIGS. 25 to 27D.

This embodiment mode shows an example in which only regions of a semiconductor layer, which are in contact with wiring layers such as a source electrode layer and a drain electrode layer are not selectively thinned and the other regions including a channel formation region is locally thinned.

Figure 25:
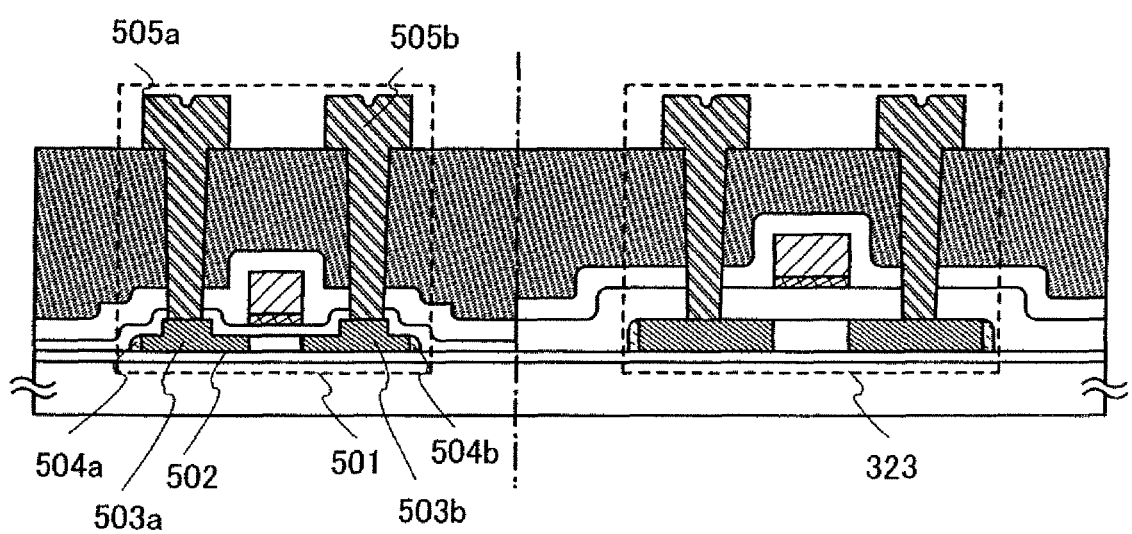
FIG. 25 shows a manufacturing method of a semiconductor device according to the present invention.

FIG. 25 corresponds to Embodiment Mode 1, and FIG. 25 corresponds to FIG. 1.

In FIG. 25, a thin film transistor 501 provided in a driver circuit, a control region, or the like for which high speed operation is required, includes a semiconductor layer 502, in which a channel formation region is locally thinned and edge portions of impurity regions 503a and 503b, which function as a source region and a drain region, are also thinned. Therefore, in the semiconductor layer 502, only portions (including vicinities thereof) of the impurity regions 503a and 503b, which are connected to source and drain electrode layers 505a and 505b, are not thinned selectively and thicker than the other regions such as the channel formation region and the like. Reference numerals 504a and 504b denote insulating layers with a sidewall structure.

Figure 26A:
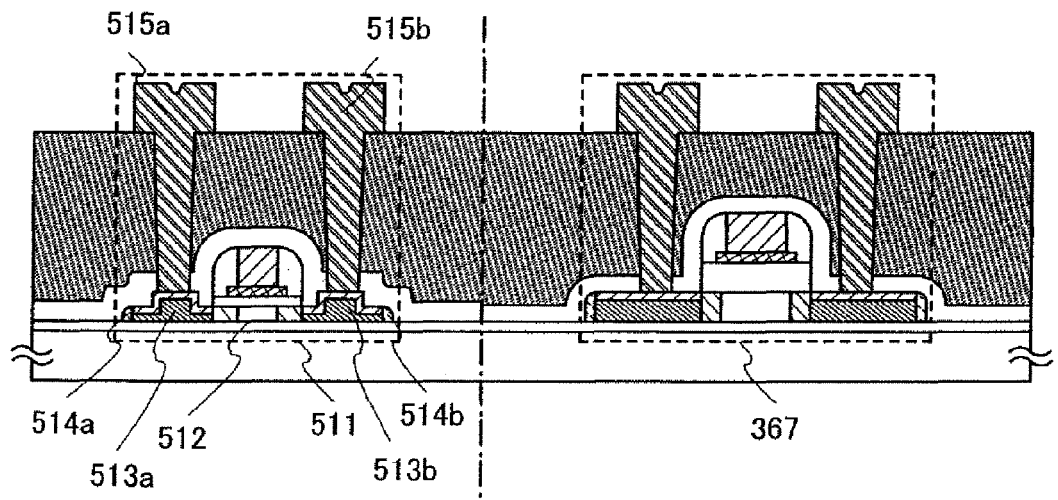
FIGS. 26A and 26B show manufacturing methods of semiconductor devices according to the present invention.
Figure 26B:
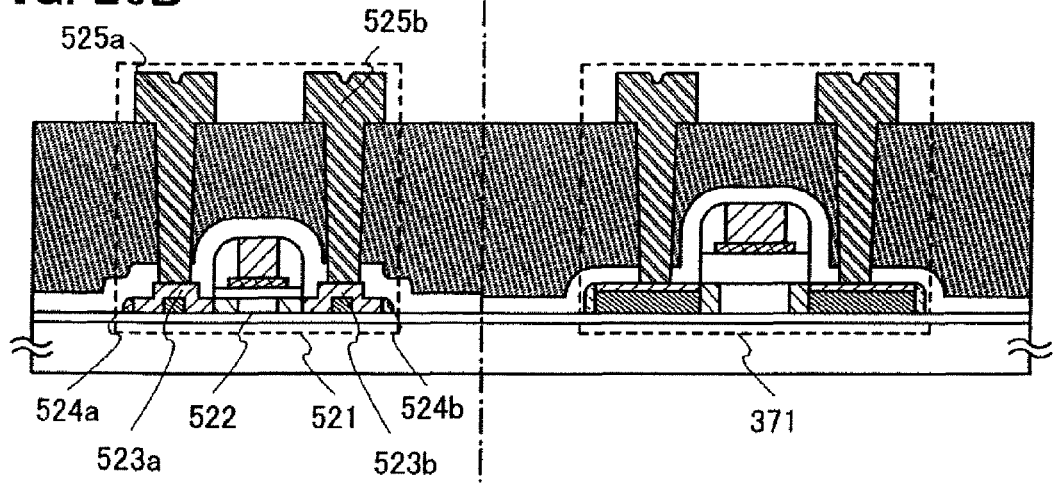

FIGS. 26A and 26B correspond to Embodiment Mode 3, and FIG. 26A corresponds to FIG. 6A.

In FIG. 26A, a thin film transistor 511 provided in a driver circuit, a control region, or the like for which high speed operation is required, includes a semiconductor layer 512, in which a channel formation region is locally thinned and edge portions of impurity regions 513a and 513b, which function as a source region and a drain region and include silicides, are also thinned. Therefore, in the semiconductor layer 512, only portions (including vicinities thereof) of the impurity regions 513a and 513b, which are connected to source and drain electrode layers 515a and 515b, are not thinned selectively and thicker than the other regions such as the channel formation region and the like. Reference numerals 514a and 5104b denote insulating layers with a sidewall structure.

FIG. 26B also corresponds to Embodiment Mode 3, and FIG. 26B corresponds to FIG. 6B.

In FIG. 26B, a thin film transistor 521 provided in a driver circuit, a control region, or the like for which high speed operation is required, includes a semiconductor layer 522, in which a channel formation region is locally thinned and edge portions of impurity regions 523a and 523b, which function as a source region and a drain region and include silicides, are also thinned. Therefore, in the semiconductor layer 522, only portions (including vicinities thereof) of the impurity regions 523a and 523b, which are connected to source and drain electrode layers 525a and 525b, are not thinned selectively and thicker than the other regions such as the channel formation region and the like. Reference numerals 524a and 524b denote insulating layers with a sidewall structure.

Silicides may be formed in surface portions of the impurity regions, which are a source region and a drain region, or may be formed in the entire impurity regions, which function as a source region and a drain region. Silicides can be controlled by the thickness of a conductive film and heat conditions (such as temperature and time). FIG. 26B shows an example in which silicide is formed thicker so that a silicide region reaches an insulating layer that is a base film. As shown in FIG. 26B, silicide reflects the shape of the semiconductor layer. Impurity regions of a semiconductor layer, which are not silicide, remain under silicide only in portions, over which the source electrode layer and the drain electrode layer are formed in the source region and the drain region in the semiconductor layer.

In the case of the semiconductor layers having the shapes shown in FIGS. 25 to 26B, a sidewall insulating layer, which covers a side surface of the semiconductor layer, varies between a thin film transistor for which high speed operation is required and a thin film transistor for which high withstand voltage is required, depending on the shape of the semiconductor layer. A manufacturing method of the semiconductor layer having the shapes shown in FIGS. 25 to 26B is shown in FIGS. 27A to 27D.

FIGS. 27A to 27D show a manufacturing method of a semiconductor device, which includes a thin film transistor for which high speed operation is required and a thin film transistor for which high withstand voltage is required over a substrate 550 having an insulating surface.

Figure 27A:
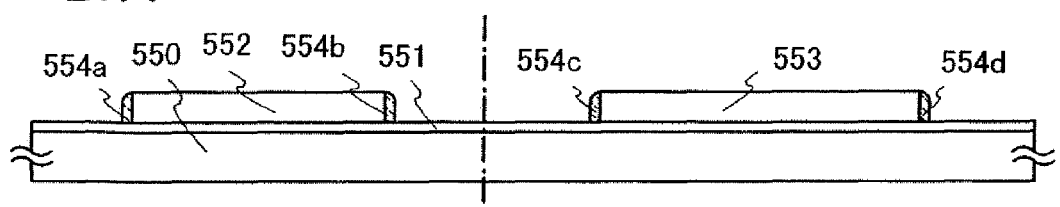
FIGS. 27A to 27D show a manufacturing method of a semiconductor device according to the present invention.

An insulating layer 551 is formed as a base film over the substrate 550, and similarly to FIG. 2C in Embodiment Mode 1, semiconductor layers 552 and 553 and insulating layers 554a to 554d covering side surfaces of the semiconductor layers are formed (FIG. 27A).

Figure 27B:
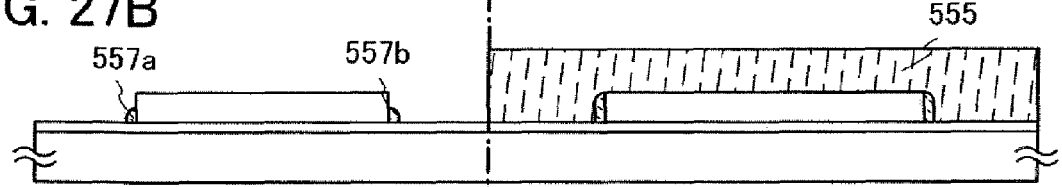

A mask 555 covering the semiconductor layer 553 is formed, and the insulating layers 554a and 554b, which cover the side surfaces of the semiconductor layer 552, are etched to form thin insulating layers 557a and 557b in advance (FIG. 27B). In this case, etching is performed in a condition that a preferable selective ratio between the semiconductor layer 552 and the insulating layers 554a and 554b can be obtained. When a sufficient selective ratio in etching between the semiconductor layer 552 and the insulating layers 554a and 554b cannot be obtained, a mask may be formed over the semiconductor layer 552.

Figure 27C:
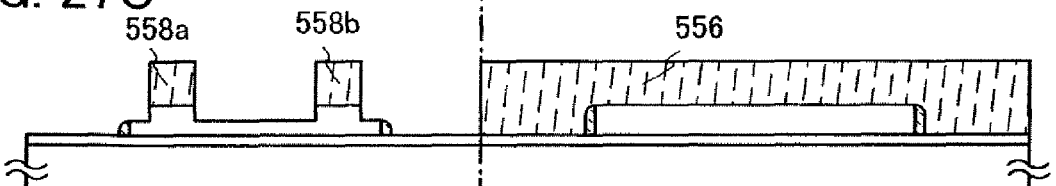
Figure 27D:
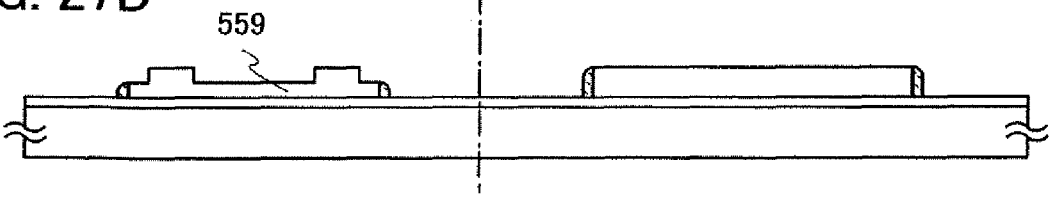

The mask 555 is removed, and a mask 556 is formed to cover the semiconductor layer 553. Without removal of the mask 555, the mask 555 may be used as the mask 556 as well. Masks 558a and 558b, which selectively cover the semiconductor layer 552, are formed (FIG. 27C). The mask 558a and 558b are formed to cover regions in the semiconductor layer 552, which are not thinned, that is, regions formed to be electrically connected to the source electrode layer and the drain electrode layer. The semiconductor layer 552 is selectively thinned using the masks 558a and 558b, so that a semiconductor layer 559 is formed (FIG. 27D). In this case, etching is performed in a condition that a preferable selective ratio between the semiconductor layer 552 and the insulating layers 557a and 557b can be obtained. When a sufficient selective ratio in etching between the semiconductor layer 552 and the insulating layers 557a and 557b cannot be obtained, a mask may be formed over the insulating layers 557a and 557b.

This embodiment mode has described an example in which thinning of the insulating layers, which are the sidewall insulating layers, and local thinning of the semiconductor layer are conducted in different etching steps; however, the sidewall insulating layers and the semiconductor layer may be thinned at the same time by etching (if explained with FIGS. 27A to 27D, the step of FIG. 27B is not conducted and the process proceeds from FIG. 27A to FIG. 27C). In this case, an etching condition in which etching rates of the semiconductor layer and the sidewall insulating layers are almost equal, in other words, a condition in which the selective ratio in etching is close to 1 is preferably made. This can be realized by appropriately adding an $O_2$ gas into a fluorine-based etching gas, for example. Further, as an etching gas, an HBr gas or a mixed gas of HBr and $Cl_2$ may also be used instead of a fluorine-based gas to which an $O_2$ gas is added. At this time, an inert gas such as He or Ar may be added to the etching gas.

In the above-described manner, the semiconductor layer that is locally thinned can be formed.

The semiconductor device of this embodiment mode that uses the present invention includes plural kinds of thin film transistors with different thicknesses of the channel formation regions of the semiconductor layers, over the same substrate. The channel formation region of the semiconductor layer included in the thin film transistor for which high speed operation is required is thinned locally, so that the channel formation region of the semiconductor layer is made thinner than the channel formation region of the semiconductor layer included in the thin film transistor for which high withstand voltage is required. Since only the channel formation region is locally thinned in the thin film transistor for which high speed operation is required, regions of the source region and the drain region, which are in contact with the source electrode layer and the drain electrode layer respectively, are not thinned and thicker than the channel formation region. Further, the gate insulating layer of the thin film transistor for which high speed operation is required is also preferably thinner than the gate insulating layer of the thin film transistor for which high withstand voltage is required.

For example, in the case of a semiconductor device including a circuit such as a memory, a channel formation region of a semiconductor layer included in a specific thin film transistor in the memory may be selectively and locally thinned, whereas a semiconductor layer included in a specific thin film transistor to which high current and high voltage are applied may be left thick.

In the case where a plurality of circuits are provided in a semiconductor device, a thin film transistor with a different thickness of the channel formation region of the semiconductor layer may be provided in each of the circuits in accordance with the function required for the circuits. Thin film transistors may be selectively provided in a circuit for which high speed operation is required and a circuit for which high withstand voltage is required. For example, in the case where a memory cell array including memory elements, a booster circuit portion, a driver circuit portion, a control circuit portion, and the like are provided in a memory, channel formation regions of semiconductor layers included in thin film transistors provided in the driver circuit portion, the control circuit portion, and the like, for which high speed operation is required, are selectively and locally thinned, whereas semiconductor layers included in the memory elements of the memory cell array and thin film transistors, for which high withstand voltage is required, are not thinned and preferably thicker than the semiconductor layers included in the thin film transistors provided in the driver circuit portion, the control circuit portion, and the like.

In addition to the memory, in the case where a plurality of circuits are provided in the semiconductor device, a thin film transistor in which a semiconductor layer is locally thinned may be provided in a circuit that serves as a logic circuit and is required to operate at high speed. A thin film transistor having a semiconductor layer that is not thinned and has a thickness to withstand a high voltage may be provided in a circuit such as a power supply circuit, to which a high voltage is applied.

In the semiconductor device of this embodiment mode that uses the present invention, a channel formation region of a semiconductor layer included in a thin film transistor provided in a driver circuit portion, a control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, a source region and a drain region of the semiconductor layer included in the thin film transistor provided in the driver circuit portion, the control circuit portion, or the like, for which high speed operation is required, and a semiconductor layer (a source region, a drain region, and a channel formation region) included in a thin film transistor provided in a memory cell array or a power supply circuit, for which high withstand voltage is required, each preferably have a thickness equal to or greater than 25 nm and equal to or less than 100 nm, and more preferably equal to or greater than 50 nm and equal to or less than 60 nm.

In this embodiment mode, the channel formation region of the semiconductor layer included in the thin film transistor, which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with the source electrode layer and the drain electrode layer respectively, are not thinned (the thickness is preferably equal to or greater than 25 nm and equal to or less than 100 nm, and more preferably equal to or greater than 50 nm and equal to or less than 60 nm). Therefore, part of the source region and the drain region, low-concentration impurity regions that can be provided between the channel formation region and the source and drain regions, and the like in the semiconductor layer, other than the channel formation region, may also be thinned.

In the semiconductor device of the present invention, the gate insulating layer included in the thin film transistor that is provided in the driver circuit portion, the control circuit portion, or the like, for which high speed operation is required, preferably has a thickness equal to or greater than 1 nm and equal to or less than 10 nm, and more preferably about 5 nm. On the other hand, the gate insulating layer included in the thin film transistor that is provided in the memory cell array or the power supply circuit, for which high withstand voltage is required, preferably has a thickness equal to or greater than 50 nm and equal to or less than 150 nm, and more preferably equal to or greater than 60 nm and equal to or less than 80 nm.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Local thinning of the channel formation region of the semiconductor layer acts on an entire region of the channel formation region to be depleted, thereby suppressing the short-channel effect. In addition, the threshold voltage of the thin film transistor can be reduced. Accordingly, miniaturization and high performance of the thin film transistor that is provided in the driver circuit region can be realized. Therefore, low voltage driving of the semiconductor device can be performed, and low power consumption can be realized. Since miniaturization of the thin film transistor can be realized by thinning the channel formation region of the semiconductor layer (or, the gate insulating layer as well), reduction in area can be achieved, and miniaturization of the semiconductor device can be realized.

Furthermore, since only the channel formation region is locally thinned in the thin film transistor for which high speed operation is required, regions in the source region and the drain region, which are in contact with the wiring layers that are a source electrode layer and a drain electrode layer, are not thinned and thicker than the channel formation region. Thus, when the openings (contact holes) which expose the source region and the drain region are formed, the semiconductor layer near the openings can be prevented from being removed entirely, and increase of contact resistance (between the semiconductor layer and the wiring layers) can be prevented. As a result, reduction in yield in a manufacturing process can be prevented and high performance of a semiconductor device can be realized.

On the other hand, the semiconductor layer (or, the gate insulating layer as well) of the thin film transistor provided in the memory cell array, the power supply circuit, or the like, for which high withstand voltage is required, is made thicker than that of the driver circuit portion, the control circuit portion, and the like; accordingly, high withstand voltage and high reliability can be obtained.

Thus, a semiconductor device of the present invention can have low power consumption and high reliability.

This embodiment mode can be appropriately combined with any of Embodiment Modes 1 to 7.

EMBODIMENT MODE 9

In Embodiment Mode 9, one example of a usage mode of the semiconductor device described in the above embodiment modes will be described. Specifically, an application example of a semiconductor device capable of inputting/outputting data without contact is described with reference to drawings. The semiconductor device capable of inputting/outputting data without contact is also called an RFID tag, an ID tag, an IC tag, an IC chip, an RF tag, a wireless tag, an electronic tag, or a wireless chip depending on the usage mode.

One example of an upper-surface structure of a semiconductor device described in this embodiment mode is described with reference to FIG. 19A. A semiconductor device 2180 shown in FIGS. 19A to 19C includes a thin film integrated circuit 2131 including a plurality of elements such as thin film transistors for forming a memory cell array and a driver circuit portion, and a conductive layer 2132 that functions as an antenna. The conductive layer 2132 that functions as an antenna is electrically connected to the thin film integrated circuit 2131. The thin film transistor according to the present invention described in Embodiment Modes 1 to 5 can be applied to the thin film integrated circuit 2131.

Figure 19A:
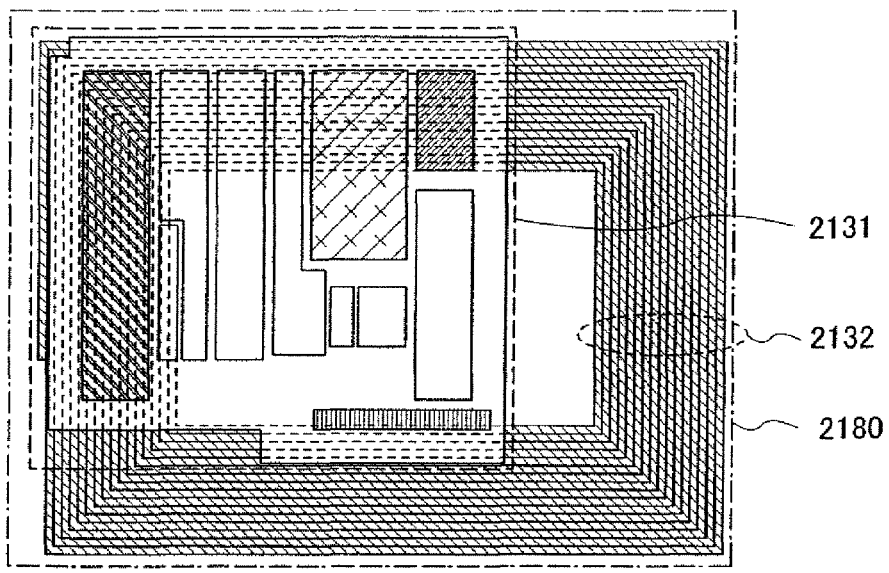
FIGS. 19A to 19C show manufacturing methods of a semiconductor device according to the present invention.
Figure 19B:
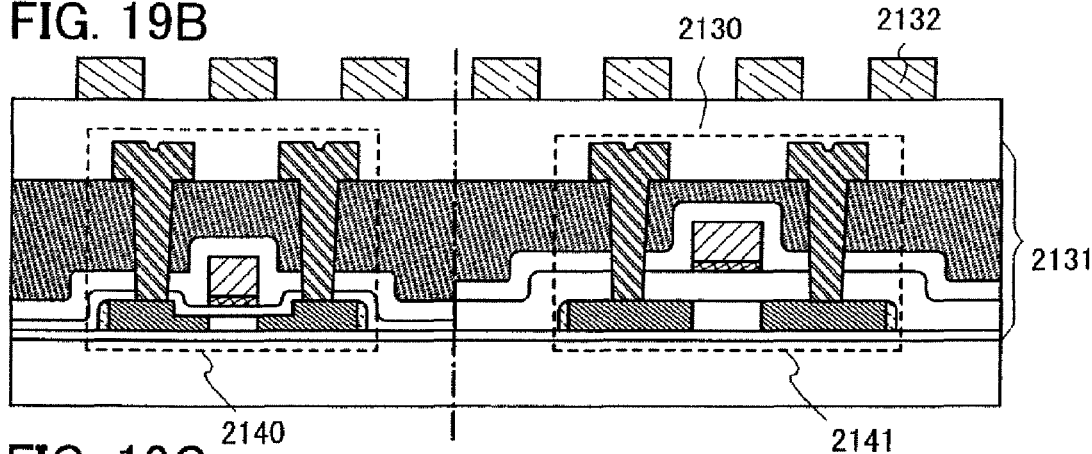
Figure 19C:
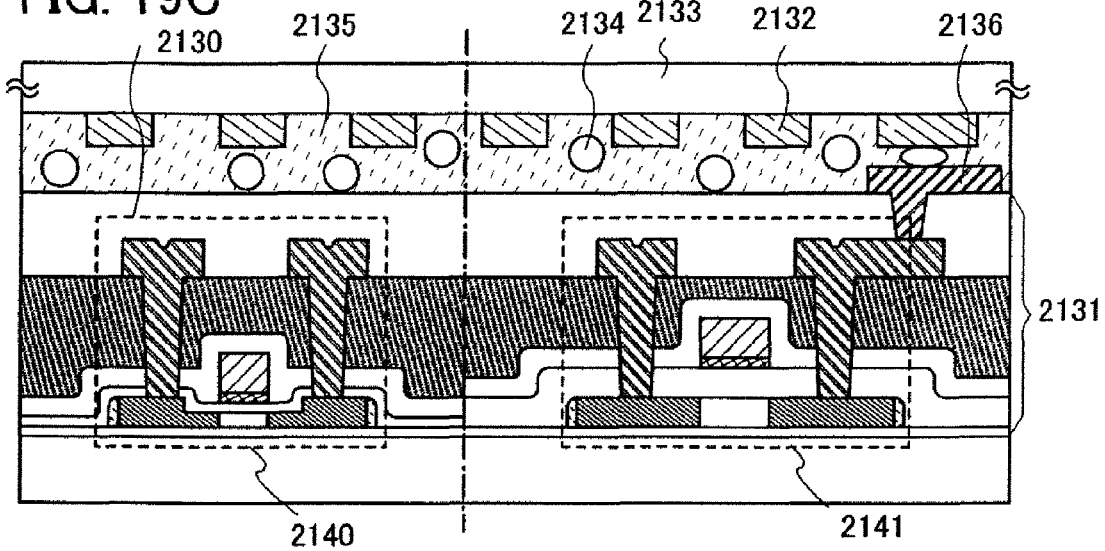

FIGS. 19B and 19C show pattern diagrams of a cross-sectional surface of FIG. 19A. The conductive layer 2132 that functions as an antenna is provided above the elements for forming the memory cell array and the driver circuit portion; for example, the conductive layer 2132 that functions as an antenna can be provided above the structure described in Embodiment Mode 1 with an insulating layer 2130 interposed therebetween (FIG. 19B).

The semiconductor device of this embodiment mode that uses the present invention, includes a plurality of thin film transistors which have different film thicknesses of a channel formation region of a semiconductor layer and have different characteristics. In this embodiment mode, a thin film transistor 2141 is provided in the memory cell array, and a thin film transistor 2140 whose channel formation region in the semiconductor layer is locally thinned is provided in the driver circuit portion.

Features of the semiconductor device of this embodiment mode are that the driver circuit portion includes the thin film transistor 2140 and the memory cell array includes the thin film transistor 2141, and that the semiconductor layer included in the thin film transistor 2140, which is provided in the driver circuit portion, is thinner than the semiconductor layer included in the thin film transistor 2141, which is provided in the memory cell array. As in this embodiment mode, a gate insulating layer of the thin film transistor 2140 provided in the driver circuit portion may be thinner than a gate insulating layer of the thin film transistor 2141 provided in the memory cell array. The semiconductor device of this embodiment mode that uses the present invention includes the thin film transistors 2140 and 2141 in the driver circuit portion and the memory cell array. The channel formation region of the semiconductor layer included in the thin film transistor 2140 is thinned locally, so that the channel formation region of the semiconductor layer included in the thin film transistor 2140 is made thinner than the channel formation region of the semiconductor layer included in the thin film transistor 2140. Since only the channel formation region is locally thinned in the thin film transistor 2140 for which high speed operation is required, regions of the source region and the drain region, which are in contact with the source electrode layer and the drain electrode layer respectively, are not thinned and thicker than the channel formation region. Further, the gate insulating layer of the thin film transistor 2140 for which high speed operation is required is also preferably thinner than the gate insulating layer of the thin film transistor 2141 for which high withstand voltage is required.

In the semiconductor device of this embodiment mode that uses the present invention, the channel formation region of the semiconductor layer included in the thin film transistor 2140 provided in the driver circuit portion, the control circuit portion, or the like, for which high speed operation is required, preferably has a thickness equal to or greater than 5 nm and equal to or less than 30 nm, and more preferably equal to or greater than 10 nm and equal to or less than 20 nm. On the other hand, the source region and the drain region of the semiconductor layer included in the thin film transistor 2140 provided in the driver circuit portion, the control circuit portion, or the like, for which high speed operation is required, and the semiconductor layer (the source region, the drain region, and the channel formation region) included in the thin film transistor 2141 provided in the memory cell array or the power supply circuit, for which high withstand voltage is required, each preferably have a thickness equal to or greater than 25 nm and equal to or less than 100 nm, and more preferably equal to or greater than 50 nm and equal to or less than 60 nm.

In this embodiment mode, the channel formation region of the semiconductor layer included in the thin film transistor 2140, which is provided in the driver circuit portion, the control circuit portion, or the like, for which high speed operation is required, is locally thinned (the thickness is preferably equal to or greater than 5 nm and equal to or less than 30 nm, and more preferably equal to or greater than 10 nm and equal to or less than 20 nm), and the regions of the source region and the drain region, which are in contact with the source electrode layer and the drain electrode layer respectively, are not thinned (the thickness is preferably equal to or greater than 25 nm and equal to or less than 100 nm, and more preferably equal to or greater than 50 nm and equal to or less than 60 nm). Therefore, part of the source region and the drain region, low-concentration impurity regions that can be provided between the channel formation region and the source and drain regions, and the like in the semiconductor layer, other than the channel formation region, may also be thinned.

In the semiconductor device of the present invention, the gate insulating layer included in the thin film transistor 2140 that is provided in the driver circuit portion preferably has a thickness equal to or greater than 1 nm and equal to or less than 10 nm, and more preferably about 5 nm. On the other hand, the gate insulating layer included in the thin film transistor 2141 that is provided in the memory cell array preferably has a thickness equal to or greater than 50 nm and equal to or less than 150 nm, and more preferably equal to or greater than 60 nm and equal to or less than 80 nm.

When the channel formation region is thick, in the case where the channel length is short, current flows on the lower side in the channel formation region at a gate voltage of less than or equal to the threshold voltage and in a sub-threshold region, by the influence of electric field between the source and the drain. Therefore, the sub-threshold value is increased, and the threshold voltage is reduced. When the channel formation region is formed to be thin, a path where current flows on the lower side in the channel formation region is blocked, and thus leak current can be suppressed. Therefore, increase in the sub-threshold value can be suppressed, and reduction in the threshold voltage can be suppressed. Accordingly, when the channel formation region is formed to be thin, the amount of change in the threshold voltage toward negative values can be suppressed in a region where the channel length is short, and a thin film transistor with a small sub-threshold value can be manufactured. Since the sub-threshold value is reduced, the threshold voltage can be set to be low while suppressing current flowing between the source and the drain at a gate voltage of 0 V.

Reduction in thickness of the channel formation region of the semiconductor layer in the driver circuit portion acts on an entire region of the channel formation region to be depleted, thereby suppressing the short-channel effect. In addition, the threshold voltage of the thin film transistor can be reduced. Accordingly, miniaturization and high performance of the thin film transistor that is provided in the driver circuit portion can be realized. Therefore, low voltage driving of the semiconductor device can be performed, and low power consumption can be realized. Since miniaturization of the thin film transistor can be realized by thinning the semiconductor layer (or, the gate insulating layer as well), reduction in area of the driver circuit portion or the control circuit portion can be achieved, and miniaturization of the semiconductor device can be realized.

In this embodiment mode, the thin film transistor 2140, which is provided in the driver circuit portion, preferably has a channel length shorter than the thin film transistor 2141, which is provided in the memory cell array. The channel length of the thin film transistor 2140, which is provided in the driver circuit portion, of this embodiment mode is preferably 0.1 µm to 1 µm. In addition, the channel length of the thin film transistor 2141 that is provided in the memory cell array is preferably 1 µm to 5 µm (more preferably, 1 µm to 3 µm).

In the thin film transistor 2140 for which high speed operation is required, only the channel formation region is locally thinned; accordingly, regions of the source region and the drain region, which are in contact with the source electrode layer and the drain electrode layer respectively, are not thinned and thicker than the channel formation region. Therefore, when openings (contact holes) which expose the source region and the drain region are formed, the semiconductor layer near the openings can be prevented from being removed entirely, and increase in contact resistance (between the semiconductor layer and the wiring layers) can be prevented. Accordingly, reduction in yield in a manufacturing process can be prevented and high performance of the completed semiconductor device can be realized.

On the other hand, by making the semiconductor layer (or, the gate insulating layer as well) of the thin film transistor 2141 provided in the memory cell array thicker than that of the driver circuit portion, high withstand voltage with respect to driving voltage and high reliability can be achieved.

Alternatively, after providing the conductive layer 2132 that functions as an antenna over a substrate 2133, the substrate 2133 and the thin film integrated circuit 2131 can be attached to each other so that the conductive layer 2132 is interposed therebetween (FIG. 19C). FIG. 19C shows an example in which a conductive layer 2136 provided over the insulating layer 2130 is electrically connected to the conductive layer 2132 that functions as an antenna through conductive particles 2134 contained in a resin 2135 having adhesiveness.

Note that this embodiment mode can be freely implemented in combination with any of the above Embodiment Modes 1 to 8. In addition, when the semiconductor device manufactured in this embodiment mode is separated from the substrate in the separation step, and attached to a flexible substrate, it becomes possible to provide the semiconductor device over a flexible substrate, and thus provide a semiconductor device having flexibility.

The flexible substrate corresponds to a substrate formed from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film formed from polypropylene, polyester, vinyl, polyvinyl fluoride, vinyl chloride, or the like; paper formed from a fibrous material; a stacked film of a base film (such as polyester, polyamide, an inorganic evaporation film, or paper) and an adhesive synthetic resin film (such as an acrylic synthetic resin or an epoxy synthetic resin); or the like. The film is attached to an object by heat treatment and pressure treatment. When heat treatment and pressure treatment are performed to the film, an adhesive layer provided on the outermost surface of the film or a layer provided on the outermost layer (not the adhesive layer) is melted by heat and attached by pressure. The adhesive layer may be provided on the base but not necessarily. The adhesive layer corresponds to a layer including an adhesive such as a thermosetting resin, an ultraviolet curing resin, an epoxy resin adhesive, or a resin additive.

The semiconductor device of the present invention having an element formation layer may be manufactured by the steps of forming an element formation layer including a semiconductor element over a first substrate which can withstand the process conditions (e.g., temperature) and then transferring the element formation layer to a second substrate. In addition, in this specification, "to transfer" means "to separate an element formation layer formed over a first substrate from the first substrate and move it to a second substrate." That is, it can also be said that "to move the position of providing an element formation layer to another substrate."

Note that, for the step of transferring an element formation layer to another substrate, it is possible to appropriately use any of the following methods: a method in which a separation layer and an insulating layer are formed between a substrate and an element formation layer, a metal oxide film is provided between the separation layer and the insulating layer, and the metal oxide film is weakened by crystallization so that the element formation layer is separated from the substrate; a method in which an amorphous silicon film containing hydrogen is provided between a highly heat-resistant substrate and an element formation layer, and the amorphous silicon film is removed by laser irradiation or etching so that the element formation layer is separated; a method in which a separation layer and an insulating layer are formed between a substrate and an element formation layer, a metal oxide film is provided between the separation layer and the insulating layer, the metal oxide film is weakened by crystallization, and a part of the separation layer is removed by etching using a solution or a halogen fluoride gas such as $NF_3$, $BrF_3$, or $ClF_3$ so that separation occurs at the weakened metal oxide film; or a method in which a substrate over which an element formation layer is formed is removed mechanically or by etching with a solution or a halogen fluoride gas such as $NF_3$, $BrF_3$, or $ClF_3$. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with laser light so that nitrogen, oxygen, or hydrogen contained in the separation layer is released as a gas, thereby promoting separation between the element formation layer and the substrate.

When the above-described separation methods are combined, the transfer step can be conducted easily. That is, separation can also be conducted with physical force (e.g., by a machine or the like) after making it easier for the separation layer and the element formation layer to be separated from each other by conducting laser irradiation, etching the separation layer with a gas or a solution, and/or mechanically removing the separation layer using a keen knife.

The antenna may be provided to overlap with the memory cell array or provided around the memory cell array without overlapping. In addition, when the antenna is provided to overlap with the memory cell array, it may overlap with either part of or the entire surface of the memory cell array.

Note that although the example in which the conductive layer 2132 that functions as an antenna is provided in the shape of a coil and either an electromagnetic induction method or an electromagnetic coupling method is employed is described in this embodiment mode, the semiconductor device of the present invention is not limited thereto, and a microwave method may also be employed. In the case of a microwave method, the shape of the conductive layer 2132 that functions as an antenna may be decided as appropriate depending on the wavelength of an electromagnetic wave.

Figure 20A:
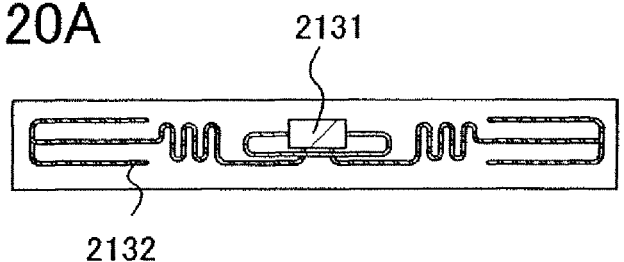
FIGS. 20A to 20D show electronic devices to which the present invention is applied.
Figure 20B:
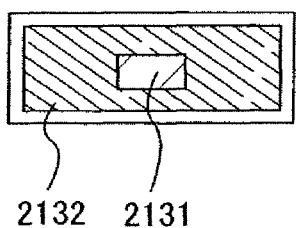
Figure 20C:
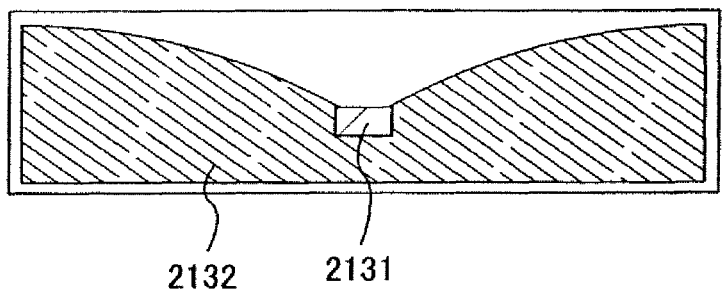
Figure 20D:
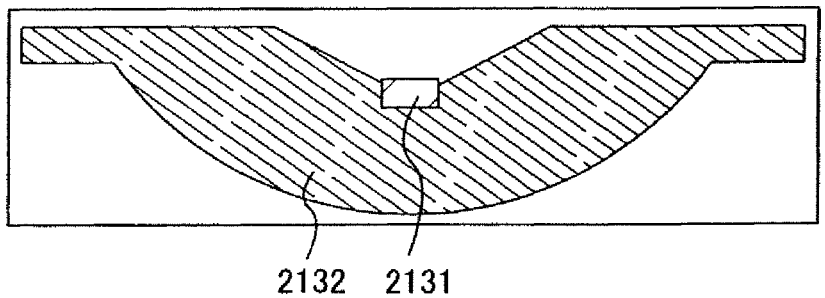

For example, when the microwave method (e.g., with an UHF band (in the range of 860 MHz to 960 MHz), a frequency band of 2.45 GHz, or the like) is employed as the signal transmission method of the semiconductor device 2180, the shape such as length of the conductive layer that functions as an antenna may be set as appropriate in consideration of the wavelength of an electromagnetic wave used in sending a signal. For example, the conductive layer that functions as an antenna can be formed in the shape of a line (e.g., a dipole antenna (FIG. 20A)), in the flat shape (e.g., a patch antenna (FIG. 20B)), in the shape of a ribbon (FIGS. 20C and 20D), or the like. Further, the shape of the conductive layer 2132 that functions as an antenna is not limited to a line, and the conductive layer in the shape of a curved line, in an S-shape, or in a shape combining them may also be provided in consideration of the wavelength of the electromagnetic wave.

The conductive layer 2132 that functions as an antenna is formed of a conductive material by a CVD method, a sputtering method, a printing method such as a screen printing method or a gravure printing method, a droplet discharge method, a dispenser method, a plating method, or the like. As for the conductive material, any of a metal element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material including the metal element as a main component is used, and the conductive layer 2132 of a single layer structure or a stacked-layer structure may be employed.

For example, when the conductive layer 2132 that functions as an antenna is formed by a screen printing method, it can be provided by selective printing with a conductive paste in which conductive particles with a grain diameter of several nm to several tens of μm are dissolved or dispersed in an organic resin. As the conductive particle, at least one of metal particles selected from silver (Ag), gold (Ag), copper (Cu), nickel (Ni), platinum (Pt), palladium (Pd), tantalum (Ta), molybdenum (Mo), titanium (Ti), or the like; fine particles of silver halide; or dispersive nanoparticles can be used. In addition, as the organic resin included in the conductive paste, at least one of organic resins which function as a binder, a solvent, a dispersing agent, and a coating material of metal particles can be used. Typically, an organic resin such as an epoxy resin and a silicone resin can be given as examples. Further, in forming the conductive layer, it is preferable to bake the conductive paste after being provided. For example, in the case of using fine particles (e.g., with a grain diameter of 1 nm or more and 100 nm or less) containing silver as a main component as a material of the conductive paste, the conductive layer can be formed by baking the conductive paste at temperatures in the range of 150° C. to 300° C. to be hardened. Alternatively, fine particles containing solder or lead-free solder as a main component may be used. In this case, fine particles with a grain diameter of 20 μm or less are preferably used. Solder and lead-free solder have the advantage of low cost.

The semiconductor to which the present invention is applied can achieve low power consumption. Therefore, the present invention is effective in the case where a semiconductor device is small and capable of inputting/outputting data without contact.

EMBODIMENT MODE 10

In Embodiment Mode 10, an example of application of the above-described semiconductor device capable of inputting/outputting data without contact, which is formed using the present invention, will be described. The semiconductor device capable of inputting and outputting data without contact may also be referred to as an RFID tag, an ID tag, an IC tag, an IC chip, an RF tag, a wireless tag, an electronic tag, or a wireless chip, depending on the usage mode.

Figure 21A:
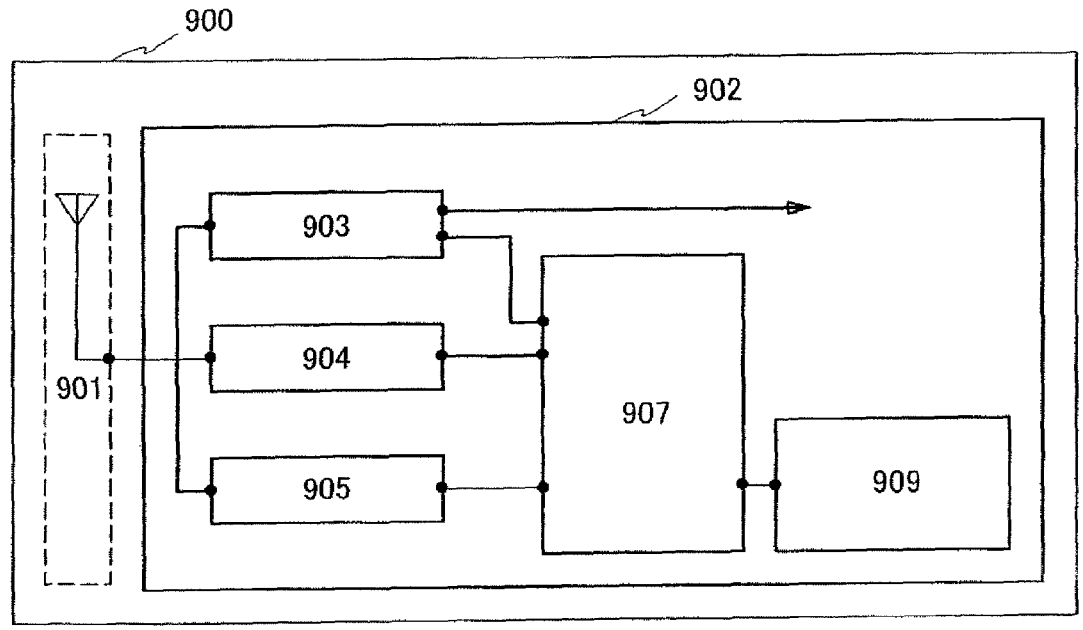
FIGS. 21A to 21C show examples to which a semiconductor device according to the present invention is applied.

A structure of a semiconductor device of the present invention will be described with reference to FIG. 21A. FIG. 21A is a block diagram illustrating one mode of the semiconductor device of the present invention. In FIG. 21A, a semiconductor device 900 includes an antenna 901 and an integrated circuit 902. The integrated circuit 902 includes a power supply circuit 903, a demodulation circuit 904, a modulation circuit 905, a control circuit 907, and a memory 909. The rectifier circuit of the present invention can be used in the power supply circuit 903 and the demodulation circuit 904.

When a radio wave is transmitted from an interrogator, the radio wave is converted into an AC voltage in the antenna 901. In the power supply circuit 903, the AC voltage from the antenna 901 is rectified to generate a voltage for a power supply.

The voltage for a power supply, which is generated in the power supply circuit 903, is fed to various circuits such as the demodulation circuit 904, the modulation circuit 905, the control circuit 907, and the memory 909. In the power supply circuit, the voltage for a power supply may be stabilized or the level of the voltage may be adjusted by a regulator.

The demodulation circuit 904 demodulates the AC signal received by the antenna 901 to output the signal to the control circuit 907 of a next stage. The control circuit 907 performs arithmetic processing in accordance with the signal input from the demodulation circuit 904 and generates another signal. When the arithmetic processing is performed, the memory 909 can be used as a primary cache memory or a secondary cache memory. Further, the control circuit 907 analyses the signal input from the demodulation circuit 904, and information in the memory 909 is output or the content of an instruction in the memory 909 is stored in accordance with the content of an instruction transmitted from the interrogator. The signal output from the control circuit 907 is encoded and transmitted to the modulation circuit 905. The modulation circuit 905 modulates the radio wave received by the antenna 901 in accordance with the signal. The radio wave modulated in the antenna 901 is received by the interrogator. Then, information output from the semiconductor device 900 can be obtained.

Thus, communication between the semiconductor device 900 and the interrogator can be performed by modulating a radio wave used as a carrier (carrier wave). As the carrier, there are radio waves with frequencies of 125 kHz, 13.56 MHz, 950 MHz, and the like, which are various depending on the standard. There are various modulation methods such as amplitude modulation, frequency modulation, and phase modulation, depending on the standard; however, any modulation method may be employed as long as it is based on the standard.

A signal transmission method can be categorized into an electromagnetic coupling method, an electromagnetic induction method, a microwave method, and the like depending on the wavelength of a carrier.

The memory 909 includes a memory cell array, a driver circuit portion for driving the memory cell array, a control circuit that writes and reads data, and the like. The memory 909 includes one or more selected from an organic memory, a DRAM (dynamic random access memory), an SRAM (static random access memory), an FeRAM (ferroelectric random access memory), a mask ROM (read only memory), a PROM (programmable read only memory), an EPROM (electrically programmable read only memory), an EEPROM (electrically erasable programmable read only memory), or a flash memory.

In this embodiment, a structure of the semiconductor device 900 including the antenna 901 is described; however, the semiconductor device of the present invention does not necessarily include an antenna. In addition, the semiconductor device illustrated in FIG. 21A may be provided with an oscillation circuit or a secondary battery.

In addition, the semiconductor device 900 may supply a power supply voltage to each circuit by an electromagnetic wave without a power source (battery) mounted, or by an electromagnetic wave and a power source (battery) with the power source (battery) mounted.

In FIG. 21A, a structure of the semiconductor device including only one antenna is described; however, the present invention is not limited to this structure. A semiconductor device may include two antennas, that is, an antenna for receiving power and an antenna for receiving a signal. If a semiconductor device includes one antenna, in the case where both supply of power and transmission of a signal are performed with a radio wave of 950 MHz for example, there is a possibility that a large amount of power is transmitted to a distance and thus reception of other wireless devices is impeded. Therefore, it is desirable that power be supplied in a short distance with a radio wave which has reduced frequency; however, a communication distance is inevitably short in this case. On the other hand, if a semiconductor device includes two antennas, frequency of a radio wave for supplying power and frequency of a radio wave for transmitting a signal can be separately used. For example, in the case of transmitting power, a radio wave with a frequency of 13.56 MHz and a magnetic field are used, and in the case of transmitting a signal, a radio wave with a frequency of 950 MHz and an electric field are used. By thus separately using antennas depending on functions, power can be supplied for communication only in a short distance and a signal can be transmitted even in a long distance.

Figure 21B:
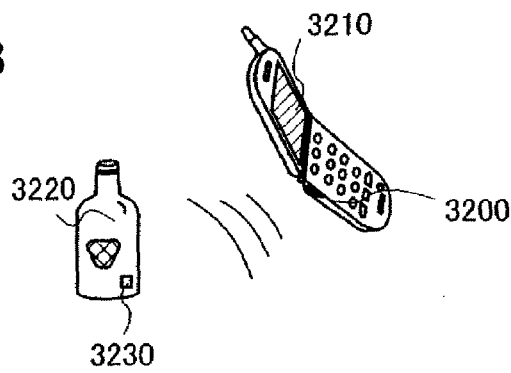
Figure 21C:
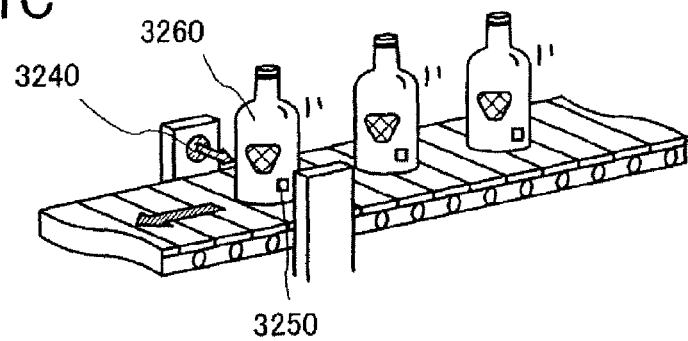

Next, an example of a usage mode of a semiconductor device capable of inputting and outputting data without contact will be described. A side surface of a mobile terminal which includes a display portion 3210 is provided with a communication device 3200. A side surface of a product 3220 is provided with a semiconductor device 3230 (FIG. 21B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 with which the product 3260 is provided (FIG. 21C). When the semiconductor device is used in a system in this manner, information can be obtained easily, and higher function and higher added value are achieved. In addition, since a semiconductor device of the present invention can achieve low power consumption, a semiconductor device which is provided for a product can be made smaller.

Further, a memory device or the like, which is a semiconductor device formed using the present invention, can be used in electronic devices which include a memory in all kinds of fields. For example, an electronic device to which the nonvolatile semiconductor memory device of the invention is applied may be a video camera, a digital camera, a goggle-type display (head-mounted display), a navigation system, a sound reproducing device (e.g., a car audio device or an audio component), a computer, a game machine, a portable information terminal (e.g., a mobile computer, a portable telephone, a portable game machine, or an electronic book), an image reproducing device which includes a recording medium (specifically, a device which plays back a recording medium, such as a DVD (digital versatile disc), and has a display which can display the images), or the like. Specific examples of these electronic devices are shown in FIGS. 22A to 22E.

Figure 22A:
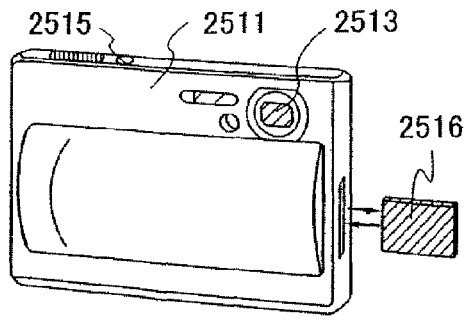
FIGS. 22A to 22E show examples to which a semiconductor device according to the present invention is applied.
Figure 22B:
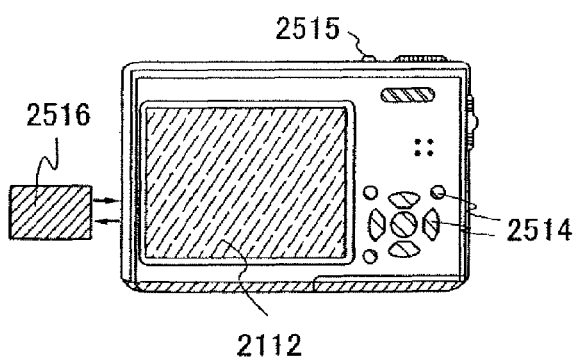

FIGS. 22A and 22B show a digital camera. FIG. 22B is a view of the back side of FIG. 22A. This digital camera includes a housing 2511, a display portion 2112, a lens 2513, operating keys 2514, a shutter release button 2515, and the like. Further, the digital camera includes a removable memory 2516 in which data photographed using the digital camera is stored. A nonvolatile semiconductor memory device, which is a semiconductor device formed using the present invention, or the like can be applied to the memory 2516.

Figure 22C:
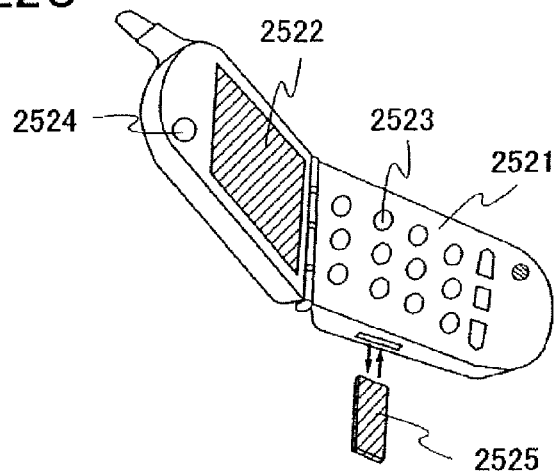

FIG. 22C shows a portable telephone, which is a typical example of a portable terminal. The portable telephone includes a housing 2521, a display portion 2522, operation keys 2523, and the like. Further, the portable telephone includes a removable memory 2525. Data such as the telephone number of the portable telephone and the like, images, music data, and the like can be stored in the memory 2525 and reproduced. A nonvolatile semiconductor memory device, which is a semiconductor device formed using the present invention, or the like can be applied to the memory 2525.

Figure 22D:
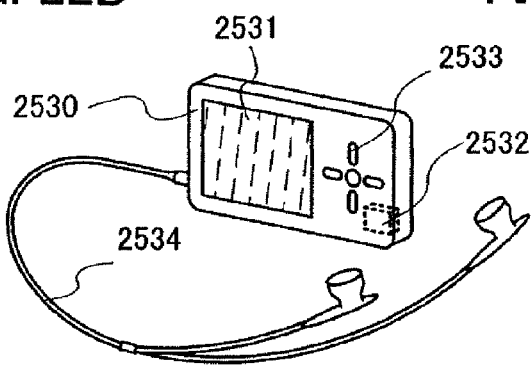

Further, FIG. 22D shows a digital player, which is a typical example of an audio device. The digital player shown in FIG. 22D includes a main body 2530, a display portion 2531, a memory 2532, an operating portion 2533, earphones 2534, and the like. Note that headphones or wireless earphones can be used instead of the earphones 2534. A nonvolatile semiconductor memory device, which is a semiconductor device formed using the present invention, or the like can be used for the memory 2532. For example, when a NAND-type nonvolatile memory with a memory capacity of 20 to 200 gigabytes (GB) is used and the operating portion 2533 is operated, images and sound (e.g., music) can be stored and reproduced. Note that when white characters are display on a black background in the display portion 2531, power consumption can be suppressed. This is particularly effective in a portable audio device. Note that a nonvolatile semiconductor memory device which is provided in the memory 2532 may be removable.

Figure 22E:
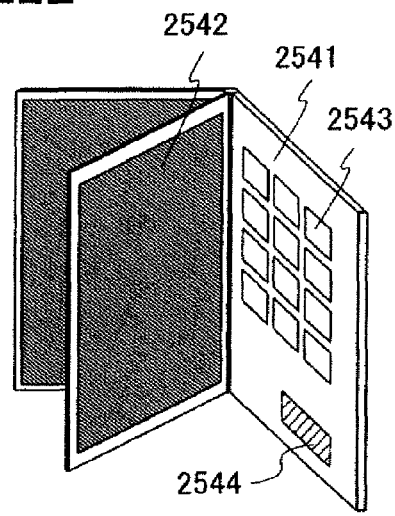

Further, FIG. 22E shows an electronic book (also referred to as electronic paper). This electronic book includes a main body 2541, a display portion 2542, operation keys 2543, and a memory 2544. A modem may be built into the main body 2541, or a structure in which information can be transmitted and received wirelessly may be employed. A nonvolatile semiconductor memory device, which is a semiconductor device formed using the present invention, or the like can be used for the memory 2544. For example, when a NAND-type nonvolatile memory with a memory capacity of 20 to 200 gigabytes (GB) is used and the operating keys 2543 are operated, images and sound (e.g., music) can be stored and reproduced. Note that a nonvolatile semiconductor memory device which is provided in the memory 2544 may be removable.

Thus, a semiconductor device of the present invention has a very wide range of application, and can be used in electronic devices in all kinds of fields.

EMBODIMENT MODE 11

According to the present invention, a semiconductor device functioning as a chip including a processor circuit (hereinafter also called a processor chip, a wireless chip, a wireless processor, a wireless memory, or a wireless tag) can be formed. An applicable range of the semiconductor device of the present invention is wide, and the semiconductor device can be applied to any product as long as it is a product whose production, management, or the like can be supported by clarification of information such as the history of an object without contact. For example, the semiconductor device can be mounted on paper money, coins, securities, certificates, bearer bonds, packing containers, books, recording media, personal belongings, vehicles, food, clothing, health products, commodities, medicine, electronic devices, and the like. Examples of them will be explained with reference to FIGS. 18A to 18G.

Figure 18A:
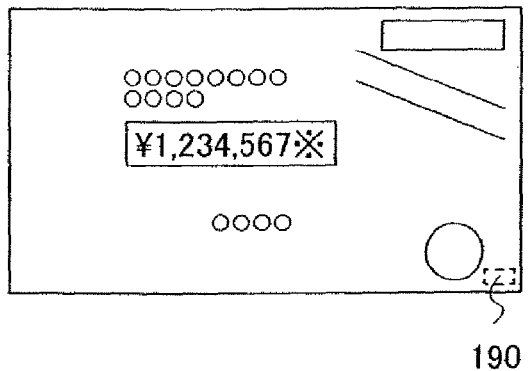
FIGS. 18A to 18G show examples to which a semiconductor device according to the present invention is applied.
Figure 18B:
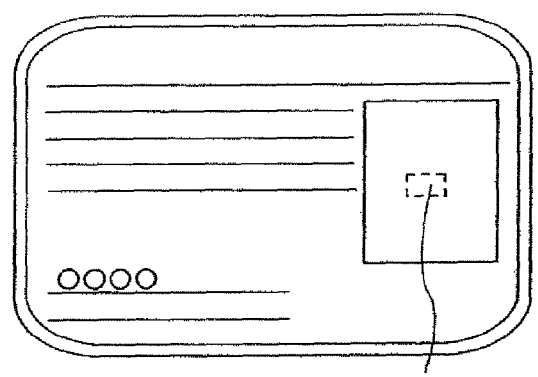
Figure 18C:
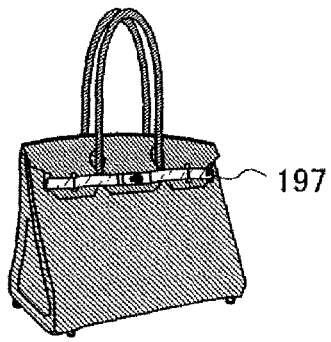
Figure 18D:
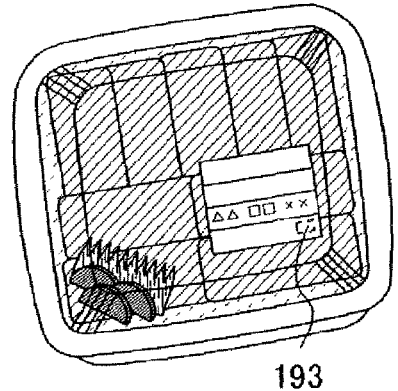
Figure 18E:
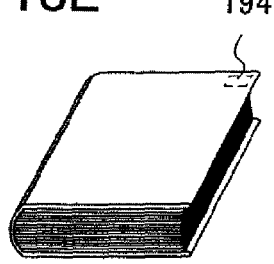
Figure 18F:
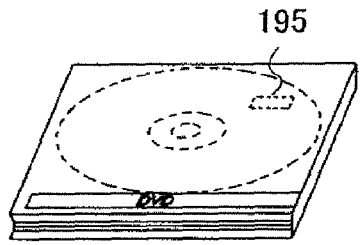
Figure 18G:
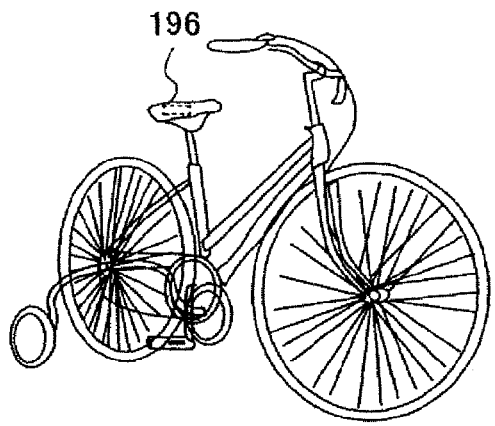

The paper money and coins are money distributed to the market, and include one valid in a certain area (cash voucher), memorial coins, and the like. The securities refer to checks, certificates, promissory notes, and the like, and can be provided with a chip 190 including a processor circuit (FIG. 18A). The certificates refer to driver's licenses, certificates of residence, and the like, and can be provided with a chip 191 including a processor circuit (FIG. 18B). The personal belongings refer to bags, glasses, and the like, and can be provided with a chip 197 including a processor circuit (FIG. 18C). The bearer bonds refer to stamps, rice coupons, various gift certificates, and the like. The packing containers refer to wrapping paper for food containers and the like, plastic bottles, and the like, and can be provided with a chip 193 including a processor circuit (FIG. 18D). The books refer to hardbacks, paperbacks, and the like, and can be provided with a chip 194 including a processor circuit (FIG. 18E). The recording media refer to DVD software, video tapes, and the like (FIG. 18F). The vehicles refer to wheeled vehicles such as bicycles, ships, and the like, and can be provided with a chip 196 including a processor circuit (FIG. 18G). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets, flat-screen TV sets), cellular phones, and the like.

The semiconductor device can be provided by being attached to the surface of an article or being embedded in an article. For example, in the case of a book, the semiconductor device may be embedded in a piece of paper; in the case of a package made from an organic resin, the semiconductor device may be embedded in the organic resin.

As described above, the efficiency of an inspection system, a system used in a rental shop, or the like can be improved by providing the semiconductor device to the packing containers, the recording media, the personal belonging, the food, the clothing, the commodities, the electronic devices, or the like. In addition, by providing the semiconductor device to the vehicles, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

This embodiment mode can be carried out by being freely combined with any of Embodiment Modes 1 to 10.

This application is based on Japanese Patent Application serial no. 2007-041685 filed with Japan Patent Office on Feb. 22, 2007, the entire contents of which are hereby incorporated by reference.

What is claimed is:
1. A semiconductor device comprising:
a memory including a memory cell array comprising a first thin film transistor and a driver circuit portion comprising a second thin film transistor,
wherein the memory cell array and the driver circuit portion are provided over a substrate having an insulating surface,
wherein the first thin film transistor comprises:
a first gate electrode layer;
a first semiconductor layer including a first source region, a first drain region, and a first channel formation region; and
a first gate insulating layer,
wherein the second thin film transistor comprises:
a second gate electrode layer;

a second semiconductor layer including a second source region, a second drain region, and a second channel formation region that is thinner than the first channel formation region; and a second gate insulating layer that is thinner than the first gate insulating layer, wherein the memory includes a booster circuit over the substrate, and wherein the booster circuit includes a third thin film transistor which includes a third gate electrode layer; a third semiconductor layer including a third source region, a third drain region, and a third channel formation region that is thicker than the second channel formation region of the second semiconductor layer; and a third gate insulating layer.

2. The semiconductor device according to claim 1, wherein insulating layers having a sidewall structure are provided on side surfaces of the first gate electrode layer and the second gate electrode layer.

3. The semiconductor device according to claim 1, wherein silicides are provided in surface portions of the first source region, the first drain region, the second source region, and the second drain region.

4. The semiconductor device according to claim 1, wherein insulating layers having a sidewall structure are provided on side surfaces of the first semiconductor layer and the second semiconductor layer.

5. The semiconductor device according to claim 1, wherein a power supply circuit is provided over the substrate having the insulating surface, and wherein the power supply circuit includes a third thin film transistor which includes a third gate electrode layer; a third semiconductor layer including a third source region, a third drain region, and a third channel formation region that is thicker than the second channel formation region of the second semiconductor layer; and a third gate insulating layer.

6. A semiconductor device comprising:

a memory including a memory cell array comprising a first thin film transistor and a driver circuit portion comprising a second thin film transistor, wherein the memory cell array and the driver circuit portion are provided over a substrate having an insulating surface, wherein the first thin film transistor comprises:

a first gate electrode layer;

a first semiconductor layer including a first source region, a first drain region, and a first channel formation region; and a first gate insulating layer, wherein the second thin film transistor comprises:

a second gate electrode layer;

a second semiconductor layer including a second source region, a second drain region, and a second channel formation region that is thinner than the first channel formation region;

a second gate insulating layer that is thinner than the first gate insulating layer; and wherein the second channel formation region is thinner than the second source region and the second drain region, wherein the memory includes a booster circuit over the substrate, and wherein the booster circuit includes a third thin film transistor which includes a third gate electrode layer; a third semiconductor layer including a third source region, a third drain region, and a third channel formation region that is thicker than the second channel formation region of the second semiconductor layer; and a third gate insulating layer.

7. The semiconductor device according to claim 6, wherein insulating layers having a sidewall structure are provided on side surfaces of the first gate electrode layer and the second gate electrode layer.

8. The semiconductor device according to claim 6, wherein silicides are provided in surface portions of the first source region, the first drain region, the second source region, and the second drain region.

9. The semiconductor device according to claim 6, wherein insulating layers having a sidewall structure are provided on side surfaces of the first semiconductor layer and the second semiconductor layer.

10. The semiconductor device according to claim 6, wherein a power supply circuit is provided over the substrate having the insulating surface, and wherein the power supply circuit includes a third thin film transistor which includes a third gate electrode layer; a third semiconductor layer including a third source region, a third drain region, and a third channel formation region that is thicker than the second channel formation region of the second semiconductor layer; and a third gate insulating layer.

* * * * *